US012641960B2

(12) United States Patent
Yamazaki et al.

(10) Patent No.: US 12,641,960 B2
(45) Date of Patent: May 26, 2026

(54) DISPLAY DEVICE AND METHOD FOR FABRICATING THE DISPLAY DEVICE

(71) Applicant: SEMICONDUCTOR ENERGY LABORATORY CO., LTD., Atsugi (JP)

(72) Inventors: Shunpei Yamazaki, Setagaya (JP); Satoshi Seo, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 346 days.

(21) Appl. No.: 18/271,582

(22) PCT Filed: Jan. 17, 2022

(86) PCT No.: PCT/IB2022/050332

§ 371 (c)(1),
(2) Date: Jul. 10, 2023

(87) PCT Pub. No.: WO2022/162489

PCT Pub. Date: Aug. 4, 2022

(65) Prior Publication Data

US 2024/0065038 A1 Feb. 22, 2024

(30) Foreign Application Priority Data

Jan. 27, 2021 (JP) ................................ 2021-011424
Jan. 27, 2021 (JP) ................................ 2021-011425

(51) Int. Cl.
*H10K 59/122* (2023.01)
*H10K 50/10* (2023.01)
(Continued)

(52) U.S. Cl.
CPC ........... *H10K 59/122* (2023.02); *H10K 50/15* (2023.02); *H10K 50/17* (2023.02);
(Continued)

(58) Field of Classification Search
CPC ............ H10K 59/122; H10K 59/1201; H10K 59/131; H10K 59/35; H10K 59/80515;
(Continued)

(56) References Cited

U.S. PATENT DOCUMENTS 6,858,464 B2 2/2005 Yamazaki et al.
7,163,836 B2 1/2007 Yamazaki et al.
(Continued)

FOREIGN PATENT DOCUMENTS

CN 101543134 A 9/2009
EP 2151868 A 2/2010
(Continued)

OTHER PUBLICATIONS

JP 2010267416 A machine translation (Year: 2010).*
(Continued)

*Primary Examiner* — Anne M Hines
*Assistant Examiner* — Jose M Diaz
(74) *Attorney, Agent, or Firm* — NIXON PEABODY LLP; Jeffrey L. Costellia

(57) ABSTRACT

A display device in which a puddle in the vicinity of a partition of a light-emitting element is reduced when a light-emitting layer is formed by a wet process is provided. The display device includes a first anode; a second anode adjacent to the first anode in an X direction; a third anode adjacent to the first anode in a Y direction; a hole-injection layer provided across the first anode to the third anode; a partition provided over the hole-injection layer; a first light-emitting layer; a second light-emitting layer; a third light-emitting layer; and a cathode. The partition includes, in a top view, a first region positioned between the first anode and the third anode and extending in the X direction, and a second region positioned between the first anode and the second anode and extending in the Y direction. The height
(Continued)

of the first region is larger than the height of the second region in a cross-sectional view of the partition.

13 Claims, 25 Drawing Sheets

(51) Int. Cl.

| | |
|---|---|
| ***H10K 50/15*** | (2023.01) |
| ***H10K 50/17*** | (2023.01) |
| ***H10K 59/12*** | (2023.01) |
| ***H10K 59/131*** | (2023.01) |
| ***H10K 59/35*** | (2023.01) |
| ***H10K 59/80*** | (2023.01) |
| ***H10K 71/13*** | (2023.01) |
| ***H10K 71/60*** | (2023.01) |
| ***H10K 77/10*** | (2023.01) |
| ***H10K 102/00*** | (2023.01) |

(52) U.S. Cl.
CPC ....... *H10K 59/1201* (2023.02); *H10K 59/131* (2023.02); *H10K 59/35* (2023.02); *H10K 71/135* (2023.02); *H10K 71/60* (2023.02); *H10K 77/111* (2023.02); *H10K 50/10* (2023.02); *H10K 59/80515* (2023.02); *H10K 59/8731* (2023.02); *H10K 2102/351* (2023.02)

(58) Field of Classification Search
CPC .... H10K 59/8731; H10K 50/15; H10K 50/17; H10K 50/10; H10K 71/135; H10K 71/60; H10K 77/111; H10K 2102/351; G09F 9/00; G09F 9/30; H05B 33/10; H05B 33/12; H05B 33/14; H05B 33/22; H05B 33/26
See application file for complete search history.

(56) References Cited

U.S. PATENT DOCUMENTS

| | | | |
|---|---|---|---|
| 7,569,405 | B2 | 8/2009 | Yamazaki et al. |
| 7,683,537 | B2 | 3/2010 | Yoshida et al. |
| 8,083,956 | B2 | 12/2011 | Fujii et al. |
| 8,105,855 | B2 | 1/2012 | Yamazaki et al. |
| 8,357,551 | B2 | 1/2013 | Yamazaki et al. |
| 8,742,661 | B2 | 6/2014 | Imai et al. |
| 8,906,714 | B2 | 12/2014 | Yamazaki et al. |
| 9,818,808 | B2 | 11/2017 | Nendai |
| 2009/0160322 | A1 | 6/2009 | Yoshida et al. |
| 2016/0172423 | A1 | 6/2016 | Nendai |
| 2017/0069694 | A1 | 3/2017 | Ajiki et al. |
| 2022/0181572 | A1 | 6/2022 | Ohsawa et al. |

FOREIGN PATENT DOCUMENTS

| | | | |
|---|---|---|---|
| JP | 2004-087465 | A | 3/2004 |
| JP | 2009-170115 | A | 7/2009 |
| JP | 2009-200049 | A | 9/2009 |
| JP | 2010-103105 | A | 5/2010 |
| JP | 2010-267416 | A | 11/2010 |
| JP | 2013-206861 | A | 10/2013 |
| JP | 2016-110943 | A | 6/2016 |
| KR | 2009-0028512 | A | 3/2009 |
| WO | WO-2008/146470 | | 12/2008 |
| WO | WO-2015/136579 | | 9/2015 |

OTHER PUBLICATIONS

International Search Report (Application No. PCT/IB2022/050332) Dated Apr. 19, 2022.

Written Opinion (Application No. PCT/IB2022/050332) Dated Apr. 19, 2022.

* cited by examiner

DISPLAY DEVICE AND METHOD FOR FABRICATING THE DISPLAY DEVICE

TECHNICAL FIELD

One embodiment of the present invention relates to a display device and a fabrication method thereof.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. More specific examples of the technical field of one embodiment of the present invention disclosed in this specification and the like include a semiconductor device, a display device, a light-emitting device, a power storage device, a memory device, a method for driving any of them, and a method for fabricating any of them.

BACKGROUND ART

As the method for fabricating a display device containing organic EL, an inkjet method is known in which a solution containing a light-emitting material is dropped and a solvent is volatilized from the solution, whereby the light-emitting layer is formed. The light-emitting layer is formed by an inkjet method, so that a baking step on a solution is not necessary (see Patent Document 1).

REFERENCE

Patent Document

[Patent Document 1] Japanese Published Patent Application No. 2004-87465

SUMMARY OF THE INVENTION

Problems to be Solved by the Invention

In FIG. 3(A) of Patent Document 1 above, a state where a solution is dropped in regions of pixels divided by insulators is shown, and a puddle right after the solution is dropped is also shown. Patent Document 1 above discloses that a solvent is evaporated in such a puddle, and thus a baking step can be unnecessary by utilizing an application step.

However, it is difficult to make the baking step unnecessary: when baking is performed in a reduced pressure atmosphere, a puddle is left in the vicinity of an insulator, i.e., a partition. Current concentrates at the center of a light-emitting area because of the puddle, and the current density becomes uneven; therefore, the present inventors considered that the inhibition of the puddle is important to provide a high-resolution display device.

In view of the above, one embodiment of the present invention is a display device formed by a wet process including an inkjet method, and a structure with a reduced puddle and a fabrication method thereof are provided.

Note that the description of these objects does not preclude the existence of other objects. One embodiment of the present invention does not have to achieve all of these objects. Note that other objects will be apparent from the description of the specification, the drawings, the claims, and the like (referred to as this specification and the like), and other objects can be derived from the description of this specification and the like.

Means for Solving the Problems

In view of the above, one embodiment of the present invention is a display device including a first anode, a second anode adjacent to the first anode in an X direction, a third anode adjacent to the first anode in a Y direction, a hole-injection layer provided across the first anode to the third anode, a partition provided over the hole-injection layer, a first light-emitting layer positioned in a first opening portion of the partition and overlapping with the first anode, a second light-emitting layer positioned in a second opening portion of the partition and overlapping with the second anode, a third light-emitting layer positioned in a third opening portion of the partition and overlapping with the third anode, and a cathode provided across the first light-emitting layer to the third light-emitting layer. The partition includes, in a top view, a first region positioned between the first anode and the third anode and extending in the X direction, and a second region positioned between the first anode and the second anode and extending in the Y direction. The height of the first region is larger than the height of the second region in a cross-sectional view of the partition.

Another embodiment of the present invention is a display device including a first anode, a second anode adjacent to the first anode in an X direction, a third anode adjacent to the first anode in a Y direction, a hole-injection layer provided across the first anode to the third anode, a partition provided over the hole-injection layer, a first light-emitting layer positioned in a first opening portion of the partition and overlapping with the first anode, a second light-emitting layer positioned in a second opening portion of the partition and overlapping with the second anode, a third light-emitting layer positioned in a third opening portion of the partition and overlapping with the third anode, and a cathode provided across the first light-emitting layer to the third light-emitting layer. The partition includes, in a top view, a first region positioned between the first anode and the third anode and extending in the X direction, and a second region positioned between the first anode and the second anode and extending in the Y direction. The height of the second region is larger than the height of the first region in a cross-sectional view of the partition.

Another embodiment of the present invention is a display device including a first anode, a second anode adjacent to the first anode in an X direction, a third anode adjacent to the first anode in a Y direction, a hole-injection layer provided across the first anode to the third anode, a partition provided over the hole-injection layer, a first light-emitting layer positioned in a first opening portion of the partition and overlapping with the first anode, a second light-emitting layer positioned in a second opening portion of the partition and overlapping with the second anode, a third light-emitting layer positioned in a third opening portion of the partition and overlapping with the third anode, and a cathode provided across the first light-emitting layer to the third light-emitting layer. The partition includes, in a top view, a first region positioned between the first anode and the third anode and extending in the X direction, and a second region positioned between the first anode and the second anode and extending in the Y direction. The height of the first region is larger than the height of the second region in a cross-sectional view of the partition. The partition has a stacked-layer structure in the first region.

Another embodiment of the present invention is a display device including a first anode, a second anode adjacent to the first anode in an X direction, a third anode adjacent to the first anode in a Y direction, a hole-injection layer provided across the first anode to the third anode, a partition provided over the hole-injection layer, a first light-emitting layer positioned in a first opening portion of the partition and overlapping with the first anode, a second light-emitting layer positioned in a second opening portion of the partition and overlapping with the second anode, a third light-emitting layer positioned in a third opening portion of the partition and overlapping with the third anode, and a cathode provided across the first light-emitting layer to the third light-emitting layer. The partition includes, in a top view, a first region positioned between the first anode and the third anode and extending in the X direction, and a second region positioned between the first anode and the second anode and extending in the Y direction. The height of the second region is larger than the height of the first region in a cross-sectional view of the partition. The partition has a stacked-layer structure in the second region.

In one embodiment of the present invention, the partition having a stacked-layer structure preferably includes a first partition containing an inorganic material and a second partition positioned over the first partition and containing an organic material.

In one embodiment of the present invention, a hole-transport layer is preferably provided between the hole-injection layer and the partition.

In one embodiment of the present invention, the hole-injection layer preferably contains molybdenum oxide.

In one embodiment of the present invention, it is preferable that end portions of the first anode to the third anode each have a tapered shape.

Another embodiment of the present invention is a method for fabricating a display device, in which a first anode, a second anode adjacent to the first anode in an X direction, and a third anode adjacent to the first anode in a Y direction are formed; a hole-injection layer is formed across the first anode to the third anode; a partition including a first opening portion overlapping with the first anode, a second opening portion overlapping with the second anode, and a third opening portion overlapping with the third anode is formed over the hole-injection layer; any one of a first light-emitting layer positioned in the first opening portion, a second light-emitting layer positioned in the second opening portion, and a third light-emitting layer positioned in the third opening portion is formed by an inkjet method; and a cathode is formed across the first light-emitting layer to the third light-emitting layer. The partition includes, in a top view, a first region positioned between the first anode and the third anode and extending in the X direction, and a second region positioned between the first anode and the second anode and extending in the Y direction. The height of the first region is larger than the height of the second region in a cross-sectional view of the partition. Any one of the first light-emitting layer and the third light-emitting layer is formed by an inkjet method with movement along the first region.

Another embodiment of the present invention is a method for fabricating a display device, in which a first anode, a second anode adjacent to the first anode in an X direction, and a third anode adjacent to the first anode in a Y direction are formed; a hole-injection layer is formed across the first anode to the third anode; a partition including a first opening portion overlapping with the first anode, a second opening portion overlapping with the second anode, and a third opening portion overlapping with the third anode is formed over the hole-injection layer; any one of a first light-emitting layer positioned in the first opening portion, a second light-emitting layer positioned in the second opening portion, and a third light-emitting layer positioned in the third opening portion is formed by an inkjet method; and a cathode is formed across the first light-emitting layer to the third light-emitting layer. The partition includes, in a top view, a first region positioned between the first anode and the third anode and extending in the X direction, and a second region positioned between the first anode and the second anode and extending in the Y direction. The height of the second region is larger than the height of the first region in a cross-sectional view of the partition. Any one of the first light-emitting layer and the third light-emitting layer is formed by an inkjet method with movement along the second region.

In one embodiment of the present invention, it is preferable that a hole-transport layer be formed over the hole-injection layer, and the partition be formed over the hole-transport layer.

Effect of the Invention

One embodiment of the present invention can provide a display device in which a puddle is inhibited and a fabrication method thereof.

Note that the description of these effects does not preclude the existence of other effects. One embodiment of the present invention does not need to have all of these effects. Note that other effects will be apparent from the description of this specification and the like, and other effects can be derived from the description of this specification and the like.

BRIEF DESCRIPTION OF THE DRAWINGS

FIG. 11A to FIG. 11D2 are cross-sectional views illustrating a light-emitting element of one embodiment of the present invention.

MODE FOR CARRYING OUT THE INVENTION

Figure 1:
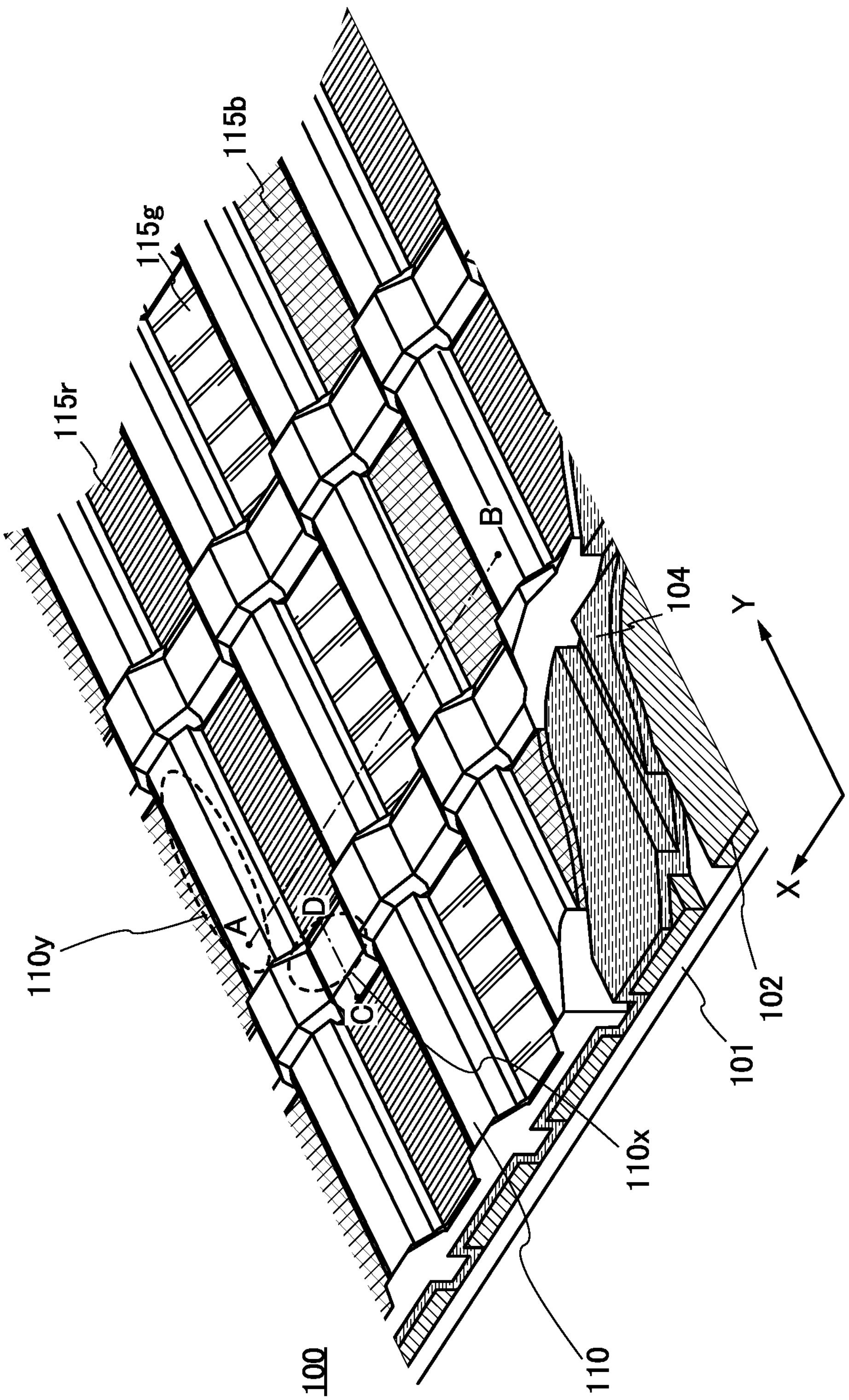
FIG. 1 is a perspective view illustrating a pixel region of one embodiment of the present invention.

Although the block diagram in drawings attached to this specification and the like is used in some cases for description of components classified based on their functions in independent blocks, it is difficult to classify actual components based on their functions completely, and one component can have a plurality of functions.

In this specification and the like, the terms “source” and “drain” of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification and the like, for the sake of convenience, the connection relationship of a transistor is sometimes described assuming that the source and the drain are fixed; in reality, the names of the source and the drain interchange with each other according to the above relationship of the potentials.

In this specification and the like, a “source” of a transistor means a source region that is part of a semiconductor film functioning as an active layer or means a source electrode connected to the semiconductor film. Similarly, a drain of a transistor means a drain region that is part of the semiconductor film or a drain electrode connected to the semiconductor film. Moreover, a gate means a gate electrode.

In this specification and the like, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification and the like, connection means electrical connection and corresponds to a state in which current, voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows current, voltage, or a potential to be supplied or transmitted.

In this specification and the like, even when independent components are connected to each other in a circuit diagram, there is actually a case where one conductive layer has functions of a plurality of components, such as a case where part of a wiring serves as an electrode. Connection in this specification and the like also includes such a case where one conductive film has functions of a plurality of components, in its category.

In this specification and the like, a first electrode and a second electrode of a transistor are used for description in some cases; when one of the first electrode and the second electrode refers to a source electrode, the other thereof refers to a drain electrode.

In this specification and the like, a light-emitting element has a structure in which a layer including an organic compound (referred to as an organic compound layer) is interposed between a pair of electrodes. One of the pair of electrodes is an anode, the other of the pair of electrodes is a cathode, an organic compound layer is a functional layer, and one of functional layers is a light-emitting layer. A structure in which functional layers form a stack and include at least a light-emitting layer is referred to as a light-emitting unit in some cases. In addition, in this specification and the like, a light-emitting element is referred to as a light-emitting device in some cases.

In this specification and the like, a light-emitting device formed without using a metal mask or a fine metal mask (FMM) is sometimes referred to as a light-emitting device having a metal maskless (MML) structure.

In this specification and the like, a structure in which light-emitting layers of light-emitting elements for multiple colors (e.g., red (R), green (G), and blue (B)) are separately formed is sometimes referred to as an SBS (Side By Side) structure. In this specification and the like, a light-emitting element capable of emitting white light may be referred to as a white-light-emitting element. Note that a combination of white-light-emitting elements with coloring layers (e.g., color filters) enables a full-color display device.

In this specification and the like, the light-emitting elements can be roughly classified into a single structure and a tandem structure. In a single structure, one light-emitting unit is included between a pair of electrodes, and the light-emitting unit includes one or more light-emitting layers. To obtain white light emission in the single structure, two or more light-emitting layers are selected such that their emission colors are complementary. For example, when the emission color of a first light-emitting layer and the emission color of a second light-emitting layer are complementary colors, it is possible to obtain a structure in which the light-emitting element emits white light as a whole. This can be applied to a light-emitting element including three or more light-emitting layers.

In a tandem structure, two or more light-emitting units are included between a pair of electrodes, and each light-emitting unit includes one or more light-emitting layers. To obtain white light emission, the structure is made so that light from the light-emitting layer of each of the two or more light-emitting units can be combined to be white light. Note that a structure for obtaining white light emission is similar to that in the case of a single structure. In the tandem structure, it is preferable that an intermediate layer such as a charge-generation layer is provided between a plurality of light-emitting units.

When the above-described white-light-emitting elements (the single structure and the tandem structure) and a light-emitting element having the above-described SBS structure are compared, the light-emitting element having the SBS structure consumes lower power than the white-light-emitting elements. To reduce power consumption, the light-emitting element having the SBS structure is preferably used. In contrast, the white-light-emitting elements are suitable in terms of lower manufacturing cost or higher manufacturing yield because the manufacturing process of the white-light-emitting elements is simpler than that of the light-emitting element having an SBS structure.

Next, embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a display device of one embodiment of the present invention is described. The display device includes a light-emitting element, and the light-emitting element includes a hole-injection layer containing a hole-injection material, a hole-transport layer containing a hole-transport material, a light-emitting layer containing a light-emitting material, an electron-transport layer containing an electron-transport material, an electron-injection layer containing an electron-injection material, or the like. In one embodiment of the present invention, any of the layers described above can be formed by a wet process. In this embodiment, the case where the light-emitting layer is formed by a wet process is mainly described.

A wet process is the method in which a liquid composition is obtained by a process of dissolution or dispersion of a material having a predetermined function into a solvent for liquefaction and the liquid composition is applied. After applied, the liquid composition becomes a solid or a thin film by undergoing a drying or curing step. A liquid composition is referred to as a solution in some cases. Typical examples of a wet process include a spin coating method, an inkjet method, a casting method, a printing method, a dispensing method, and a spray method.

A feature of the display device of one embodiment of the present invention is partition height or the like. Furthermore, for the display device of one mode of the present invention, Structure example 1 in which a hole-injection layer is positioned below a partition and Structure example 2 in which a hole-injection layer and a hole-transport layer are positioned below a partition are described.

Structure Example 1

Figure 2A:
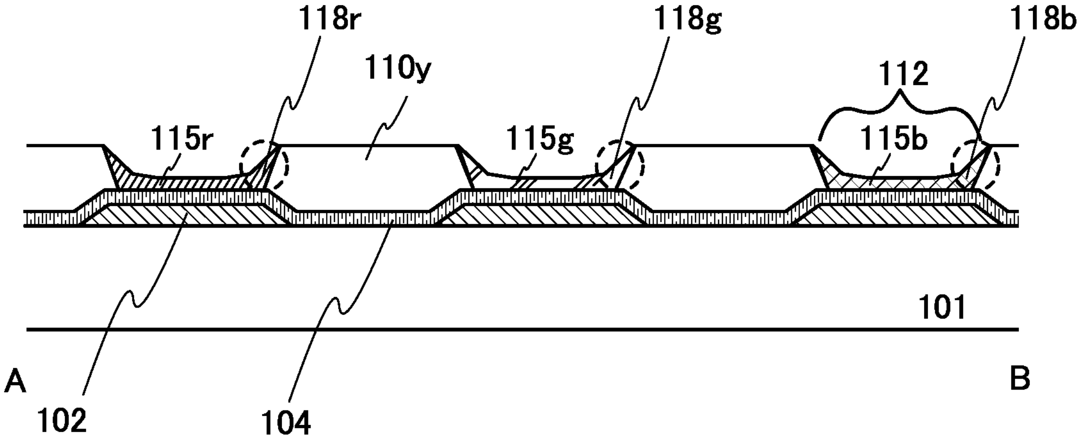
FIG. 2A and FIG. 2B are cross-sectional views illustrating a pixel region of one embodiment of the present invention.
Figure 2B:
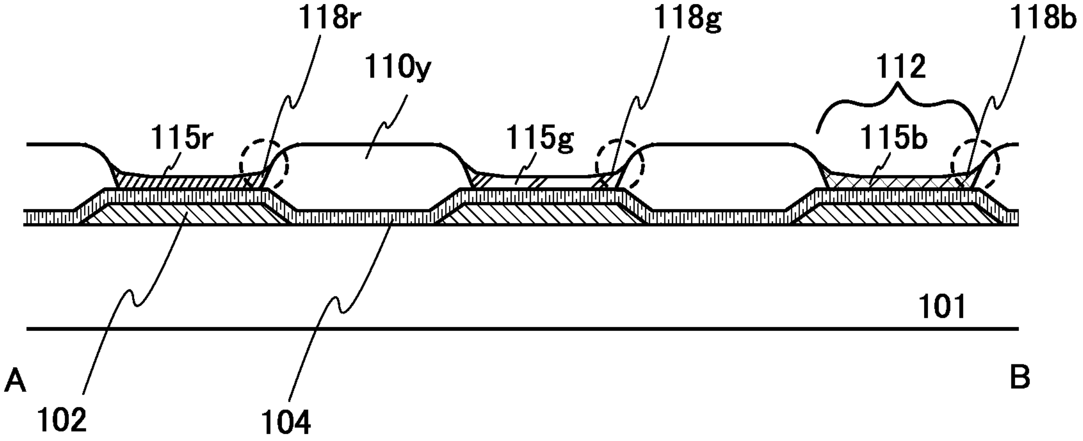
Figure 3A:
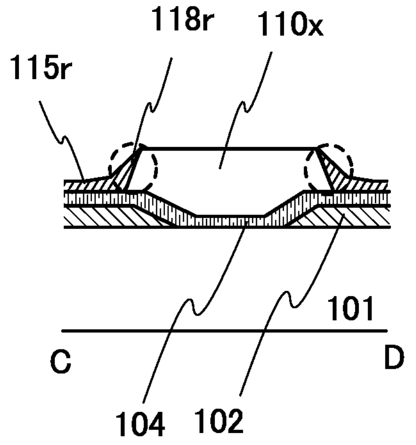
FIG. 3A to FIG. 3C are cross-sectional views illustrating a pixel region of one embodiment of the present invention.
Figure 3B:
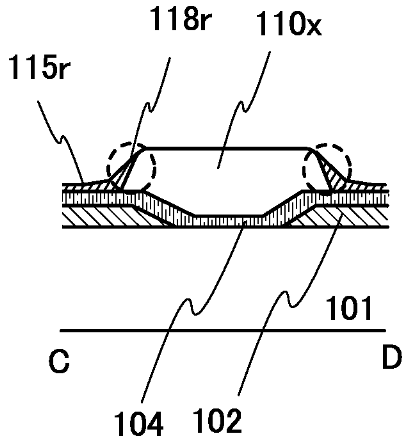
Figure 3C:
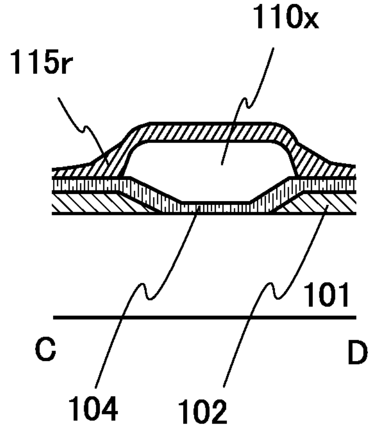
Figure 4:
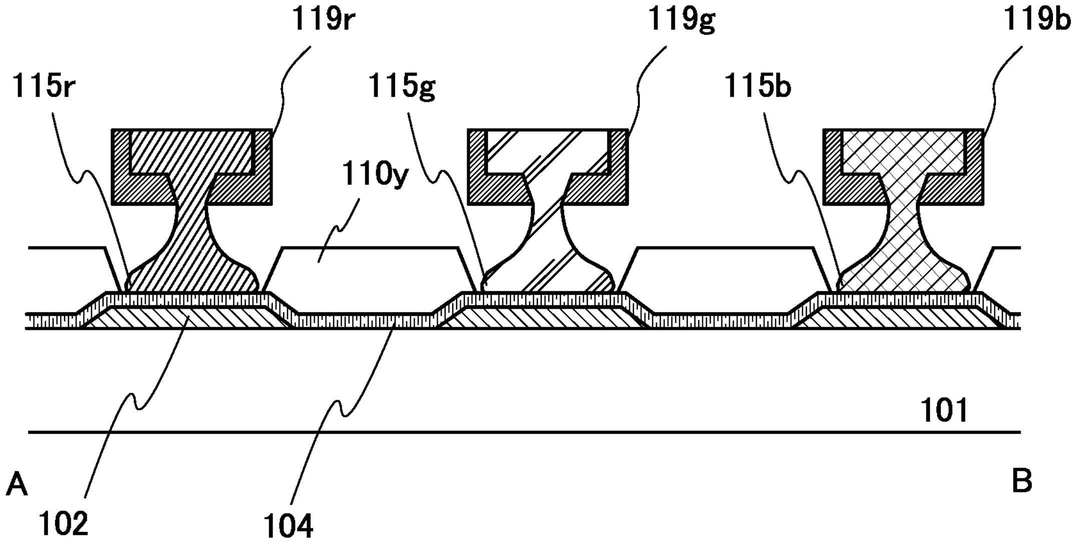
FIG. 4 is a cross-sectional view illustrating a method of forming a pixel region of one embodiment of the present invention.
Figure 5:
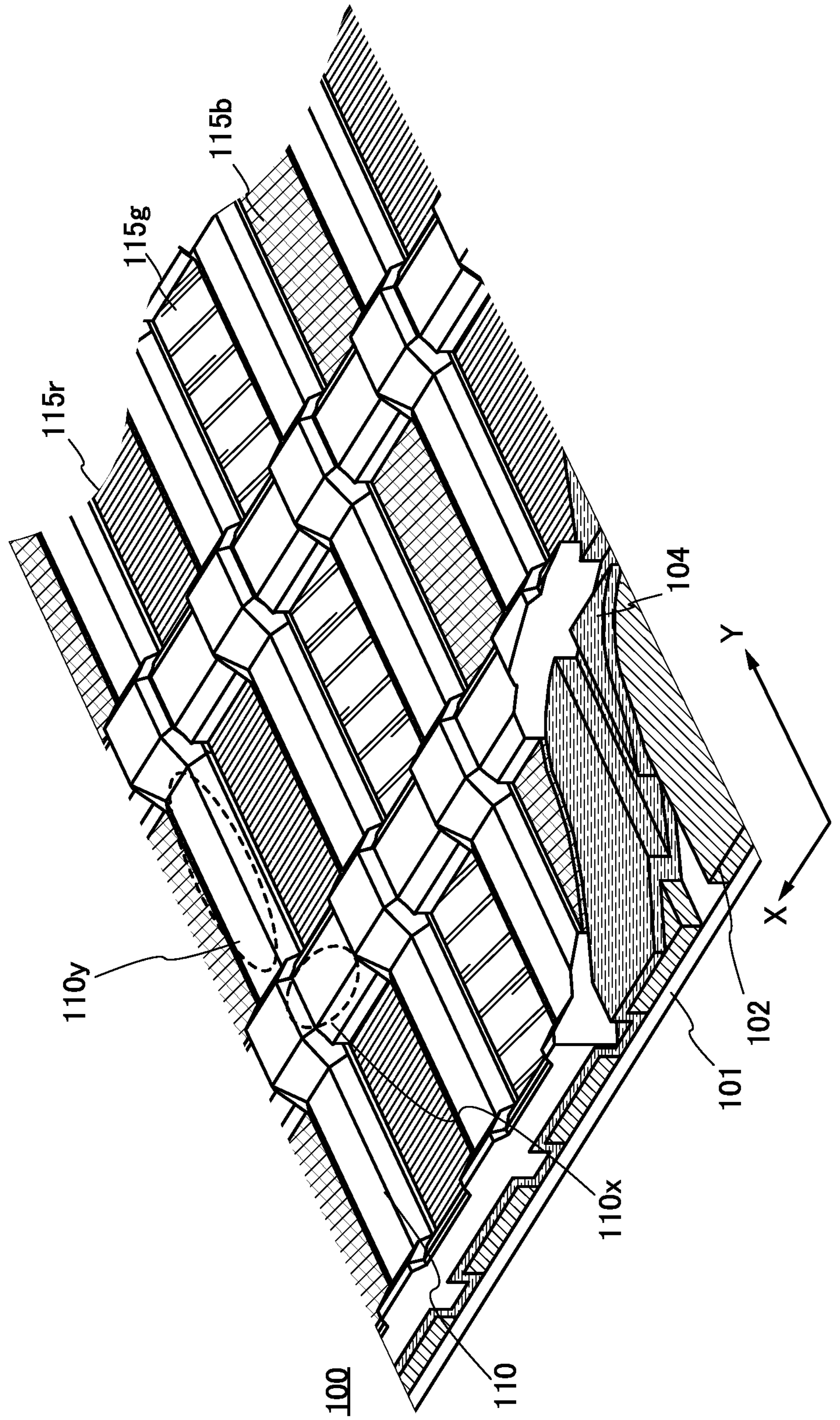
FIG. 5 is a perspective view illustrating a pixel region of one embodiment of the present invention.

FIG. 1 illustrates a perspective view example of the display device, FIG. 2A to FIG. 3C illustrate cross-sectional view examples of the display device, FIG. 4 illustrates a formation example of a light-emitting layer, and FIG. 5 illustrates a perspective view example of a display device that is different from that in FIG. 1.

As illustrated in FIG. 1, the display device includes a pixel region 100 provided with a light-emitting element and further a driver circuit region and the like. The pixel region 100 includes a plurality of pixels, and the pixels includes a plurality of subpixels. The pixel is a minimum unit enabling full-color display; in the case where the full-color display is achieved with red, green, and blue, one of the plurality of subpixels can correspond to a light-emitting region of a red light-emitting element, another subpixel can correspond to a light-emitting region of a green light-emitting element, and the other can correspond to a light-emitting region of a blue light-emitting element in a top view (also referred to as a plan view in some cases).

Although not illustrated in FIG. 1, in each subpixel, a transistor electrically connected to each light-emitting element is also positioned, and the light-emitting element can be controlled using the transistor. A display device having such a structure is referred to as an active matrix display device, and Structure example 1 of one embodiment of the present invention and the like can be applied. Needless to say, Structure example 1 of one embodiment of the present invention and the like can be applied to a passive matrix display device.

Note that in the explanation of a structure of the pixel region 100, an X direction and a Y direction intersecting with the X direction are used as illustrated in FIG. 1. For example, the X direction is a direction along a wiring supplied with a gate signal, and the Y direction is a direction along a wiring supplied with a source signal.

In the pixel region 100 in FIG. 1, an insulating film 101, an anode 102, a hole-injection layer 104, a partition 110, a light-emitting layer 115, and the like are illustrated. The partition 110 includes a first region 110*x* and a second region 110*y*, and the feature is that a top surface of the second region 110*y* is higher than a top surface of the first region 110*x* in the partition 110. The light-emitting layer 115 includes a light-emitting layer 115*r*, a light-emitting layer 115*g*, and a light-emitting layer 115*b*; and the light-emitting layer 115*r*, the light-emitting layer 115*g*, and the light-emitting layer 115*b* respectively correspond to a light light-emitting layer included in a red light-emitting element, a light light-emitting layer included in a green light-emitting element, and a light-emitting layer included in a blue light-emitting element, for example.

<Insulating Film 101>

The insulating film 101 is provided over the transistor described above as illustrated in FIG. 1. The insulating film is a formation surface over which the anode and the like are formed later. Therefore, the insulating film 101 is preferably formed using an organic material so that the formation surface is flat. Alternatively, the insulating film 101 is preferably formed using an inorganic material so as to function as a protective film to inhibit entry of an impurity or the like to the transistor. The insulating film 101 preferably has a stacked-layer structure including at least a first insulating film containing an inorganic material and a second insulating film containing an organic material and positioned over the first insulating film so that the insulating film 101 is flat and functions as a protective film.

The insulating film 101 is preferably formed using an organic resin such as a polyimide resin, a polyamide resin, an acrylic resin, a siloxane resin, a silicone resin, an epoxy resin, or a phenol resin as the organic material. Note that a material in which an impurity element such as lanthanum (La), nitrogen, zirconium (Zr), or the like is added to the above material may be used.

The insulating film 101 is preferably formed which contains one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide as the inorganic material. Note that a material in which an impurity element such as lanthanum (La), nitrogen, zirconium (Zr), or the like is added to the above material may be used.

<Anode 102>

The anode 102 is formed over the insulating film 101. The anode 102 is electrically connected to the transistor through a contact hole provided in the insulating film 101, for example.

A contact hole refers to an opening formed in an insulating film and enables a wiring layer positioned below the insulating film (referred to as a lower wiring layer) to be electrically connected to a wiring layer positioned above the insulating film (referred to as an upper wiring layer). For the electrical connection, the lower wiring layer includes a region exposed in the opening, and the upper wiring layer includes a region positioned in the opening in a cross-sectional view.

The anode 102 is supplied with a signal, e.g., a predetermined potential, from the transistor. Therefore, the anode 102 is independently processed in each subpixel. Processing independently is referred to as dividing in some cases. Furthermore, the processing is referred to as patterning in some cases. In addition, the anode 102 electrically connected to the transistor is referred to as a pixel electrode in some cases.

A material having a high work function is desirably used for the anode 102. For example, the anode 102 includes an ITO film (a film containing indium, tin, and oxygen and referred to as an indium tin oxide film), an indium tin oxide film containing silicon, an indium oxide film containing zinc oxide at 2 to 20 wt %, or a titanium nitride film. Furthermore, the anode 102 includes a single-layer film such as a chromium film, a tungsten film, a Zn film, an Al film, an Ag film, or a Pt film. Moreover, the anode 102 can have a stacked-layer structure; for example, a stacked-layer structure of a titanium nitride film and a film containing aluminum as its main component, a stacked-layer structure of three layers, a titanium nitride film, a film containing aluminum as its main component, and a titanium nitride film can be used. Note that a stacked-layer structure exhibits effects that an anode can function while reducing resistance as a wiring, and a favorable ohmic contact with another layer can be achieved. The thickness of the whole anode 102 is preferably greater than or equal to 100 nm and less than or equal to 250 nm.

In the case of a display device in which light of the light-emitting element is extracted from the anode 102 side, the anode 102 includes a transparent electrode having a light-transmitting property. The transparent electrode contains a light-transmitting material or when the transparent electrode contains a non-light-transmitting material, the thickness is made thin. The transparent electrode has a light transmittance greater than or equal to 40%. That is, for the anode 102, a transparent electrode with a transmittance of visible light (light with wavelength greater than or equal to 400 nm and less than 750 nm) greater than or equal to 40% is preferably used. The top surface shape of the anode 102 is not limited; in FIG. 1, the top surface is a rectangle, and the anode 102 is placed to have the short side of the rectangle along the X direction and the long side of the rectangle along the Y direction.

FIG. 2A and FIG. 2B illustrate cross-sectional views of the pixel region 100 taken along a dashed-dotted line AB illustrated in FIG. 1. Although the cross-sectional shape of the anode 102 is not limited, FIG. 2A and FIG. 2B illustrate the case where an end portion of the anode 102 has a tapered shape.

FIG. 3A to FIG. 3C illustrate cross-sectional views of the pixel region 100 taken along a dashed-dotted line CD illustrated in FIG. 1. Also in FIG. 3A to FIG. 3C, the end portion of the anode 102 has a tapered shape.

Note that as for the tapered shape of the end portion of the anode 102, FIG. 2A to FIG. 3C illustrate a shape in which an upper side is shorter than a lower side; however, a reverse tapered shape in which the lower side is shorter than the upper side may be employed. Needless to say, instead of the tapered shape, the end portion of the anode 102 may have a steep shape in which the upper side and the lower side have a substantially equal length (in the cross-sectional view, a shape in which the end portion is perpendicular or a shape in which the end portion is substantially perpendicular).

Note that the tapered shape includes a region where the anode 102 becomes gradually thin. The tapered shape inhibits a thin film formed over the anode 102 from being disconnected, for example.

The resistance of the anode including the thinned region is gradually increased in some cases. That is, the anode 102 includes a region having high resistance corresponding to the tapered shape. The anode including the high-resistance region is also regarded as a region to which a signal, specifically voltage, supplied from the transistor is less likely to be applied.

<Hole-Injection Layer 104>

As illustrated in FIG. 1 to FIG. 3C, the hole-injection layer 104 is formed over the anode 102. Since the hole-injection layer 104 is formed over the anode 102, the hole-injection layer 104 is less likely to be disconnected, which is preferable. The hole-injection layer 104 is not divided according to the subpixel like the anode 102 and formed over the whole pixel region 100. That is, the hole-injection layer 104 is formed across a plurality of anodes and thus can be shared among the subpixels. The layer that can be shared among the subpixels is referred to as a common layer. The hole-injection layer 104 can be formed by a wet process or an evaporation method, and when the hole-injection layer 104 is a common layer, a step of separately forming the layer for each subpixel is unnecessary.

The hole-injection layer 104 includes a region overlapping with the tapered region of the anode 102. As described above, the tapered region of the anode 102 has high resistance, and thus part of the hole-injection layer 104 overlapping with the high-resistance region is less likely to be injected with holes or is not injected with holes from the anode 102. When the hole-injection layer 104 includes the part, crosstalk between adjacent light-emitting elements can be inhibited. Crosstalk refers to signal transmission from a transistor included in a subpixel to the adjacent subpixel that is not driven. It is desirable that the crosstalk be inhibited particularly in the case of the adjacent light-emitting elements of different colors.

In the case where the hole-injection layer 104 is formed over the anode 102 having the reverse tapered shape or the steep shape, the crosstalk is inhibited because the hole-injection layer 104 is disconnected.

From the above, crosstalk inhibition is an effect of the structure in which the hole-injection layer 104 and the like are provided along the anode 102.

Although described later, a hole-transport layer may be provided over the hole-injection layer 104.

<Partition 110>

In this embodiment, the light-emitting layers are separately formed by a wet process, e.g., an inkjet method, and thus sections where a solution is dropped are needed. The sections can be provided using an insulator, and such insulator is referred to as a partition, an embankment, or a bank in some cases.

In FIG. 1 to FIG. 3C, the partition 110 is formed over the hole-injection layer 104 and sections the subpixels, i.e., the light-emitting regions. The partition 110 sectioning the subpixels has a lattice shape in a top view of the pixel region 100 as illustrated in FIG. 1. The partition 110 includes opening portions 112 corresponding to the subpixels, i.e., the light-emitting regions, in the cross-sectional views of the pixel region 100 as illustrated in FIG. 2A to FIG. 3C. In the top view, the hole-injection layer 104 is exposed in the opening portions 112, and a solution containing a starting material of the light-emitting layer 115*r* or the like can be dropped at least to overlap with the exposed hole-injection layer 104.

Before the solution containing a starting material of the light-emitting layer 115*r* or the like is dropped, a solution X containing a starting material of a hole-transport layer may be dropped. After the solution X is dropped, a solvent is removed from the solution X through a baking step and curing is performed, whereby the hole-transport layer can be obtained.

An upper end portion of the second region 110*y* has an angular portion in FIG. 2A, and the upper end portion of the second region 110*y* has a round portion in FIG. 2B. An upper end portion of the first region 110*x* has an angular portion in FIG. 3A, and the upper end portion of the first region 110*x* has a round portion in FIG. 3B. Furthermore, FIG. 3C has a structure in which the upper end portion of the first region 110*x* has a round portion, and the light-emitting layer 115*r* is provided also over the top surface of the first region 110*x*. A light-emitting material included in the light-emitting layer 115*r*, i.e., a light-emitting material included in a starting material, and the like are described later.

As illustrated in FIG. 2A to FIG. 3C, an end portion of the partition 110 preferably has a tapered shape in the cross-sectional view of the pixel region 100. For example, when the distance between lower end portions of the partition 110 is longer than that between upper end portions, a tapered shape can be obtained. Furthermore, the partition 110 can have a reverse tapered shape in which the distance between the lower end portions is shorter than that between the upper end portions. When the end portion of the partition 110 has a tapered shape, a solution is dropped in a section of a target light-emitting element from an inkjet apparatus, and thus the solution is less likely to be mixed between the adjacent light-emitting elements of different colors.

Note that the tapered shape includes a shape including a region where the partition 110 becomes gradually thin. A thin film formed over the partition 110 having the tapered shape can be inhibited from being disconnected, for example.

Note that in the tapered shape of the end portion of the partition 110, an upper side is shorter than a lower side as illustrated in FIG. 2A to FIG. 3C; in addition to this, the end portion of the partition 110 can have a reverse tapered shape in which the lower side is shorter than the upper side. Needless to say, instead of the tapered shape, the end portion of the partition 110 may have a steep shape in which the upper side and the lower side have a substantially equal length (in the cross-sectional view, a shape in which the end portion is perpendicular or a shape in which the end portion is substantially perpendicular).

The partition 110 has a single-layer structure or a stacked-layer structure of an inorganic material, a single-layer structure or a stacked-layer structure of an organic material, or a stacked-layer structure of an inorganic material and an organic material. In the case of the stacked-layer structure of an inorganic material and an organic material, one of the inorganic material and the organic material is positioned in a lower layer, and the other is positioned in an upper layer.

The partition 110 is preferably formed which contains one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide as the inorganic material. Note that a material in which an impurity element such as lanthanum (La), nitrogen, zirconium (Zr), or the like is added to the above material may be used. The partition 110 formed using an inorganic material can include an angular portion in the upper end portion as in FIG. 2A and FIG. 3A.

The partition 110 is preferably formed using an organic resin such as a polyimide resin, a polyamide resin, an acrylic resin, a siloxane resin, a silicone resin, an epoxy resin, or a phenol resin as the organic material. Note that a material in which an impurity element such as lanthanum (La), nitrogen, zirconium (Zr), or the like is added to the above material may be used. The partition 110 formed using an organic material includes a round portion in the upper end portion as in FIG. 2B, FIG. 3B, and FIG. 3C. Including a round portion is denoted as the "upper end portion has curvature" or the "upper end portion is rounded" in some cases.

It is preferable that the lower end portion of the partition 110 be also rounded. Although not illustrated, when a negative photosensitive resin or a positive photosensitive resin is used as an organic material, the upper end portion and the lower end portion of the partition 110 can be rounded.

<Height of Partition 110>

The partition 110 includes the first region 110*x* extending along the X direction and the second region 110*y* extending along the Y direction. In the cross-sectional views of the pixel region 100, the first region 110*x* and the second region 110*y* each have different height.

FIG. 1 to FIG. 3C illustrate the case where an uppermost surface position of the partition 110 is higher in the second region 110*y* than in the first region 110*x*. In this embodiment, the uppermost surface positions of the partition 110 are compared, and thus either the thickness of the first region 110*x* or the thickness of the second region 110*y* may be larger. Furthermore, as illustrated in FIG. 1, a portion where the uppermost surface of the partition 110 is the highest is a portion where the first region 110*x* and the second region 110*y* intersect with each other.

The structure in which the height of the partition 110 is different between the first region 110*x* and the second region 110*y* is suitable for an inkjet method when the partition 110 serves as a formation surface. FIG. 4 illustrates the state where the light-emitting layers are formed by separately applying solutions by an inkjet method, which is preferable because nozzles 119*r*, 119*g*, and 119*b* can be moved along the second region 110*y* having the high uppermost surface position.

Although FIG. 4 illustrates the nozzles 119*r*, 119*g*, and 119*b* and shows the state where a solution containing a different starting material of the light-emitting layer is dropped from each nozzle, a solution containing the same starting material of the light-emitting layer may be dropped from the nozzle. In this case, it is considered that the light-emitting elements of the same color can be formed along the second region 110*y* and mass productivity is high.

Although FIG. 4 illustrates the partition 110, corresponding to FIG. 2A, in which the upper end portion includes an angular portion and the end portion has a tapered shape, the upper end portion of the partition 110 may include a round portion and the end portion may have a tapered shape as illustrated in FIG. 2B, or another shape may be employed.

The inkjet apparatus is preferably moved along the region of the partition 110 where the uppermost surface position is high. That is, the uppermost surface of the first region 110*x* of the partition may be higher than the uppermost surface of the second region 110*y* of the partition, and the inkjet apparatus may be moved along the first region 110*x*.

Although illustrated in FIG. 1, the second region 110*y* is placed between the light-emitting elements of different colors. That is, the second region 110*y* is placed between subpixels where the light-emitting elements of different colors are formed. The second region 110*y* placed in the above manner can exhibit an effect that the solutions discharged from the nozzles are not mixed between the subpixels.

Color mixing can be inhibited without placing the first region 110*x*; however, the solution starts to dry right after being dropped and aggregates, and it is difficult to inhibit the aggregation. In order to inhibit the aggregation, the first region 110*x* is preferably placed in each subpixel. That is, in order to inhibit the color mixing, the first region 110*x* is preferably placed in addition to the second region 110*y*, and the solution discharged from the nozzle can remain in the target light-emitting region.

<Method 1 for Forming First Region 110*x* and Second Region 110*y*>

The method for forming the first region 110*x* and the second region 110*y* illustrated in FIG. 1 is described. First, only the second region 110*y* is formed in a belt shape. The second region 110*y* can be formed using a material selected from the materials of the partition 110. For example, photosensitive polyimide is used. A precursor of polyimide is applied over the whole pixel region 100 and dried. Using photoresist or the like, a mask is placed to overlap with a region that is to be the second region 110*y*. Alternatively, a mask is placed to overlap with a region other than the second region 110*y*. When light exposure and development are performed using the mask, polyimide is placed corresponding to the second region 110*y*. After that, imidizing is performed as necessary. In such a manner, the second region 110*y* can be obtained.

Next, the first region 110*x* is formed in a belt shape using the same material as the second region 110*y*. Specifically, the first region 110*x* can be obtained through steps similar to the above steps relating to the second region 110*y*.

Since both the second region 110*y* and the first region 110*x* are formed in belt shapes, the mask is easily placed. Note that in order to make the height of the second region 110*y* large, the amount of the precursor is increased in the case where the second region 110*y* is formed compared with the case where the first region 110*x* is formed in a belt shape. The second region 110*y* is preferably greater than or equal to 1.5 times and less than or equal to 3 times the height of the first region 110*x*. Since polyimide of both regions are stacked in the portion where they intersect with each other, the uppermost surface becomes the highest. In the case where the height of the intersection portion is controlled, the position of the mask in forming the first region 110*x* is changed so that polyimide corresponding to the first region 110*x* is not formed in the intersection portion.

In such a manner, the first region 110*x* and the second region 110*y* illustrated in FIG. 1 can be obtained.

<Method 2 for Forming First Region 110*x* and Second Region 110*y*>

The method for forming the first region 110*x* and the second region 110*y* illustrated in FIG. 1 is described. Although described again, the partition 110 can have a stacked-layer structure of, for example, a lower partition containing an inorganic material and an upper partition containing an organic material. For example, an inorganic material to be the lower partition is deposited over the whole pixel region 100 first, and an organic material to be the upper partition is formed thereover. The stacked-layer structure is applied to the second region 110*y*. Furthermore, either the inorganic material or the organic material is applied to the first region 110*x*. Also in such a manner, the first region 110*x* and the second region 110*y* can be obtained.

Note that the upper partition can be used as a processing mask for the lower partition. Therefore, in the cross-sectional view, an end portion of the upper partition and an end portion of the lower partition can be aligned or substantially aligned with each other. Alternatively, the end portion of the upper partition can be positioned inward from the end portion of the lower partition containing an inorganic material.

In the case where the upper partition is not used as the processing mask for the lower partition, the end portion of the upper partition can be positioned outward from the end portion of the lower partition containing an inorganic material.

<Light-Emitting Layers 115*r*, 115*g*, and 115*b*>

After the partition 110 is formed, the light-emitting layers 115*r*, 115*g*, and 115*b* are formed separately over the hole-injection layer 104 as illustrated in FIG. 1 to FIG. 4. The separation structure corresponds to a light-emitting element having an SBS structure. The emission colors of the light-emitting layers 115*r*, 115*g*, and 115*b* correspond to red, green, and blue that are typical colors of full-color display.

Although described again, as illustrated in FIG. 3C, the light-emitting layer 115*r* may be formed over the first region 110*x*. In the case where the solution is continuously discharged from the nozzle, for example, the light-emitting layer 115*r* is likely to be formed over the first region 110*x*. The same applies to the light-emitting layer 115*g* and light-emitting layer 115*b*.

Although described again, examples of a wet process include a spin coating method, an inkjet method, a casting method, a printing method, a dispensing method, and a spray method. Productivity can be improved by forming at least the light-emitting layer with a wet process. In the case where the display device has flexibility, a structure in which at least the light-emitting layer is formed by a wet process is suitable because the flexibility is high.

Examples of a solvent used in a wet process include: a chlorine-based solvent such as dichloroethane, trichloroethane, chlorobenzene, and dichlorobenzene; an ether-based solvent such as tetrahydrofuran, dioxane, anisole, and methylanisole; an aromatic hydrocarbon-based solvent such as toluene, xylene, mesitylene, ethylbenzene, hexylbenzene, and cyclohexylbenzene; an aliphatic hydrocarbon-based solvent such as cyclohexane, methylcyclohexane, pentane, hexane, heptane, octane, nonane, decane, dodecane, and bicyclohexyl; a ketone-based solvent such as acetone, methyl ethyl ketone, benzophenone, and acetophenone; an ester-based solvent such as ethyl acetate, butyl acetate, ethyl cellosolve acetate, methyl benzoate, and phenyl acetate; a polyalcohol-based solvent such as ethylene glycol, glycerin, and hexanediol; an alcohol-based solvent such as isopropyl alcohol and cyclohexanol; a sulfoxide-based solvent such as dimethylsulfoxide; and an amide-based solvent such as methylpyrrolidone and dimethylformamide. One or more solvents can be used.

A starting material of the light-emitting layer formed by an inkjet method preferably includes a high molecular material (also referred to as a polymer-based light-emitting organic material in some cases). That is, in order to obtain a solution dropped by an inkjet method, a high molecular material that is likely to be mixed with the solvent is preferably used.

<Inkjet Apparatus>

The inkjet apparatus includes the nozzles 119*r*, 119*g*, and 119*b* as illustrated in FIG. 4. A nozzle 119 includes the nozzles 119*r*, 119*g*, and 119*b*; and an opening is provided in the nozzle 119 to discharge a solution, and the opening diameter (also referred to as a nozzle diameter) is greater than or equal to several micrometers and less than or equal to several tens of micrometers. A portion including the nozzle is sometimes referred to as a head. A solution dropping control portion is provided in the head to drop the solution, and a piezoelectric element or the like is included, for example. The solution can be dropped by changing the capacity of an ink tank connected to the nozzle with the piezoelectric element. The amount of a droplet is greater than or equal to several picoliters and less than or equal to several tens of picoliters according to the nozzle diameter in many cases. One picoliter of the solution can be considered to form a cube in which the length of one side is approximately 10 μm The solution may be intermittently dropped from the nozzles 119*r*, 119*g*, and 119*b*. When being dropped intermittently, the solution is referred to as a droplet in some cases. The solution may be dropped from the nozzles 119*r*, 119*g*, and 119*b* continuously and linearly. In each of the case of intermittent dropping and the case of continuous dropping, the solution is applied over the partition 110 in some cases.

When the light-emitting layer 115*r*, the light-emitting layer 115*g*, the light-emitting layer 115*b* are formed by a wet process or the like, a puddle is caused in the vicinity of the partition 110 as illustrated in the FIG. 2A to FIG. 3C. A first puddle 118*r*, a second puddle 118*g*, and a third puddle 118*b* respectively corresponding to the light-emitting layer 115*r*, the light-emitting layer 115*g*, and the light-emitting layer 115*b* are illustrated in FIG. 2A to FIG. 3C. Each puddle can be observed in a circular region surrounded by a dotted line.

The puddle is caused by a drying step in a normal pressure atmosphere or a reduced pressure atmosphere, which is performed to remove the solvent from the solution discharged by a wet process. In particular, the puddle is caused by a phenomenon in which a solute aggregates outward using the surface tension of the solution as moving force in the drying step in a reduced pressure atmosphere. The puddle can be referred to a portion where the light-emitting layer is thicker in the vicinity of the inside of the partition 110 (e.g., the circular regions each denoted by the dotted line in FIG. 2A to FIG. 3B) than in the center portion. The paddle makes current concentrate in the center of a light-emitting area, and the current density is not uniform; therefore, the paddle is preferably as small as possible.

In one embodiment of the present invention, the partition 110 is formed over the hole-injection layer 104, and thus there is no paddle in the hole-injection layer 104 even when the hole-injection layer 104 is formed by a wet process. That is, in one embodiment of the present invention, the paddle is minute corresponding to the light-emitting layer formed by a wet process. According to one embodiment of the present invention, a display device including a small paddle and the high-resolution pixel region 100 can be provided.

FIG. 5 illustrates the partition 110 different from the pixel region 100 illustrated in FIG. 1 in that the first region 110*x* is higher than the second region 110*y*. The second region 110*y* is enough to drop the solution in the light-emitting layer areas of the same color and to inhibit color mixing, and the first region 110*x* is higher than the second region 110*y*. In FIG. 5, the light-emitting layers of the same color are also sectioned sufficiently by the first region 110*x*. Therefore, crosstalk between the adjacent light-emitting elements can be inhibited in the light-emitting layers of the same color.

Although describe again, the hole-transport layer may be provided between the hole-injection layer 104 and the light-emitting layer 115.

After the light-emitting layer 115 is formed, an electron-transport layer, an electron-injection layer, and a cathode are provided, whereby the light-emitting element is completed. The electron-transport layer, the electron-injection layer, and the cathode can be formed over the whole pixel region 100. That is, the electron-transport layer, the electron-injection layer, and the cathode shared among the pixels are common layers. The electron-transport layer, the electron-injection layer, and the cathode can be formed by a wet process or an evaporation method. A spin coating method is preferably used as a wet process in the case where the electron-transport layer, the electron-injection layer, and the cathode are the common layers.

Structure Example 2

Figure 6:
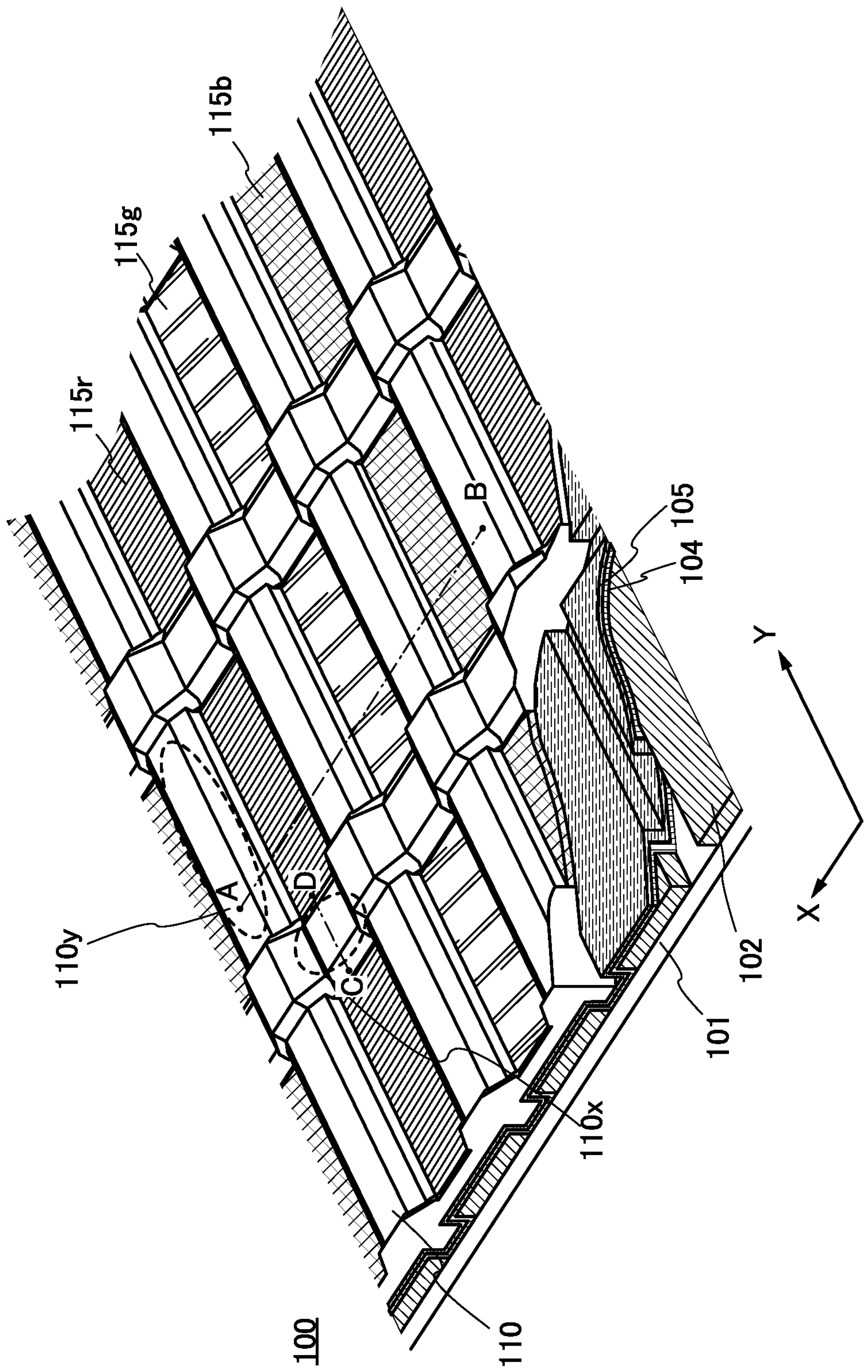
FIG. 6 is a perspective view illustrating a pixel region of one embodiment of the present invention.
Figure 9:
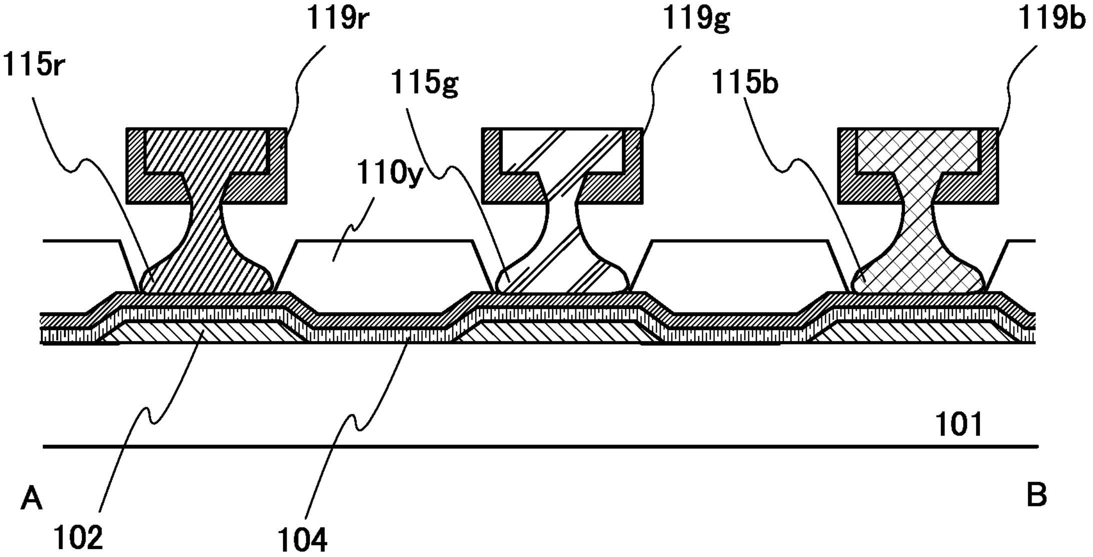
FIG. 9 is cross-sectional view illustrating a method for forming a pixel region of one embodiment of the present invention.
Figure 10:
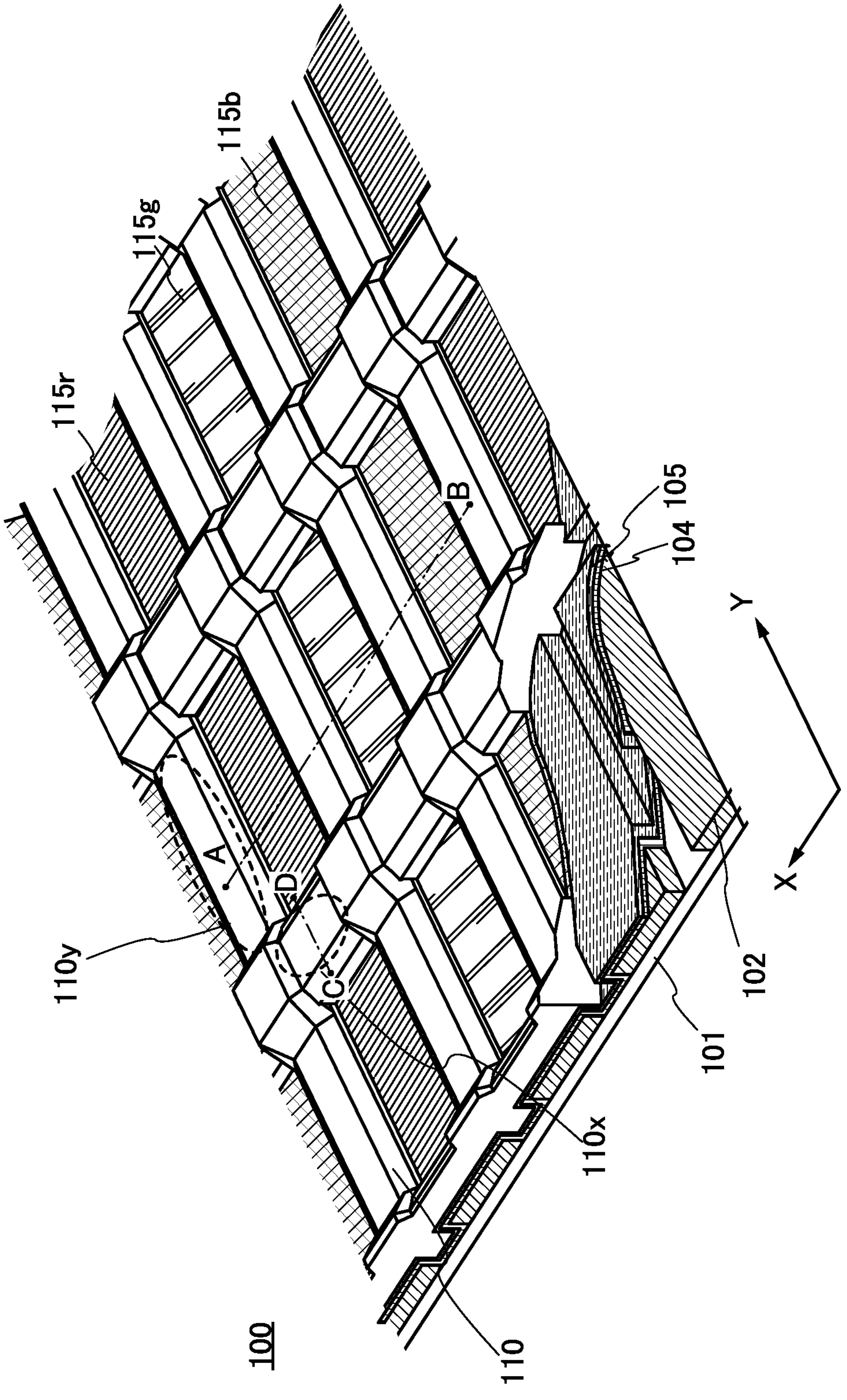
FIG. 10 is a perspective view illustrating a pixel region of one embodiment of the present invention.

Structure example 2 different from Structure example 1 above in that a hole-transport layer 105 is formed over the hole-injection layer 104 is described. FIG. 6 illustrates a perspective view example of the display device, FIG. 7A to FIG. 8C illustrates cross-sectional view examples of the display device, FIG. 9 illustrates a formation example of a light-emitting layer, and FIG. 10 illustrates a perspective view example of a display device that is different from that in FIG. 6.

As illustrated in FIG. 6, the display device includes the pixel region 100 and further a driver circuit region and the like. In the pixel region 100 in FIG. 6, the insulating film 101, the anode 102, the hole-injection layer 104, the hole-transport layer 105, the partition 110, the light-emitting layer 115, and the like are illustrated. The partition 110 includes the first region 110*x* and the second region 110*y*, and the feature is that a top surface of the second region 110*y* is higher than a top surface of the first region 110*x* in the partition 110. The light-emitting layer 115 includes the light-emitting layer 115*r*, the light-emitting layer 115*g*, and the light-emitting layer 115*b*; and the light-emitting layer 115*r*, the light-emitting layer 115*g*, and the light-emitting layer 115*b* respectively correspond to a light-emitting layer included in a red light-emitting element, a light light-emitting layer included in a green light-emitting element, and a light light-emitting layer included in a blue light-emitting element, for example. The structure of the pixel region 100 has part similar to that of Structure example 1, and the description thereof is omitted.

<Insulating film 101>

The insulating film 101 is provided over the transistor described above as illustrated in FIG. 6. The insulating film can have a structure similar to that of <Insulating film 101> in Structure example 1, and the structure and the like are described in <Insulating film 101> in Structure example 1. Therefore, the detailed description of the insulating film 101 is omitted in Structure example 2.

<Anode 102>

The anode 102 is included over the insulating film 101. The anode can have a structure similar to that of <Anode 102> in Structure example 1, and the structure and the like are described in <Anode 102> in Structure example 1. Therefore, the detailed description of the anode 102 is omitted in Structure example 2.

Figure 7A:
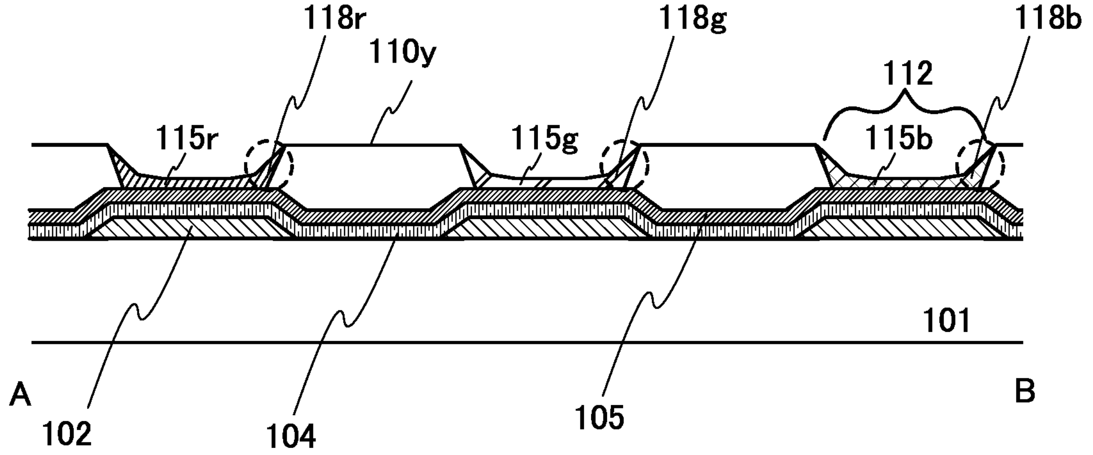
FIG. 7A and FIG. 7B are cross-sectional views illustrating a pixel region of one embodiment of the present invention.
Figure 7B:
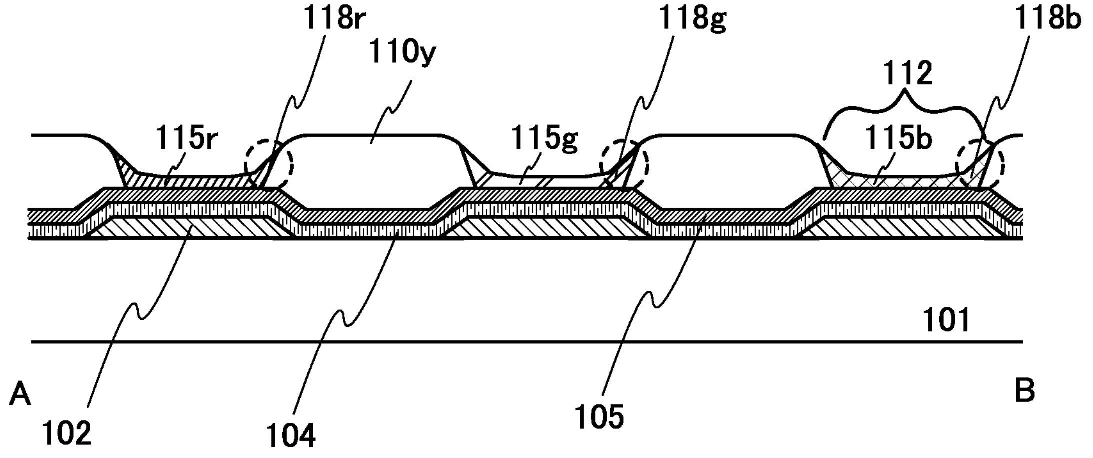

FIG. 7A and FIG. 7B illustrate cross-sectional views of the pixel region 100 taken along the dashed-dotted line AB illustrated in FIG. 6. Although the cross-sectional shape of the anode 102 is not limited, FIG. 7A and FIG. 7B illustrate the case where an end portion of the anode 102 has a tapered shape.

Figure 8A:
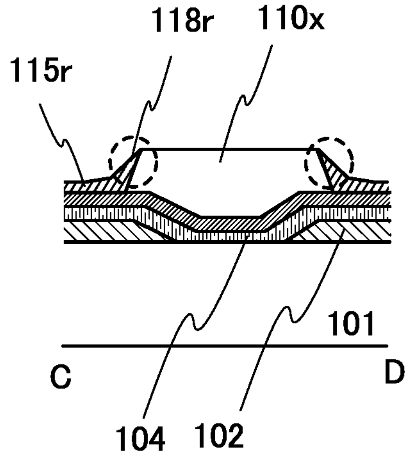
FIG. 8A to FIG. 8C are cross-sectional views illustrating a pixel region of one embodiment of the present invention.
Figure 8B:
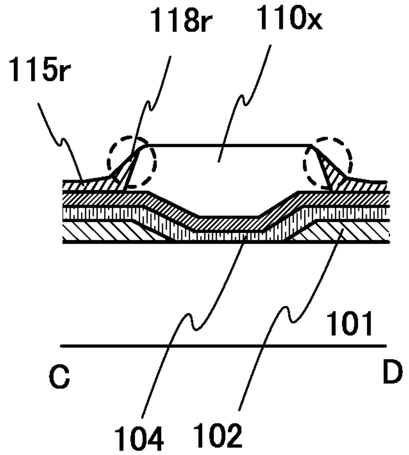
Figure 8C:
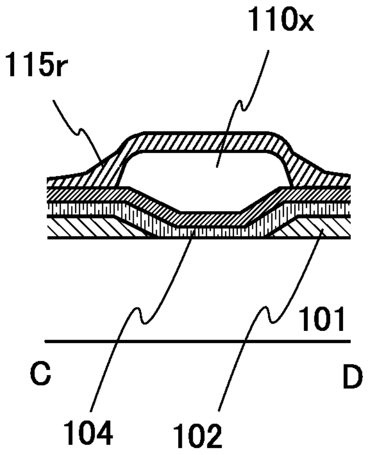

FIG. 8A to FIG. 8C illustrate cross-sectional views of the pixel region 100 taken along the dashed-dotted line CD illustrated in FIG. 6. Also in FIG. 8A to FIG. 8C, the end portion of the anode 102 has a tapered shape.

Note that as for the tapered shape of the end portion of the anode 102, FIG. 7A to FIG. 8C illustrate a shape in which the upper side is shorter than the lower side; however, a reverse tapered shape in which the lower side is shorter than the upper side may be employed. Needless to say, instead of the tapered shape, the end portion of the anode 102 may have a steep shape in which the upper side and the lower side have a substantially equal length (in the cross-sectional view, a shape in which the end portion is perpendicular or a shape in which the end portion is substantially perpendicular).

The tapered shape inhibits a thin film formed over the anode 102 from being disconnected, for example.

The resistance of the anode including the thinned region is gradually increased in some cases. That is, the anode 102 includes a region having high resistance corresponding to the tapered shape. The anode including the high-resistance region is also regarded as a region to which a signal, specifically voltage, supplied from the transistor is less likely to be applied.

<Hole-Injection Layer 104>

As illustrated in FIG. 6 to FIG. 8C, the hole-injection layer 104 is formed over the anode 102. The hole-injection layer can have a structure similar to that of <Hole-injection layer 104> in Structure example 1, and the structure and the like are described in <Hole-injection layer 104> in Structure example 1. Therefore, the detailed description of the hole-injection layer 104 is omitted in Structure example 2.

<Hole-Transport Layer 105>

As illustrated in FIG. 6 to FIG. 8C, the hole-transport layer 105 is formed over the hole-injection layer 104 in Structure example 2. The hole-transport layer 105 is not divided according to the pixel like the anode 102 and formed over the whole pixel region 100. That is, the hole-transport layer 105 is formed across a plurality of anodes and thus can be shared among the pixels. Although described again, the layer that can be shared among the subpixels is referred to as a common layer. The hole-transport layer 105 can be formed by a wet process or an evaporation method, and when the hole-transport layer 105 is a common layer, a step of separately forming the layer for each subpixel is unnecessary.

The hole-transport layer 105 includes a region overlapping with the tapered region of the anode 102. As described above, the tapered region of the anode 102 has high resistance, and thus part of the hole-transport layer 105 overlapping with the high-resistance region is less likely to transport holes or cannot transport holes. When the hole-transport layer 105 includes the region, crosstalk between adjacent light-emitting elements of different colors can be inhibited.

Although described in Structure example 1, part of the hole-injection layer 104 overlapping with the high-resistance region is less likely to be injected with holes or is not injected with holes from the anode 102. The forming such a hole-injection layer 104 as well as the hole-transport layer 105 can further inhibit crosstalk between the adjacent light-emitting elements of different colors.

In the case where the hole-transport layer 105 is formed over the anode 102 having the reverse tapered shape or the steep shape, the crosstalk is inhibited because the hole-transport layer 105 is disconnected.

From the above, crosstalk inhibition is an effect of the structure in which the hole-transport layer 105 and the like are provided along the anode 102.

<Partition 110>

In this embodiment, the light-emitting layers are separately formed by a wet process, e.g., an inkjet method, and thus sections where a solution is dropped are needed. The sections can be provided using an insulator, and such insulator is referred to as a partition, an embankment, or a bank in some cases.

In FIG. 6 to FIG. 8C, the partition 110 is formed over the hole-transport layer 105 and sections the subpixels, i.e., the light-emitting regions. The partition 110 can have a structure similar to that of <Partition 110> in Structure example 1, and the structure and the like are described in <Partition 110> in Structure example 1. Therefore, the detailed description of the partition 110 is omitted in Structure example 2.

<Height of Partition 110>

The partition 110 includes the first region 110*x* extending along the X direction and the second region 110*y* extending along the Y direction. In the cross-sectional views of the pixel region 100, the first region 110*x* and the second region 110*y* each have different height.

FIG. 6 to FIG. 8C illustrate the case where the uppermost surface position of the partition 110 is higher in the second region 110*y* than in the first region 110*x*. In this embodiment, the uppermost surface positions of the partition 110 are compared, and thus either the thickness of the first region 110*x* or the thickness of the second region 110*y* may be larger. Furthermore, as illustrated in FIG. 6, a portion where the uppermost surface of the partition 110 is the highest is a portion where the first region 110*x* and the second region 110*y* intersect with each other.

The structure in which the height of the partition 110 is different between the first region 110*x* and the second region 110*y* is suitable for an inkjet method when the partition 110 serves as a formation surface. FIG. 9 illustrates the state where the light-emitting layers are formed by separately applying solutions by an inkjet method, which is preferable because the nozzles 119*r*, 119*g*, and 119*b* can be moved along the second region 110*y* having the high uppermost surface position.

Although FIG. 9 illustrates the nozzles 119*r*, 119*g*, and 119*b* and shows the state where a solution containing a different starting material of the light-emitting layer is dropped from each nozzle, a solution containing the same starting material of the light-emitting layer may be dropped from the nozzle. In this case, it is considered that the light-emitting elements of the same color can be formed along the second region 110_y_ and mass productivity is high.

Although FIG. 9 illustrates the partition 110, corresponding to FIG. 7A, in which the upper end portion includes an angular portion and the end portion has a tapered shape, the upper end portion of the partition 110 may include a round portion and the end portion may have a tapered shape as illustrated in FIG. 7B, or another shape may be employed. The inkjet apparatus can be moved along the region of the partition 110 where the uppermost surface position is high in FIG. 9.

The inkjet apparatus is preferably moved along the region of the partition 110 where the uppermost surface position is high. That is, the uppermost surface of the first region 110_x_ of the partition may be higher than the uppermost surface of the second region 110_y_ of the partition, and the inkjet apparatus may be moved along the first region 110_x_.

Although illustrated in FIG. 6, the second region 110_y_ is placed between the light-emitting elements of different colors. That is, the second region 110_y_ is placed between subpixels corresponding to the light-emitting elements of different colors. The second region 110_y_ placed in the above manner can exhibit an effect that the solutions discharged from the nozzles are not mixed between the subpixels.

Color mixing can be inhibited without placing the first region 110_x_; however, the solution starts to dry right after being dropped and aggregates, and it is difficult to inhibit the aggregation. In order to inhibit the aggregation, the first region 110_x_ is preferably placed in each subpixel. That is, in order to inhibit the color mixing, the first region 110_x_ is preferably placed in addition to the second region 110_y_, and the solution discharged from the nozzle can remain in the target light-emitting region.

<Method 3 for Forming First Region 110_x_ and Second Region 110_y_>

The method for forming the first region 110_x_ and the second region 110_y_ illustrated in FIG. 6 can be similar to <Method 1 for forming first region 110_x_ and second region 110_y_> and <Method 2 for forming first region 110_x_ and second region 110_y_> in Structure example 1, and the detailed description of the method and the like is omitted.

<Light-Emitting Layers 115_r_, 115_g_, and 115_b_>

After the partition 110 is formed, the light-emitting layers 115_r_, 115_g_, and 115_b_ are formed separately over the hole-transport layer 105 as illustrated in FIG. 6 to FIG. 9. The separation structure corresponds to a light-emitting element having an SBS structure. The emission colors of the light-emitting layers 115_r_, 115_g_, and 115_b_ correspond to red, green, and blue that are typical colors of full-color display.

The light-emitting layers 115_r_, 115_g_, and 115_b_ are formed by a wet process. As for a wet process or the like, the method or structure similar to the specific method and material described in <Light-emitting layers 115_r_, 115_g_, and 115_b_> in Structure example 1 can be employed, and the method, structure, or the like is described in <Light-emitting layers 115_r_, 115_g_, and 115_b_> in Structure example 1; thus, the detailed description is omitted in Structure example 2.

Although described again, as illustrated in FIG. 8C, the light-emitting layer 115_r_ may be formed over the first region 110_x_. In the case where the solution is continuously discharged from the nozzle, for example, the light-emitting layer 115_r_ is likely to be formed over the first region 110_x_. The same applies to the light-emitting layer 115_g_ and light-emitting layer 115_b_.

<Inkjet Apparatus>

The inkjet apparatus includes the nozzles 119_r_, 119_g_, and 119_b_ as illustrated in FIG. 9. The inkjet apparatus and the like can have the structure similar to the structure described in <Inkjet apparatus> in Structure example 1, and the structure is described in <Inkjet apparatus> in Structure example 1; thus, the detailed description of <Inkjet apparatus> is omitted in Structure example 2.

When the light-emitting layer 115_r_, the light-emitting layer 115_g_, the light-emitting layer 115_b_ are formed by a wet process or the like, a puddle is caused in the vicinity of the partition 110 as illustrated in the FIG. 7A to FIG. 8C. The first puddle 118_r_, the second puddle 118_g_, and the third puddle 118_b_ respectively corresponding to the light-emitting layer 115_r_, the light-emitting layer 115_g_, and the light-emitting layer 115_b_ are illustrated in FIG. 7A to FIG. 8C.

The puddle is caused by a drying step in a normal pressure atmosphere or a reduced pressure atmosphere, which is performed to remove the solvent from the solution discharged by a wet process. In particular, the puddle is caused by a phenomenon in which a solute aggregates outward using the surface tension of the solution as moving force in the drying step in a reduced pressure atmosphere. The puddle can be referred to a portion where the light-emitting layer is thicker in the vicinity of the inside of the partition 110 (e.g., the circular regions each denoted by the dotted line in FIG. 7A to FIG. 8B) than in the center portion. The paddle makes current concentrate in the center of a light-emitting area, and the current density is not uniform; therefore, the paddle is preferably as small as possible.

In one embodiment of the present invention, the partition 110 is formed over the hole-transport layer 105, and thus there is no paddle in the hole-transport layer even when the hole-transport layer 105 is formed by a wet process. That is, in one embodiment of the present invention, the paddle is minute corresponding to the light-emitting layer formed by a wet process. According to one embodiment of the present invention, a display device including a small paddle and the high-resolution pixel region 100 can be provided.

FIG. 10 illustrates the partition 110 different from the partition 110 illustrated in FIG. 6 in that the first region 110_x_ is higher than the second region 110_y_. The second region 110_y_ is enough to drop the solution in the light-emitting layer areas of the same color and to inhibit color mixing, and the first region 110_x_ is higher than the second region 110_y_. In FIG. 10, the light-emitting layers of the same color are also sectioned sufficiently by the first region 110_x_. Therefore, crosstalk between the adjacent pixels can be inhibited in the light-emitting layers of the same color.

After the light-emitting layer 115 is formed, an electron-transport layer, an electron-injection layer, and a cathode are provided, whereby the light-emitting element is completed. The electron-transport layer, the electron-injection layer, and the cathode can be formed over the whole pixel region 100. That is, the electron-transport layer, the electron-injection layer, and the cathode are common layers in each pixel. The electron-transport layer, the electron-injection layer, and the cathode can be formed by a wet process or an evaporation method. A spin coating method is preferably used as a wet process in the case where the electron-transport layer, the electron-injection layer, and the cathode are the common layers.

The description in this embodiment can be used in combination with the other embodiments.

Embodiment 2

In this embodiment, a light-emitting element that can be used in the display device of one embodiment of the present invention will be described.

Structure Example of Light-Emitting Element

Figure 11A:
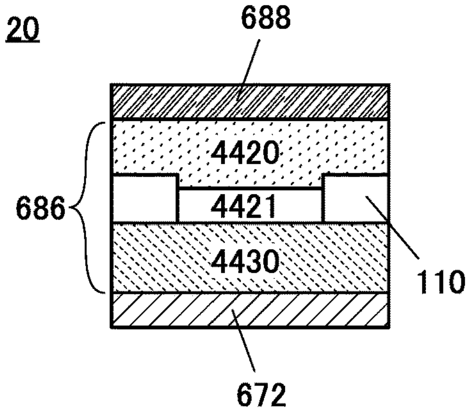

As illustrated in FIG. 11A, a light-emitting element 20 includes a light-emitting unit 686 between a pair of electrodes (a lower electrode 672 and an upper electrode 688). The light-emitting unit 686 includes a plurality of functional layers such as a layer 4430, a light-emitting layer 4421, and a layer 4420 in order from a lower electrode 672. In one embodiment of the present invention, the partition 110 is positioned with respect to a functional layer formed by a wet process. For example, when the light-emitting layer 4421 is formed by a wet process, the partition 110 is provided over the layer 4430 for sectioning the light-emitting layer 4421. Although not illustrated, the partition 110 includes the first region and the second region each having different height described in the above embodiment.

As the light-emitting layer 4421, a functional layer containing a light-emitting material is used, for example.

The layer 4420 and the layer 4430 are described. For example, in the case where the lower electrode 672 is an anode and the upper electrode 688 is a cathode as in the above embodiment, the layer 4430 positioned over the lower electrode 672 has a structure in which a hole-injection layer, a hole-transport layer, and the like are sequentially stacked from the lower electrode. Note that the layer 4430 is any one of the hole-injection layer and the hole-transport layer in some cases. Furthermore, for the layer 4420, a structure in which an electron-injection layer, an electron-transport layer, and the like are sequentially stacked from the upper electrode is employed. Moreover, the layer 4420 is any one of the electron-injection layer and the electron-transport layer in some cases.

Although different from the above embodiment, the lower electrode 672 can be a cathode, and the upper electrode 688 can be an anode. In this case, the layer 4430 positioned over the lower electrode 672 has a structure in which the electron-injection layer, the electron-transport layer, and the like are sequentially stacked from the lower electrode. The layer 4430 is any one of the electron-injection layer and the electron-transport layer in some cases. Furthermore, for the layer 4420, a structure in which a hole-injection layer, a hole-transport layer, and the like are sequentially stacked from the upper electrode is employed. The layer 4430 is any one of the hole-injection layer and the hole-transport layer in some cases.

Note that the lower electrode 672 can be formed by an evaporation method, a CVD method, or a sputtering method. The upper electrode 688 can be formed by an evaporation method, a CVD method, or a sputtering method. The layer 4430 can be formed by a wet process or an evaporation method. The layer 4420 can be formed by a wet process or an evaporation method.

In FIG. 11A, the partition 110 is formed over the layer 4430, and the light-emitting layer 4421 is formed by a wet process such as an inkjet method over the layer 4430 exposed in the partition 110 in a top surface view. The layer 4420 and the upper electrode 688 can be common layers, and the layer 4420 and the upper electrode 688 are preferably formed to cover the partition 110 as in FIG. 11A. The common layers are preferably made thick to cover the partition 110. In the case where there is a limitation on making the common layers thick, the light-emitting layer 4421 may be made thick. In this case, the amount of solution dropped from the inkjet apparatus is preferably adjusted to make the thickness of the light-emitting layer greater than or equal to two third times and less than one time with respect to the height of the partition 110.

Figure 11B:
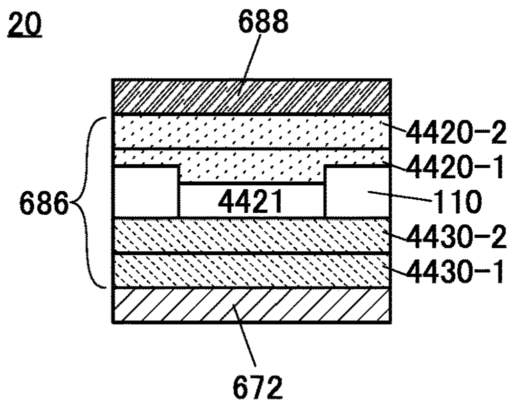
Figure 11B:
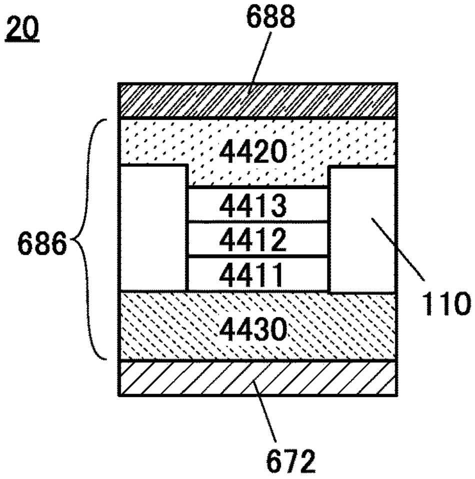
Figure 11B:
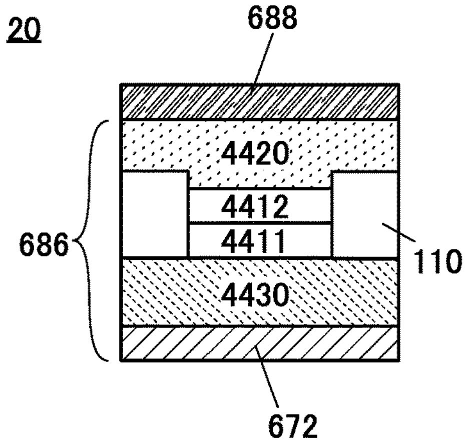
Figure 11B:
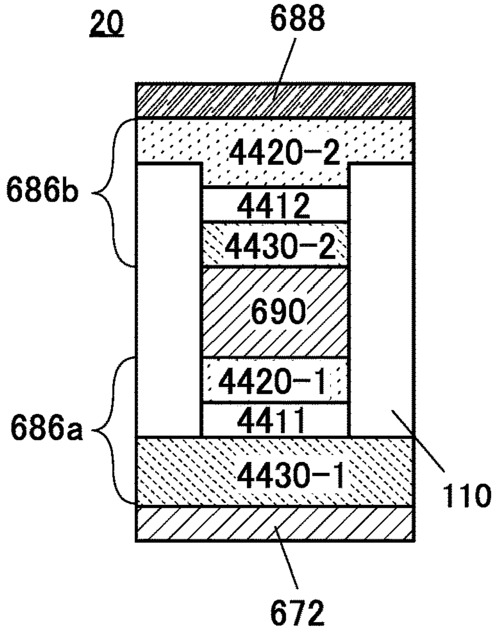
Figure 11B:
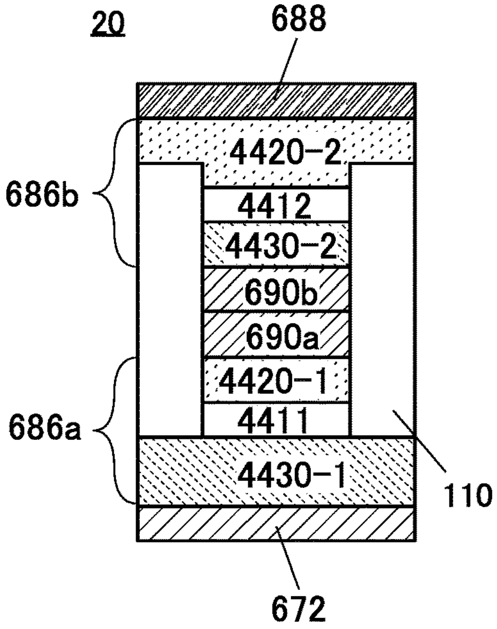

Next, a more specific structure of FIG. 11A is illustrated in FIG. 11B. The light-emitting element 20 illustrated in FIG. 11B includes a layer 4430-1 over the lower electrode 672, a layer 4430-2 over the layer 4430-1, the light-emitting layer 4421 over the layer 4430-2, a layer 4420-1 over the light-emitting layer 4421, a layer 4420-2 over the layer 4420-1, and the upper electrode 688 over the layer 4420-2, and the partition 110 is positioned with respect to the layer formed by a wet process. For example, when the light-emitting layer 4421 is formed by a wet process, the partition 110 is provided over the layer 4430-2 to section the light-emitting layer 4421. Although not illustrated, the partition 110 includes the first region and the second region each having different height described in the above embodiment.

For example, as in the above embodiment, when the lower electrode 672 functions as an anode and the upper electrode 688 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer.

Although different from the above embodiment, the lower electrode 672 can be a cathode, and the upper electrode 688 can be an anode. In this case, the layer 4430-1 functions as an electron-injection layer, the layer 4430-2 functions as an electron-transport layer, the layer 4420-1 functions as a hole-transport layer, and the layer 4420-2 functions as a hole-injection layer.

With such a layer structure, carriers (holes and electrons) can be efficiently injected to the light-emitting layer 4421, and the efficiency of the recombination of carriers in the light-emitting layer 4421 can be enhanced. Note that the layer included between the light-emitting layer 4421 and the lower electrode 672 and the layer included between the light-emitting layer 4421 and the upper electrode 688 are not limited to the above, and a carrier-blocking layer, an exciton-blocking layer, or the like may be included as appropriate. Furthermore, a layer having both a carrier-transport function and a carrier-injection function may be used.

Note that the lower electrode 672 can be formed by an evaporation method, a CVD method, or a sputtering method. The upper electrode 688 can be formed by an evaporation method, a CVD method, or a sputtering method. The layer 4430-1 can be formed by a wet process or an evaporation method. The layer 4430-2 can be formed by a wet process or an evaporation method. The layer 4420-1 can be formed by a wet process or an evaporation method. The layer 4420-2 can be formed by a wet process or an evaporation method.

In FIG. 11B, the partition 110 is formed over the layer 4430-2, and the light-emitting layer 4421 is formed by a wet process such as an inkjet method over the layer 4430-2 exposed in the partition 110 in the top surface view. The layer 4420-1, the layer 4420-2, and the upper electrode 688 can be common layers, and the layer 4420-1, the layer 4420-2, and the upper electrode 688 are preferably formed to cover the partition 110 as in FIG. 11B. The common layers are preferably made thick to cover the partition 110. In the case where there is a limitation on making the common layers thick, the light-emitting layer 4421 may be made thick. In this case, the amount of solution dropped from the inkjet apparatus is preferably adjusted to make the thickness of the light-emitting layer greater than or equal to two third times and less than one time with respect to the height of the partition 110.

Next, modification examples of FIG. 11A and FIG. 11B are illustrated in FIG. 11C1 and FIG. 11C2. In FIG. 11C1, a plurality of light-emitting layers (a first light-emitting layer 4411, a second light-emitting layer 4412, and a third light-emitting layer 4413) are provided between the layer 4420 and the layer 4430. In FIG. 11C2, a plurality of light-emitting layers (the first light-emitting layer 4411 and the second light-emitting layer 4412) are provided between the layer 4420 and the layer 4430.

In FIG. 11C1 and FIG. 11C2, the partition 110 is positioned with respect to a layer formed by a wet process. For example, the formation of the partition 110 over the layer 4430 enables one or two or more of the plurality of light-emitting layer in FIG. 11C1 and FIG. 11C2, specifically all of the light-emitting layers can be formed by a wet process. Although not illustrated, the partition 110 includes the first region and the second region each having different height described in the above embodiment.

For light-emitting materials contained in the plurality of light-emitting layers in FIG. 11C1 and FIG. 11C2, light-emitting substances of the same color or light-emitting substances of different colors can be selected. When the light-emitting substances of the same color are selected, driving current can be reduced while driving voltage is increased; thus, advantages in higher luminance and a longer lifetime can be obtained. In FIG. 11C1 and FIG. 11C2, blue (B), green (G), and red (R) light-emitting substances are separately applied to respective light-emitting elements as the light-emitting substances of the same color, whereby full-color display is achieved.

In the case where the different color light-emitting substances are selected, a light-emitting element that exhibits white light emission can be obtained when the light-emitting substances are selected so that they emit light of complementary colors. For example, in FIG. 11C1, the light-emitting substances are used so that the emission color of the first light-emitting layer 4411 and the emission color of the third light-emitting layer 4413, which are the same, and the emission color of the second light-emitting layer 4412 are complementary colors, whereby white light emission can be obtained from the light-emitting element 20. Furthermore, for example, in FIG. 11C2, when the light-emitting substances are used so that the emission color of the first light-emitting layer 4411 and the emission color of the second light-emitting layer 4412 are complementary colors, white light emission can be obtained from the light-emitting element 20. In the case of exhibiting white light emission, when full-color display is required, a method in which a color filter or a color conversion layer is used to obtain a desired color such as blue (B), green (G), and red (R) is used.

Although FIG. 11C1 and FIG. 11C2 illustrate the structures in which three light-emitting layers are stacked and two light-emitting layers are stacked, four or more light-emitting layers may be stacked.

In FIG. 11C1 and FIG. 11C2, the first light-emitting layer 4411 is formed by a wet process such as an inkjet method over the layer 4430 exposed in the partition 110. The lower electrode 672 and the upper electrode 688 can be formed by an evaporation method, a CVD method, or a sputtering method. The layer 4430 and the layer 4420 can be formed by a wet process or an evaporation method. Among them, the layer 4420 and the upper electrode 688 can be shared among the plurality of light-emitting elements, and they are referred to as common layers. The common layers are formed over the whole pixel region. The common layers are formed to cover the partition 110; in the case where the common layers are not disconnected by the partition 110, the common layers are preferably made thick. In the case where there is a limitation on making the common layers thick, the amount of solution dropped from the inkjet apparatus is preferably adjusted to make the thickness of the first light-emitting layer 4411, the second light-emitting layer 4412, or the third light-emitting layer 4413 greater than or equal to two third times and less than one time with respect to the height of the partition 110.

Note that the layer 4420 and the layer 4430 in FIG. 11C1 and FIG. 11C2 may each have a stacked-layer structure of two or more layers as illustrated in FIG. 11B.

Next, modification examples of FIG. 11C2 are illustrated in FIG. 11D1 and FIG. 11D2. FIG. 11D1 and FIG. 11D2 both illustrate structure examples where light-emitting units are stacked. FIG. 11D1 and FIG. 11D2 are common in a structure in which a first light-emitting unit **686*a* and a second light-emitting unit 686*b* are included and an intermediate layer 690 is included therebetween, and in FIG. 11D2, the intermediate layer has a stacked-layer structure of an intermediate layer 690*a* and an intermediate layer 690*b*. The first light-emitting unit 686*a* includes the layer 4430-1, the first light-emitting layer 4411, and the layer 4420-1. The second light-emitting unit 686*b* includes the layer 4430-2, the second light-emitting layer 4412, and the layer 4420-2. The partition 110 is positioned with respect to a layer formed by a wet process among the layers. For example, when the first light-emitting layer 4411 and the second light-emitting layer 4412 are formed by a wet process, the partition 110 is provided to section the first light-emitting layer 4411 and the second light-emitting layer 4412. Although not illustrated, the partition 110** includes the first region and the second region each having different height described in the above embodiment.

The layer 4420-1 and the layer 4430-1 are functional layers similar to the layer 4420 and the layer 4430, respectively. The layer 4420-2 and the layer 4430-2 are functional layers similar to the layer 4420 and the layer 4430, respectively.

The intermediate layer 690 illustrated in FIG. 11D1 contains a dopant material as a material similar to that of the layer 4420-1 and an acceptor material as a material similar to that of the layer 4430-2.

In FIG. 11D2, the intermediate layer **690*a* contains a dopant material as a material similar to that of the layer 4420-1, and the intermediate layer 690*b* contains an acceptor material as a material similar to that of the layer 4430-2**.

For light-emitting materials contained in the plurality of light-emitting layers in FIG. 11D1 and FIG. 11D2, light-emitting substances of the same color or light-emitting substances of different colors can be selected as in FIG. 11C2. When the light-emitting substances of the same color are selected, driving current can be reduced while driving voltage is increased; thus, advantages in higher luminance and a longer lifetime can be obtained. In the case where the different color light-emitting substances are selected, a light-emitting element that exhibits white light emission can be obtained when the light-emitting substances are selected so that they emit light of complementary colors.

In FIG. 11D1 and FIG. 11D2, in the case of exhibiting white light emission, when full-color display is required, a method in which a color filter or a color conversion layer is used to obtain a desired color such as blue (B), green (G), and red (R) is used as in FIG. 11C2.

In FIG. 11D1 and FIG. 11D2, as in FIG. 11C2, when light emission colors (e.g., blue (B), green (G), and red (R)) are separately applied to each light-emitting element, full-color display is achieved.

The color purity can be further increased when the light-emitting element 20 illustrated in FIG. 11 has a microcavity structure. In the microcavity structure, the optical distance between the upper electrode 688 and the lower electrode 672, specifically the distance, is different for each emission color.

In order to make the optical distance between the upper electrode 688 and the lower electrode 672 different, the thickness of the lower electrode 672 is preferably varied. In the case where the thickness of the lower electrode 672 is varied, when the lower electrode 672 has a stacked-layer structure of a first conductive film and a second conductive film over the first conductive film, the thickness of the second conductive film is varied, in which case the microcavity structure is easily employed.

Here, examples of a material of each functional layer included in the light-emitting element is described.

A hole-injection layer is a layer injecting holes from an anode to a hole-transport layer. Specifically, the hole-injection layer can be formed using a phthalocyanine-based complex compound, an aromatic amine compound, a high molecule such as poly(3,4-ethylenedioxythiophene)/poly (styrenesulfonic acid) (PEDOT/PSS), or the like.

The hole-injection layer may be formed using a substance having an acceptor property. As the substance having an acceptor property, an organic compound including an electron-withdrawing group (a halogen group, a cyano group, or the like) can be used. A compound in which electron-withdrawing groups are bonded to a condensed aromatic ring having a plurality of hetero atoms, such as 2,3,6,7,10,11-hexacyano-1,4,5,8,9,12-hexaazatriphenylene (abbreviation: HAT-CN), is particularly preferable because it is thermally stable. Alternatively, a [3]radialene derivative including an electron-withdrawing group (in particular, a cyano group, a halogen group such as a fluoro group, or the like) is preferable because it has a very high electron-accepting property.

As the substance having an acceptor property, molybdenum oxide, vanadium oxide, ruthenium oxide, tungsten oxide, manganese oxide, or the like can be used, other than the above-described organic compounds. In particular, molybdenum oxide is preferable because it is stable in the air, has a low hygroscopic property, and is easily handled. Furthermore, tin oxide, indium oxide, or titanium oxide may be used. The substance having an acceptor property can extract electrons from an adjacent hole-transport layer (or hole-transport material) by the application of voltage between electrodes.

The hole-injection layer may be formed using a composite material containing any of the aforementioned materials having an acceptor property and a material having a hole-transport property. As the material having a hole-transport property used for the composite material, any of a variety of organic compounds such as aromatic amine compounds, heteroaromatic compound, aromatic hydrocarbons, and high molecular compounds (e.g., oligomers, dendrimers, or polymers) can be used. Note that the material having a hole-transport property used for the composite material preferably has a hole mobility higher than or equal to $1\times10^{-6}$ $cm^2/Vs$. The material having a hole-transport property used in the composite material is preferably a compound having a condensed aromatic hydrocarbon ring or a π-electron rich heteroaromatic ring. As the fused aromatic hydrocarbon ring, an anthracene ring, a naphthalene ring, or the like is preferable. As the π-electron rich heteroaromatic ring, a fused aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further fused to a carbazole ring or a dibenzothiophene ring is preferable. Another aromatic amine compound can be used as the material having a hole-transport property.

The hole-transport layer is a layer that transports holes, which are injected from the anode by the hole-injection layer, to the light-emitting layer. The hole-transport layer is a layer containing a hole-transport material. As the hole-transport material, a substance having a hole mobility greater than or equal to $1\times10^{-6}$ $cm^2/Vs$ is preferable. Note that other substances can be used as the hole-transport material as long as they have a property of transporting holes than electrons. As the hole-transport material, a material having a high hole-transport property, such as a π-electron rich heteroaromatic compound or aromatic amine, is specifically preferable.

As the π-electron rich heteroaromatic ring, a fused aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further fused to a carbazole ring or a dibenzothiophene ring is preferable.

The electron-transport layer is a layer that transports electrons, which are injected from the cathode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as the electron-transport material as long as they have a property of transporting more electrons than holes. As the electron-transport material, a metal complex, an organic compound having a π-electron deficient heteroaromatic ring skeleton, and the like are preferable. Specifically, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound. In particular, the heterocyclic compound having a diazine skeleton, the heterocyclic compound having a triazine skeleton, or the heterocyclic compound having a pyridine skeleton has high reliability and thus is preferable. Among them, the heterocyclic compound having a diazine (pyrimidine, pyrazine, or the like) skeleton or a triazine skeleton has a high electron-transport property and contributes to a reduction in driving voltage.

The electron-injection layer is a layer injecting electrons from the cathode to the electron-transport layer, and a layer containing a material with a high electron-injection property. As the material with a high electron-injection property, an alkali metal, an alkaline earth metal, a compound thereof, or a complex thereof can be used. As a material of the electron-injection layer, an alkali metal, an alkaline earth metal, or a compound thereof is included in a layer of an electride or a substance having an electron-transport property, can also be used.

Alternatively, a material with an electron-transport property can be used for the electron-injection layer. For example, a compound having an unshared electron pair and an electron deficient heteroaromatic ring can be used as the material with an electron-transport property. Specifically, a compound including at least one of a pyridine ring, a diazine ring (a pyrimidine ring, a pyrazine ring, or a pyridazine ring), and a triazine ring, e.g., 4,7-diphenyl-1,10-phenanthroline (abbreviation: BPhen) or 2,9-bis(naphthalene-2-yl)-4,7-diphenyl-1,10-phenanthroline (abbreviation: NBPhen), can be used.

The light-emitting layer contains a light-emitting material (also referred to as a light-emitting substance). The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

As the light-emitting substance, a fluorescent material, a phosphorescent material, a substance exhibiting thermally activated delayed fluorescence (a thermally activated delayed fluorescent (TADF) material), a quantum dot material, or the like can be used.

As a fluorescent material, a known material can be used, and as a blue fluorescent material, a heteroaromatic diamine compound or a condensed aromatic diamine compound is particularly preferable. Examples of the compound include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. In particular, a condensed aromatic diamine compound typified by a pyrenediamine compound is preferable because of its high hole-trapping property, high emission efficiency, and high reliability.

Examples of the phosphorescent material include an organometallic complex (particularly an iridium complex) having a 4H-triazole skeleton, a 1H-triazole skeleton, an imidazole skeleton, a carbene skeleton, a pyrimidine skeleton, a pyrazine skeleton, a pyridine skeleton, or a quinoline skeleton; an organometallic complex (particularly an iridium complex) having a phenylpyridine derivative including an electron-withdrawing group as a ligand; a platinum complex; and a rare earth metal complex.

For the TADF material, fullerene and its derivative, acridine and its derivative, an eosin derivative, a metal-containing porphyrin such as a porphyrin containing magnesium (Mg), zinc (Zn), cadmium (Cd), tin (Sn), platinum (Pt), indium (In), or palladium (Pd), a heterocyclic compound including one or both of a π-electron rich heteroaromatic ring and a π-electron deficient heteroaromatic ring, or the like can be used.

Among skeletons having the π-electron deficient heteroaromatic ring, a pyridine skeleton, a diazine skeleton (a pyrimidine skeleton, a pyrazine skeleton, or a pyridazine skeleton), and a triazine skeleton are preferable as the TADF material because of the high stability and reliability. In particular, a benzofuropyrimidine skeleton, a benzothienopyrimidine skeleton, a benzofuropyrazine skeleton, and a benzothienopyrazine skeleton are preferable as the TADF material because of their high acceptor property and favorable reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included in the TADF material. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, or a 3-(9-phenyl-9H-carbazol-3-yl)-9H-carbazole skeleton is particularly preferable.

Note that in the case of including both the π-electron deficient heteroaromatic ring and the π-electron rich heteroaromatic ring, instead of at least one of them, a π-electron deficient skeleton or a π-electron rich skeleton can be used. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material described above can be used. Alternatively, as one or more kinds of organic compounds, a bipolar material or a TADF material may be used.

The light-emitting layer preferably contains, for example, a phosphorescent material, a hole-transport material, and an electron-transport material. A combination of the hole-transport material and the electron-transport material easily forms an exciplex. With such a structure, light emission can be efficiently obtained by ExTET (Exciplex—Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In one embodiment of the present invention, the light-emitting layer is formed by a wet process such as an inkjet method, and a solution in which the above materials are dissolve or dispersed in a solvent can be used. In this case, a variety of organic solvents can be used as the solvent. Furthermore, a material such as a polymer material, a low molecular material, or dendrimer having a desired function are mixed, and the mixture itself or the mixture dissolved or dispersed in the solvent can be used as the solution.

When the light-emitting layer is to be formed using a polymer, a solution in which one or more monomers of a polymer material to be formed as a film are mixed may be discharged to a film-formation surface, and a bond such as cross-linking, condensation, polymerization, coordination, or a salt may be formed by heating, energy light irradiation, or the like to form a desired film.

Note that the solution may contain an organic compound having a different function such as a substance for surface activation or viscosity adjustment.

As the polymer material, a conjugated polymer, a non-conjugated polymer, a pendant-type polymer, a dye-blend type polymer, or the like can be used. Examples of the conjugated polymer include a polyparaphenylene vinylene derivative ((poly(p-phenylenevinylene); PPV), a polyalkylthiophene derivative ((poly(3-alkylthiophene); PAT), a polyparaphenylene derivative (poly(1,4-phenylene); PPP base), a polyfluorene derivative (poly(9,9-dialkylfluorene); PDAF), and a copolymer thereof. As the pendant-type polymer, a vinyl polymer can be given, and a polyvinylcarbazole derivative (PVK) is included, for example.

As the organic solvents that can be used as the solvent, a variety of organic solvents such as benzene, toluene, xylene, mesitylene, tetrahydrofuran, dioxane, ethanol, methanol, n-propanol, isopropanol, n-butanol, t-butanol, acetonitrile, dimethylsulfoxide, dimethylformamide, chloroform, methylene chloride, carbon tetrachloride, ethyl acetate, hexane, or cyclohexane can be used. In particular, a low-polarity benzene derivative such as benzene, toluene, xylene, or mesitylene is preferably used, in which case a solution with a suitable concentration can be obtained and a material contained in the solution can be prevented from deteriorating due to oxidation or the like. Furthermore, in light of the uniformity of a formed film or the uniformity of film thickness, the boiling point is preferably 100° C. or higher, and toluene, xylene, or mesitylene is further preferable.

<Material of Layer 4430>

Note that in one embodiment of the present invention, the layer 4430, other than the light-emitting layer, may be formed by a wet process. Since the layer 4430 can be a common layer, a spin coating method is preferably used as a wet process. Specifically, after the lower electrode 672 is formed, the layer 4430 can be formed without patterning when a spin coating method or the like is used.

In the case where the lower electrode 672 is an anode, it is preferable that the layer 4430 concurrently contain the skeleton with a high hole-transport property and the material having an acceptor property. In the case where the layer 4430 is formed by a wet process, examples of the material having an acceptor property include a sulfonic acid compound, a fluorine compound, a trifluoroacetic acid compound, a propionic acid compound, and a metal oxide.

In the case where the layer 4430 is formed by a wet process, when a solution is applied in which a monomer is mixed, a secondary amine and arylsulfonic acid are preferably used as the monomer.

As a secondary amine, a substituted or unsubstituted aryl group having 6 to 14 carbon atoms and a substituted or unsubstituted π-electron rich type heteroaryl group having 6 to 12 carbon atoms can be used. As an aryl group, for example, a phenyl group, a biphenyl group, a naphthyl group, a fluorenyl group, a phenanthrenyl group, an anthryl group, or the like can be used, and a phenyl group is preferable because it has high solubility and is inexpensive. As a heteroaryl group, a carbazole skeleton, a pyrrole skeleton, a thiophene skeleton, a furan skeleton, an imidazole skeleton, or the like can be used. In addition, a plurality of bondings with an arylamine or a heteroaryl amine are preferably provided because film quality is improved, and oligomers and polymers may be formed. In the case where a plurality of amines are included, part of the amine may be a tertiary amine and the proportion of a secondary amine is preferably higher than the proportion of a tertiary amine. The number of amines is preferably less than or equal to 1000, further preferably less than or equal to 10, and the molecular weight is preferably less than or equal to 100000. Substitution with fluorine is preferable because it improves compatibility with a compound in which fluorine is substituted.

The secondary amine is preferably an organic compound represented by General Formula (G1) below, for example.

[Chemical Formula 1]

(G1)

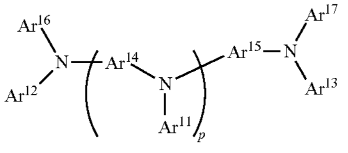

Note that in General Formula (G1) above, one or more of $Ar^{14}$ to $Ar^{13}$ represent hydrogen, $Ar^{14}$ to $Ar^{17}$ represent substituted or unsubstituted aromatic rings each having 6 to 14 carbon atoms, and $Ar^{14}$ to $Ar^{17}$ represent substituted or unsubstituted aromatic rings each having 6 to 14 carbon atoms. As the aromatic ring having 6 to 14 carbon atoms, a benzene ring, a bisbenzene ring, a naphthalene ring, a fluorene ring, a phenanthrene ring, an anthracene ring, or the like can be used. Note that $Ar^{12}$ and $Ar^{16}$ may be bonded to each other to form a ring, $Ar^{14}$ and $Ar^{16}$ may be bonded to each other to form a ring, $Ar^{11}$ and $Ar^{14}$ may be bonded to each other to form a ring, $Ar^{14}$ and $Ar^{15}$ may be bonded to each other to form a ring, $Ar^{15}$ and $Ar^{17}$ may be bonded to each other to form a ring, and $Ar^{13}$ and $Ar^{17}$ may be bonded to each other to form a ring. Furthermore, p represents an integer of 0 to 1000, and preferably represents 0 to 3. Note that the molecular weight of the organic compound represented by General Formula (G1) above is preferably less than or equal to 100000.

The tertiary amine is preferably an organic compound represented by General Formula (G2) below, for example.

[Chemical Formula 2]

(G2)

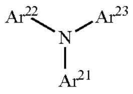

Note that in General Formula (G2) shown above, $Ar^{21}$ to $Ar^{23}$ represent a substituted or unsubstituted aryl groups each having 6 to 14 carbon atoms and may be bonded to each other to form rings. In the case where $Ar^{21}$ to $Ar^{23}$ each include a substituent, the substituent may be a group in which a plurality of diarylamino groups or carbazolyl groups are bonded. An ether bond, a sulfide bond, or a bond via an amine may be included; any of these bonds preferably exists between a plurality of aryl groups, in which case the solubility in an organic solvent is improved. Also when an alkyl group is included as a substituent, the alkyl group may be bonded through an ether bond, a sulfide bond, or a bond via an amine.

As specific examples of the secondary amine, organic compounds represented by Structural Formula (Am2-1) to Structural Formula (Am2-32) below are preferably used. The organic compounds represented by Structural Formula (Am2-1) to Structural Formula (Am2-32) each have an NH group.

[Chemical Formula 3]
(Am2-1)
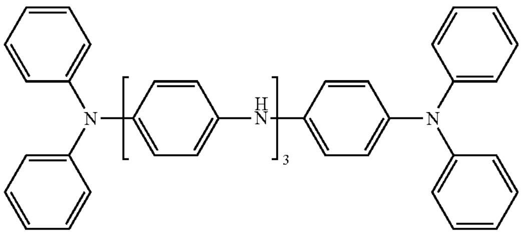
(Am2-2)
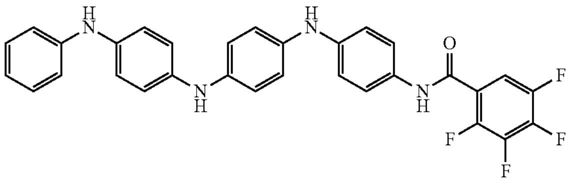
(Am2-3)
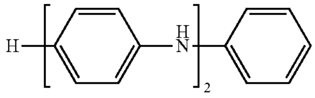
(Am2-4)
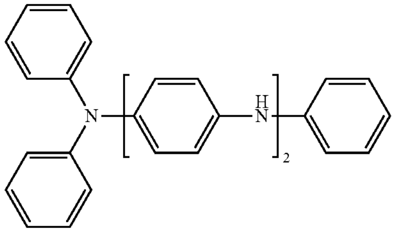
(Am2-5)
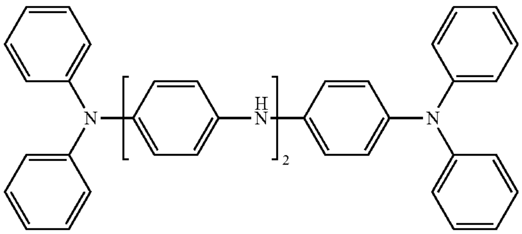
(Am2-6)
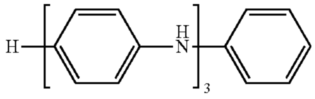
(Am2-7)
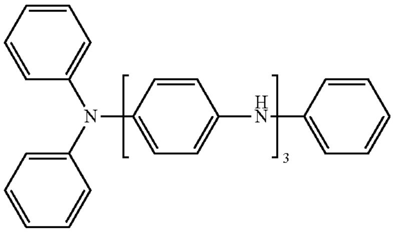
(Am2-8)
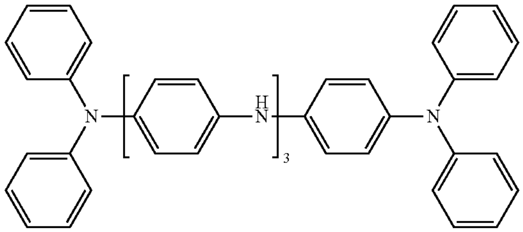
(Am2-9)
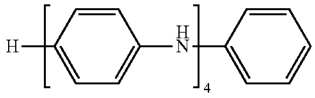
(Am2-10)
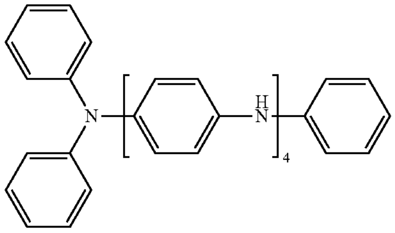
(Am2-11)
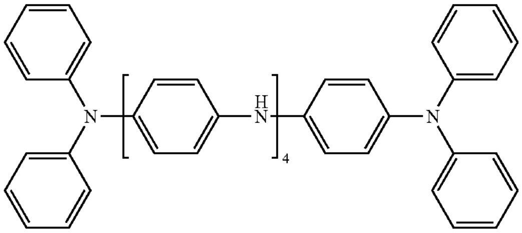

-continued
[Chemical Formula 4]
(Am2-12)
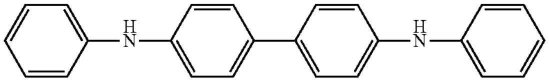
(Am2-13)
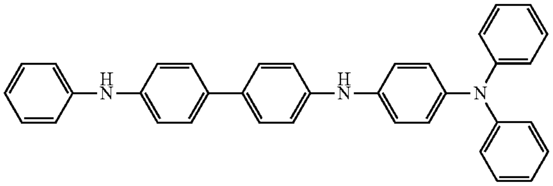
(Am2-14)
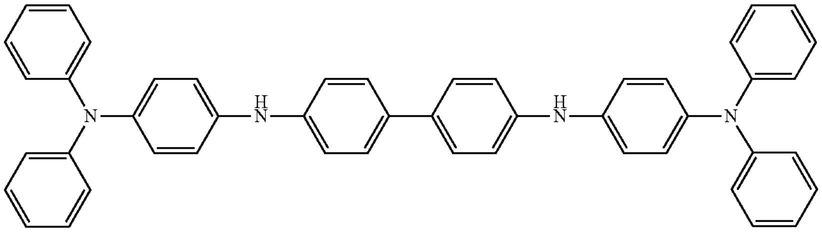
(Am2-15)
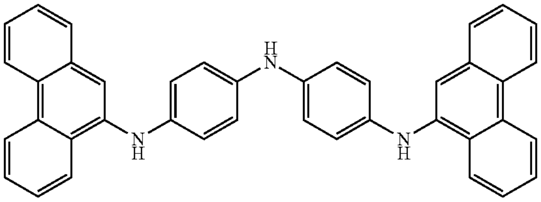
(Am2-16)
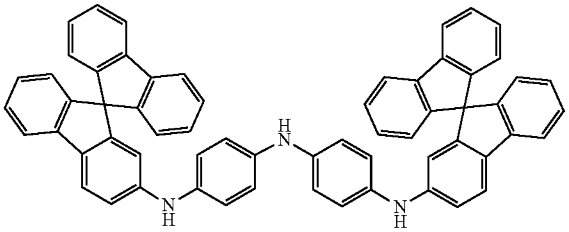
(Am2-17)
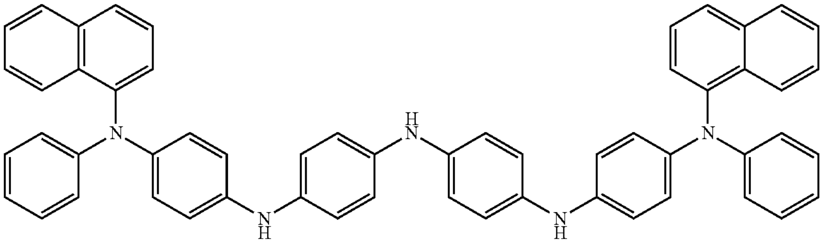
(Am2-18)
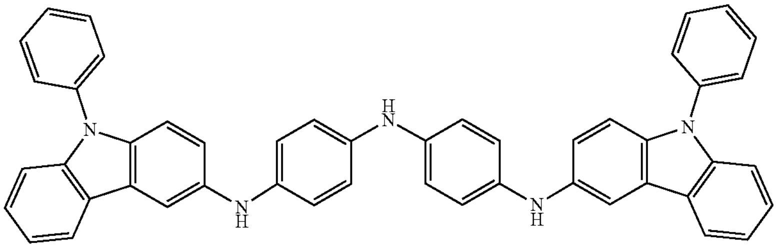
[Chemical Formula 5]
(Am2-19)
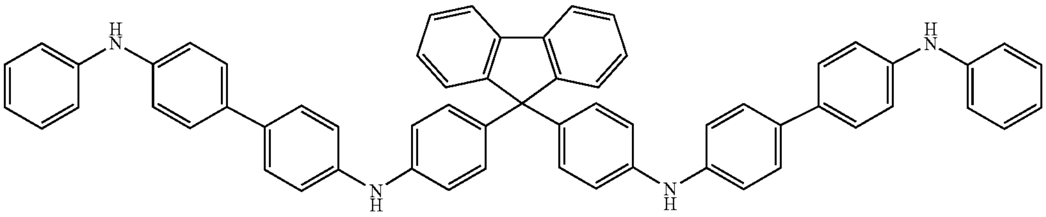

-continued
(Am2-20)
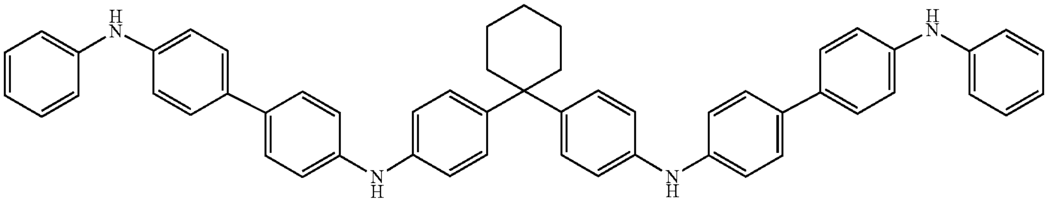
(Am2-21)
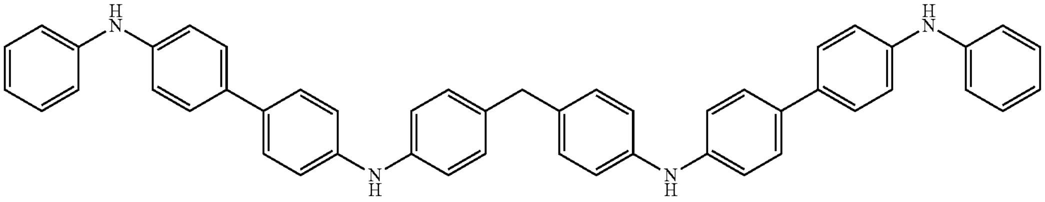
(Am2-22)
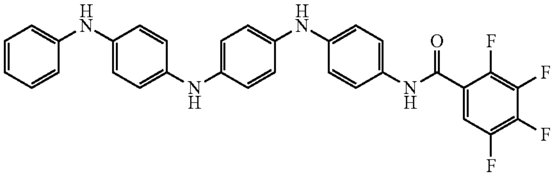
(Am2-23)
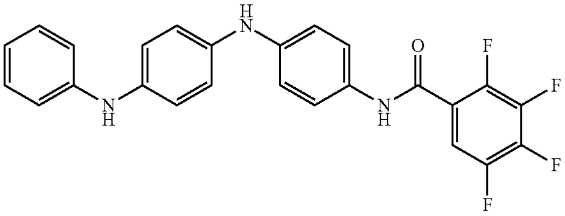
[Chemical Formula 6]
(Am2-24)
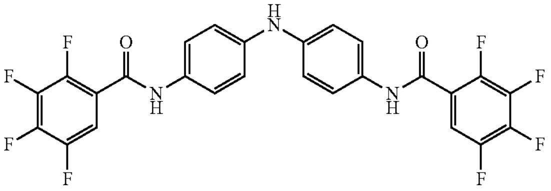
(Am2-25)
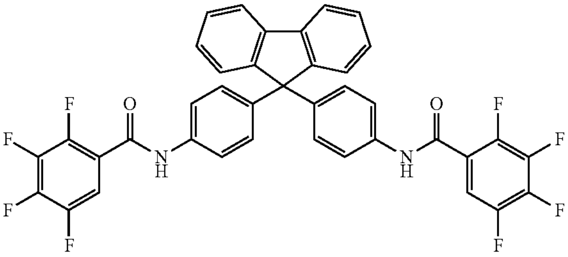
(Am2-26)
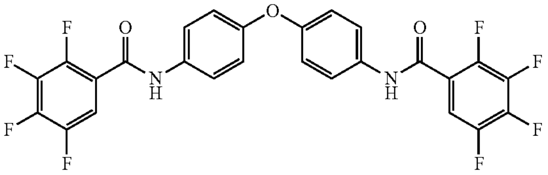
(Am2-27)
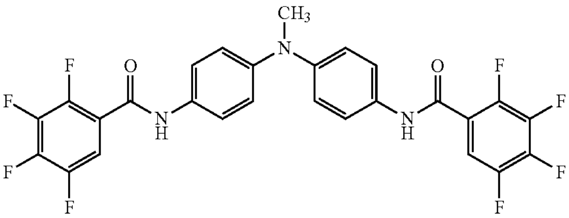
(Am2-28)
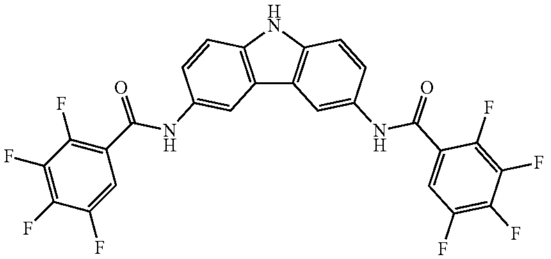
(Am2-29)
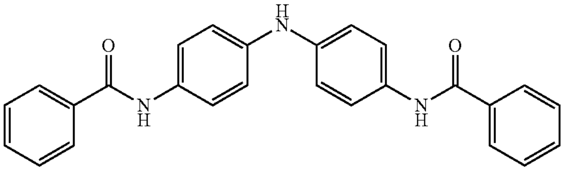

-continued

[Chemical Formula 7]

(Am2-30)

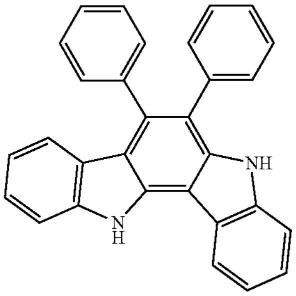

(Am2-31)

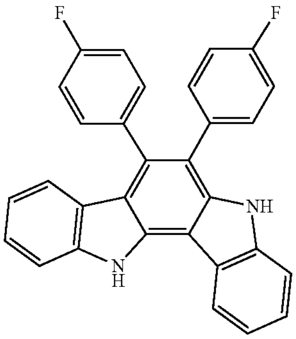

(Am2-32)

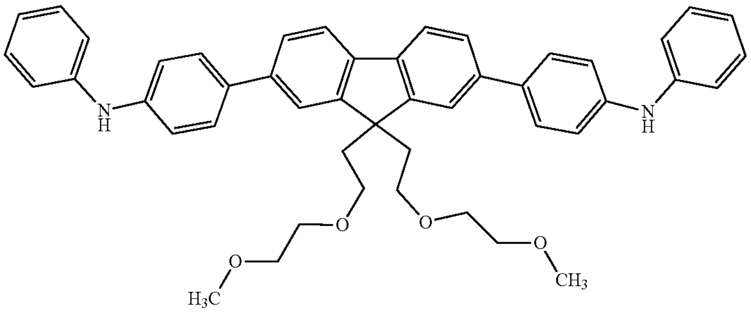

An amine compound can be used for the solution by being mixed with a sulfonic acid compound. Mixing with a sulfonic acid compound facilitates generation of carriers and improves conductivity. Mixing with a sulfonic acid compound is referred to as p doping in some cases. In the case of using the secondary amine as the amine compound, bondings with a mixed sulfonic acid compound can be formed by a dehydration reaction, or the like, which is preferable. In the case where the compound mixed with the amine compound is a fluoride, a fluoride is preferably used as in Structural Formula (Am2-1), Structural Formulae (Am2-22) to (Am2-28), or Structural Formula (Am2-31) shown above to improve compatibility.

Note that a thiophene derivative may be used instead of the secondary amine. Specific examples of a thiophene derivative, organic compounds represented by Structural Formula (T-1) to Structural Formula (T-4) shown below, polythiophene, or poly(3,4-ethylenedioxythiophene) (PEDOT) is preferable. A thiophene derivative facilitates generation of carriers and improves conductivity by being mixed with a sulfonic acid compound. Mixing with a sulfonic acid compound is referred to as p doping in some cases.

[Chemical Formula 8]

(T-1)

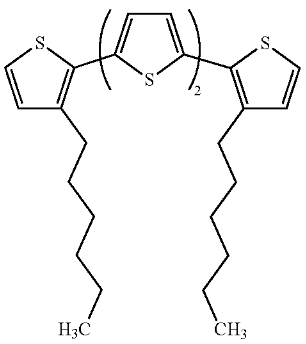

(T-2)

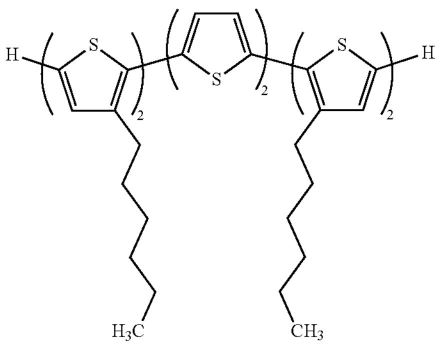

-continued (T-3)

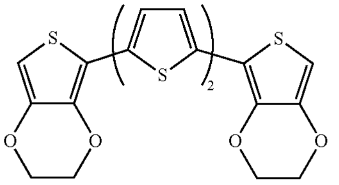

(T-4)

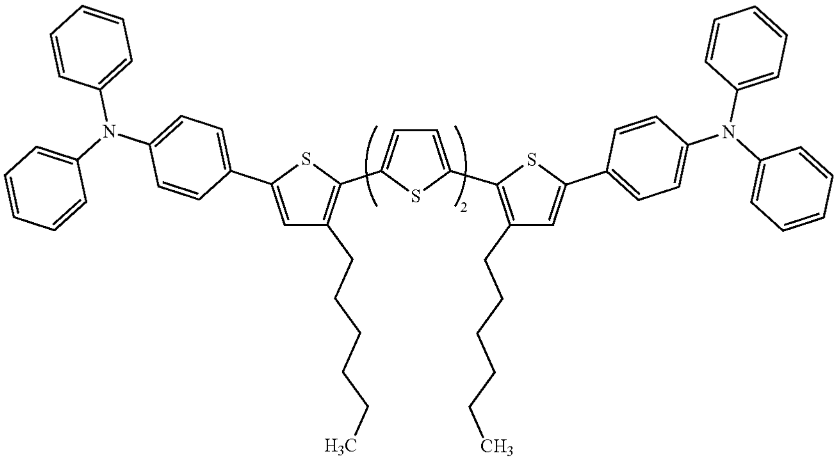

The sulfonic acid compound is a material exhibiting an acceptor property. As a sulfonic acid compound, an arylsulfonic acid can be given. It is only required that the arylsulfonic acid has a sulfo group; a sulfonic acid, a sulfonate, an alkoxysulfonic acid, a halogenated sulfonic acid, or a sulfonic acid anion can be used. Two or more of these sulfo groups may be included. As the aryl group of the arylsulfonic acid, a substituted or unsubstituted aryl group having 6 to 16 carbon atoms can be used. As the aryl group, for example, a phenyl group, a biphenyl group, a naphthyl group, a fluorenyl group, a phenanthrenyl group, an anthryl group, or a pyrenyl group can be used, and a naphthyl group is particularly preferable because it has favorable solubility in an organic solvent and a favorable transport property. The arylsulfonic acid may include two or more of the aryl groups. The arylsulfonic acid preferably includes an aryl group substituted by fluorine because the LUMO level can be adjusted to be deep (in the negative direction widely). The arylsulfonic acid may include an ether bond, a sulfide bond, or a bond via an amine; any of these bonds preferably exists between a plurality of aryl groups, in which case the solubility in an organic solvent is improved. Also when the arylsulfonic acid includes an alkyl group as a substituent, the alkyl group may be bonded through an ether bond, a sulfide bond, or a bond via an amine. The arylsulfonic acid may be substituted in a polymer. Polyethylene, nylon, polystyrene, or polyfluorenylene can be used as the polymer; polystyrene or polyfluorenylene is preferred because of its favorable conductivity.

Specific and preferred examples of compounds including the arylsulfonic acid (arylsulfonic acid compounds) include organic compounds represented by Structural Formula (5-1) to Structural Formula (5-15) below. A polymer having a sulfo group such as poly(4-styrenesulfonic acid) (PSS) can also be used. Electrons from an electron donor with a shallow HOMO (such as an amine compound, a carbazole compound, or a thiophene compound) can be accepted by using an arylsulfonic acid compound, and the property of hole injection or hole transport from an electrode can be obtained by mixing with an electron donor. When the arylsulfonic acid compound is a fluorine compound, the LUMO level can be adjusted to be deeper (the energy level can be higher in the negative direction).

[Chemical Formula 9]

(S-1)

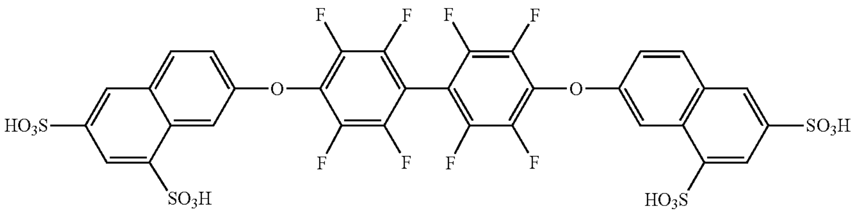

-continued
(S-2)
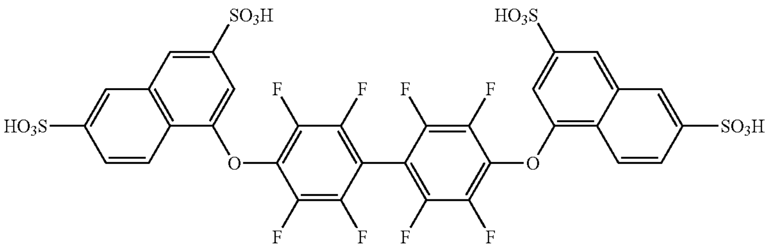
(S-3)
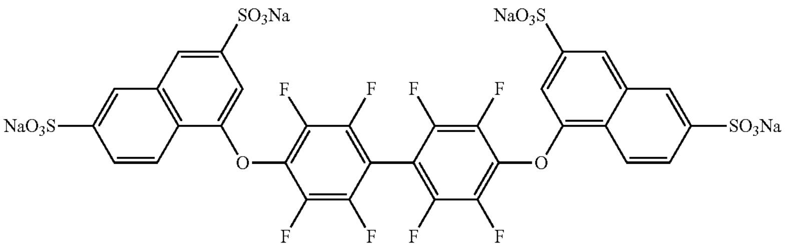
(S-4)
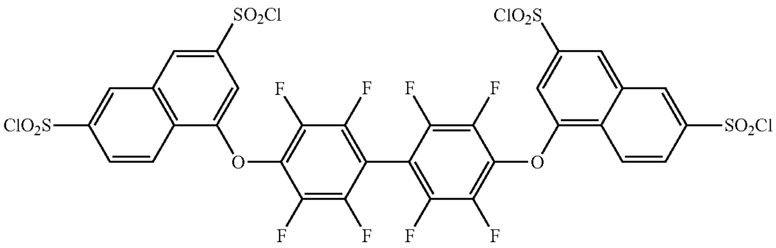
(S-5)
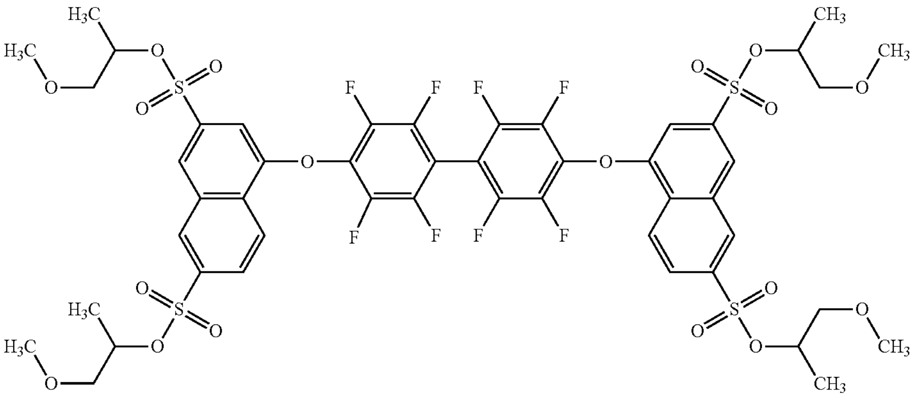
[Chemical Formula 10]
(S-6)
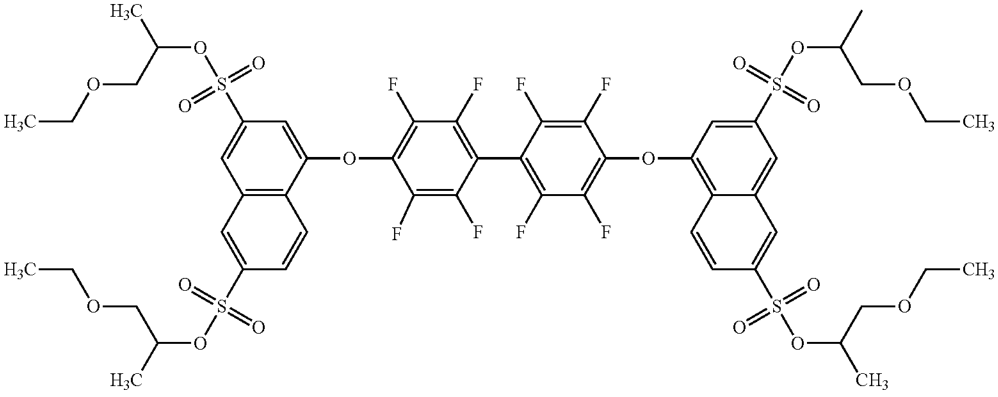

-continued
(S-7)
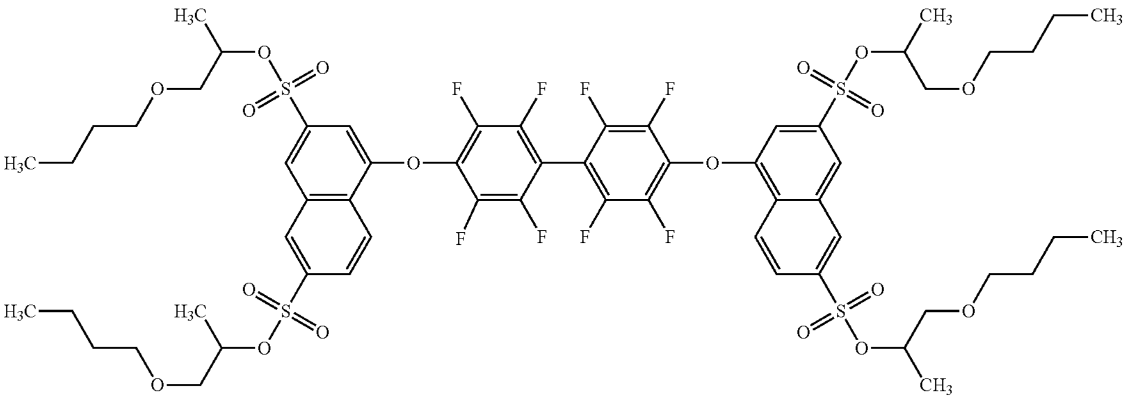
(S-8)
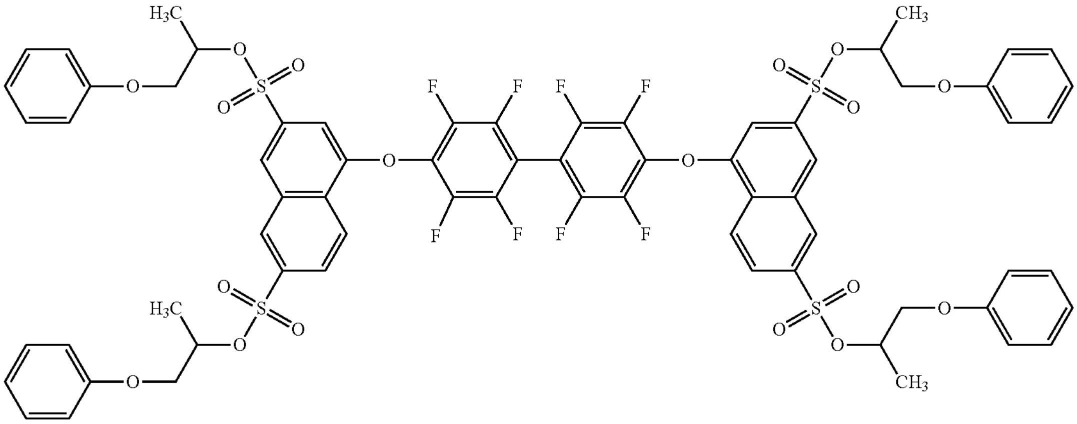
(S-9)
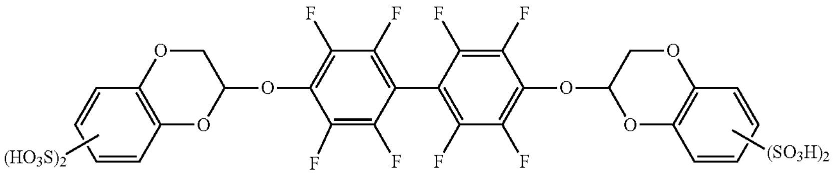
[Chemical Formula 11]
(S-10)
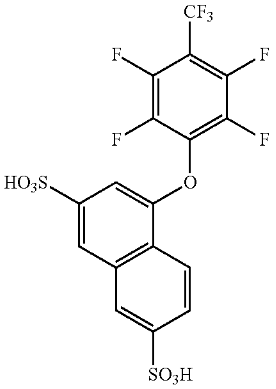
(S-11)
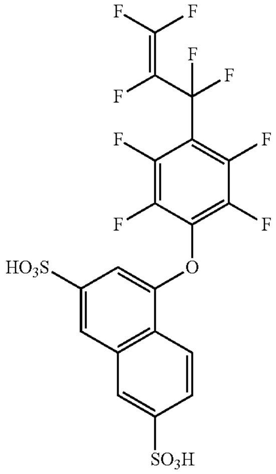

-continued (S-12)

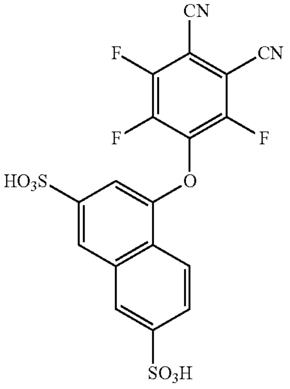

(S-13)

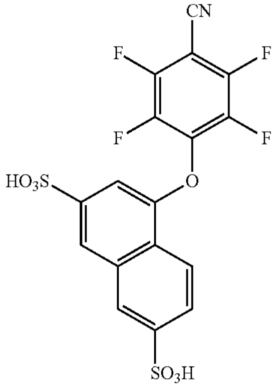

[Chemical Formula 12]

(S-14)

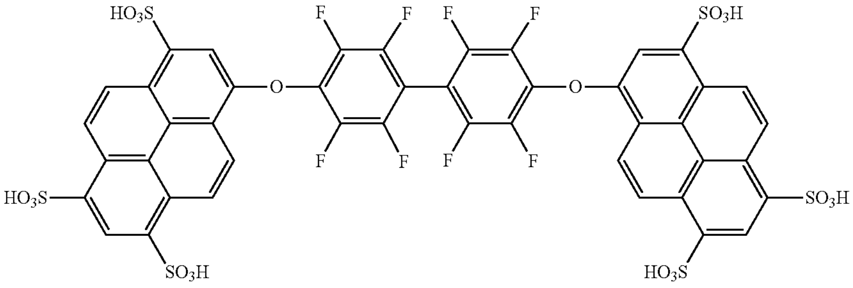

(S-15)

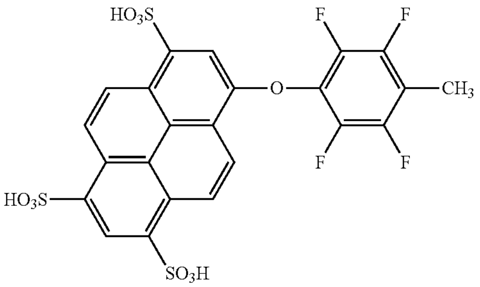

A tertiary amine may further be mixed into the solution in which a secondary amine and sulfonic acid are mixed. A tertiary amine is electrochemically and photochemically stable as compared to a secondary amine and thereby enables a favorable hole-transport property when mixed. As the tertiary amine, for example, organic compounds represented by Structural Formula (Am3-1) to Structural Formula (Am3-7) shown below are preferable. A material having a hole-transport property other than a tertiary amine may be mixed as appropriate into the solution.

[Chemical Formula 13]
(Am3-1)
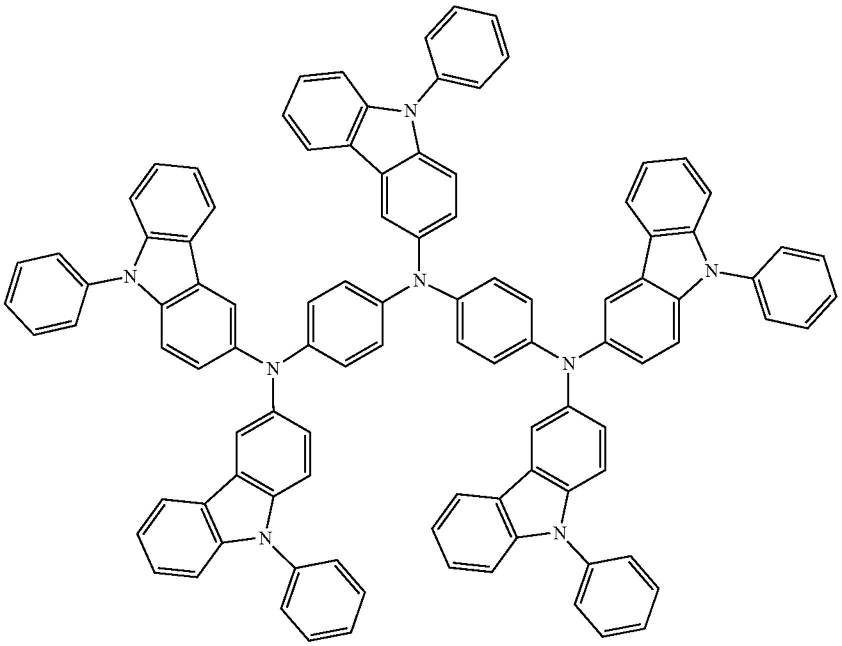
(Am3-2)
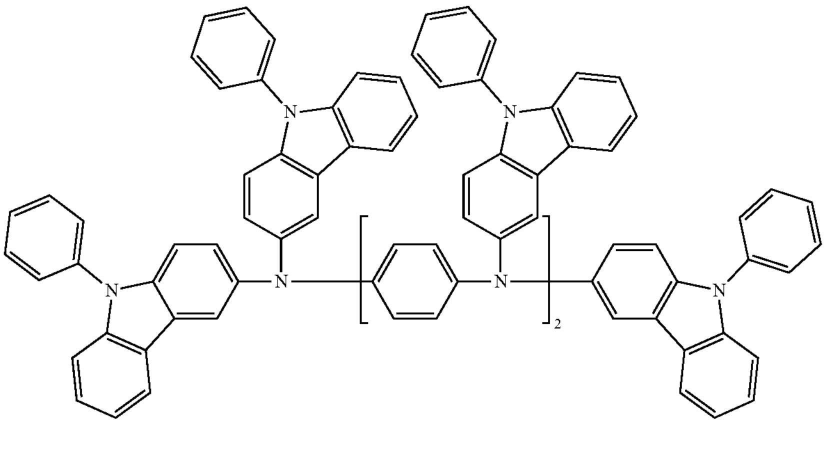

-continued
[Chemical Formula 14]
(Am3-3)
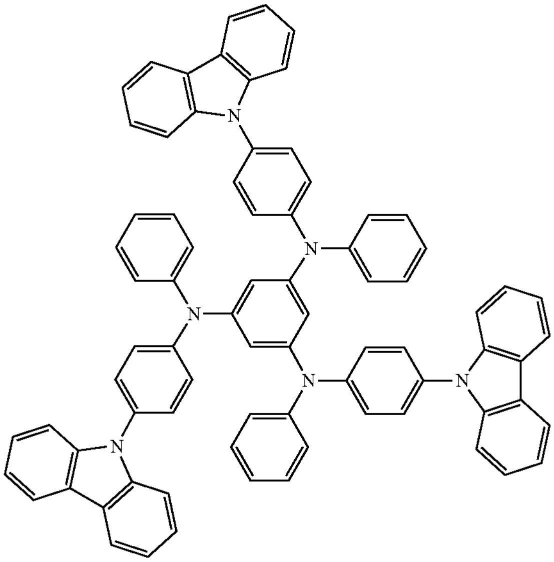
(Am3-4)
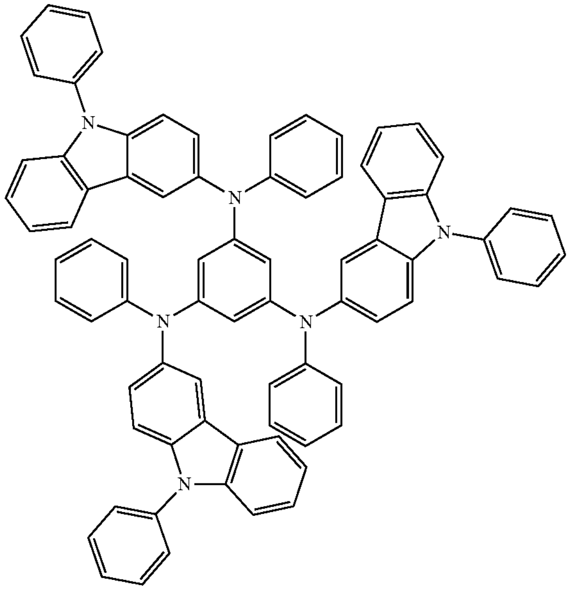
(Am3-5)
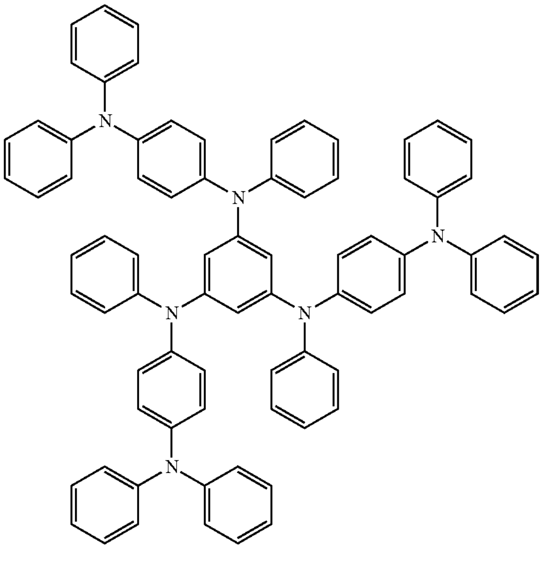
(Am3-6)
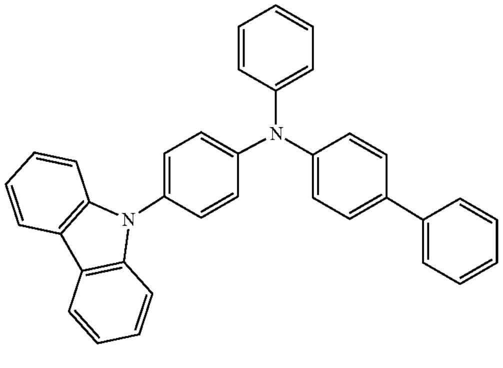

-continued (Am3-7)

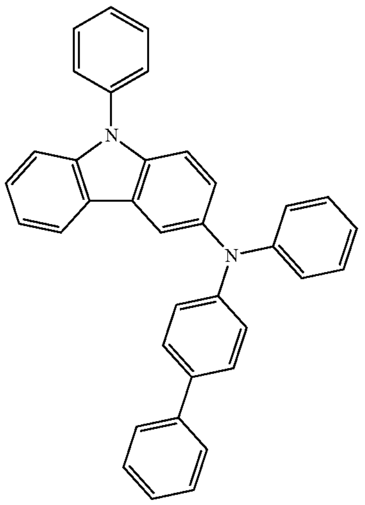

Other than the arylsulfonic acid compound, a cyano compound such as a tetracyanoquinodimethane compound can be used as an electron acceptor. Specifically, 2,3,5,6-tetrafluoro-7,7,8,8-tetracyano-quinodimethane (F4TCNQ), dipyrazino[2,3-f:2',3'-h]quinoxaline-2,3,6,7,10,11-hexacarbonitrile (HAT-CN6), or the like can be given. Note that a solution in which a monomer described above is mixed preferably includes one or both of a 3,3,3-trifluoropropyltrimethoxysilane compound and a phenyltrimethoxysilane compound because the wettability can be improved when deposited in a wet method.

When a layer deposited by a wet process with the solution including at least two monomers of an electron donor such as the secondary amine or thiophene and arylsulfonic acid is measured by ToF-SIMS, a signal is observed at around m/z=80 in a negative-mode result. The m/z=80 corresponds to a signal derived from an $SO_3$ anion in arylsulfonic acid. By contrast, a signal derived from an amine monomer is less likely to be observed from the above layer. Meanwhile, sufficient light emission by the light-emitting element including the layer gives evidence that the layer has a sufficient hole-transport property. If a light-emitting element capable of light emission shows the analysis results including the signal and the like described above, the layer is found to have a sufficient hole-transport property, and the absence of the observed skeletons having a hole-transport property such as an amine suggests that the monomers are bonded to each other to form a high molecular weight compound film. These analysis results mean that the layer is formed by a wet process.

A sulfonic acid compound represented by Structural Formula (S-1) or (S-2) shown above is preferable because the sulfonic acid compound has many sulfo groups and a three-dimensional bonding with an amine compound can be formed, so that film quality is likely to be stable. With the layer formed by using an arylsulfonic acid compound, a signal at m/z=901 can be observed in a negative mode in addition to the above signal of m/z=80. In addition, a signal at around m/z=328 can be observed as a product ion.

<Light-Emitting Material>

Note that in the light-emitting element of one embodiment of the present invention, it is preferable that the iridium complex represented by a structural formula shown below be used as a light-emitting material. The iridium complex shown below and having an alkyl group is preferable because it can easily be dissolved in an organic solvent and a solution is easily adjusted.

[Chemical Formula 15]

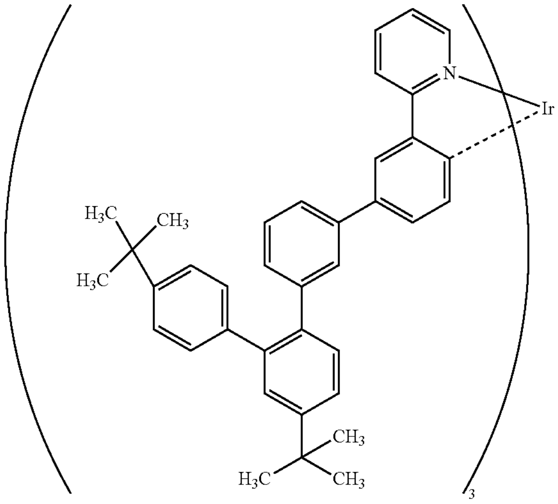

When the light-emitting layer containing the iridium complex represented by the above structural formula is measured by ToF-SIMS, it has been found that a signal appears at m/z=1676, or m/z=1181 and m/z=685 each of which corresponds to a product ion, in the result of a positive mode.

In the case of one intermediate layer as in FIG. 11D1, an organic compound layer containing an acceptor material and a donor material is used as the intermediate layer.

In the case of two intermediate layers as in FIG. 11D2, an organic compound layer containing an acceptor material and an organic compound layer containing a donor material are preferably included.

The organic compound layer containing an acceptor material is preferably formed using the composite material given as the material that can form the hole-injection layer or the hole-transport layer.

The acceptor material is a material that allows holes to be generated in another organic compound whose HOMO level value is close to the LUMO level value of the acceptor material when charge separation is caused between the acceptor material and the organic compound. For example, as the organic acceptor material, a compound having an electron-withdrawing group (a halogen group or a cyano group), such as a quinodimethane derivative, a chloranil derivative, or a hexaazatriphenylene derivative, can be used. For example, it is possible to use 7,7,8,8-tetracyano-2,3,5,6-tetrafluoroquinodimethane (abbreviation: F4-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylen-1,3,4,5,6,8,9,10-octafluoro-7H-pyren-2-ylidene)malononitrile. Note that among organic acceptor materials, a compound in which electron-withdrawing groups are bonded to fused aromatic rings each having a plurality of heteroatoms, such as HAT-CN, is particularly preferred because it has a high acceptor property and stable film quality against heat. In addition, a [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorob enzeneacetonitrile], α,α',α"-1,2,3-cyclopropanetriylidenetris[2,6-dichloro-3,5-difluoro-4-(trifluoromethyl) benzeneacetonitrile], and α,α',α"-1,2,3-cyclopropanetriylidenetris[2,3,4,5,6-pentafluorobenzeneacetonitrile].

As the donor material, a substance with a high electron-injection property such as an alkali metal, an alkaline earth metal, a rare earth metal, or a compound thereof can be used. As the above compound, an oxide such as lithium oxide or a halide is given as an alkali metal compound, and the alkali metal compound further includes a carbonate such as lithium carbonate or cesium carbonate. Furthermore, as the above compound, an oxide, a halide, or a carbonate is included in an alkaline earth metal compound, and an oxide, a halide, or a carbonate is included in a rare earth metal compound.

The organic compound layer containing the donor material can be formed using a material similar to that forming the electron-transport layer or the electron-injection layer.

At least part of this embodiment can be implemented in combination with the other embodiments described in this specification and the like as appropriate.

Embodiment 3

In this embodiment, a structure example and a driving method example of a pixel circuit that can be used for the display device of one embodiment of the present invention are described.

Structure Example of Pixel Circuit

Figure 12A:
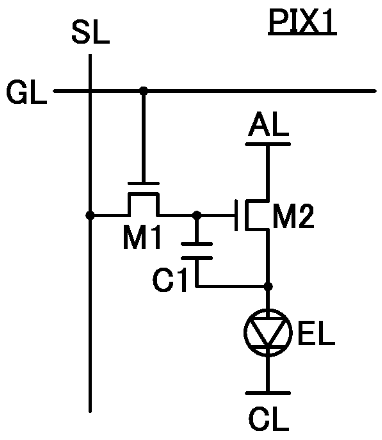
FIG. 12A to FIG. 12D are circuit diagrams illustrating pixel circuits of one embodiment of the present invention.

A pixel circuit PIX1 illustrated in FIG. 12A includes a transistor M1, a transistor M2, a capacitor C1, and a light-emitting element EL. A wiring SL, a wiring GL, a wiring AL, and a wiring CL are electrically connected to the pixel circuit PIX1.

In the transistor M1, a gate is electrically connected to the wiring GL, one of a source and a drain is electrically connected to the wiring SL, and the other thereof is electrically connected to a gate of the transistor M2 and one electrode of the capacitor C1. One of a source and a drain of the transistor M2 is electrically connected to the wiring AL and the other of the source and the drain of the transistor M2 is electrically connected to an anode of the light-emitting element EL. The other electrode of the capacitor C1 is electrically connected to the anode of the light-emitting element EL. A cathode of the light-emitting element EL is electrically connected to a wiring CL.

The transistor M1 can be referred to as a selection transistor and functions as a switch for controlling selection/non-selection of the pixel. The transistor M2 can be referred to as a driver transistor and has a function of controlling current flowing to the light-emitting element EL. The capacitor C1 functions as a storage capacitor and has a function of retaining a gate potential of the transistor M2. A capacitor such as a MIM capacitor may be used as the capacitor C1; alternatively, capacitance between wirings, a gate capacitance of the transistor, or the like may be used as the capacitor C1.

The wiring SL is supplied with a source signal. The wiring SL can be formed using the same conductive layer as a conductive layer functioning as the source or the drain of the transistor. The wiring GL is supplied with a gate signal. The wiring GL can be formed using the same conductive layer as the conductive layer functioning as the gate of the transistor. The wiring AL and the wiring CL are each supplied with a constant potential.

The anode side of the light-emitting element EL can have a high potential, and the cathode side can have a lower potential than the anode side; and the anode and the cathode can correspond to an anode and a cathode, respectively.

Figure 12B:
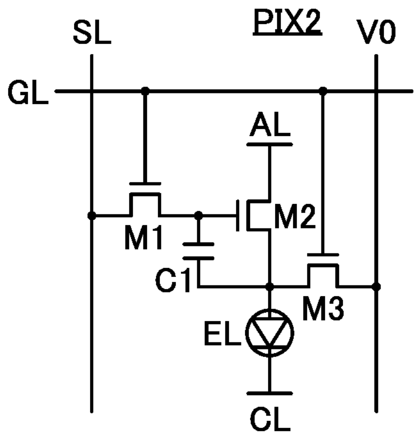

A pixel circuit PIX2 illustrated in FIG. 12B has a structure in which a transistor M3 is added to the pixel circuit PIX1. In addition, a wiring V0 is electrically connected to the pixel circuit PIX2.

A gate of the transistor M3 is electrically connected to the wiring GL, one of a source and a drain of the transistor M3 is electrically connected to the anode of the light-emitting element EL, and the other of the source and the drain of the transistor M3 is electrically connected to the wiring V0.

The wiring V0 is supplied with a constant potential when data is written to the pixel circuit PIX2. Thus, a variation in the gate-source voltage of the transistor M3 can be inhibited.

Figure 12C:
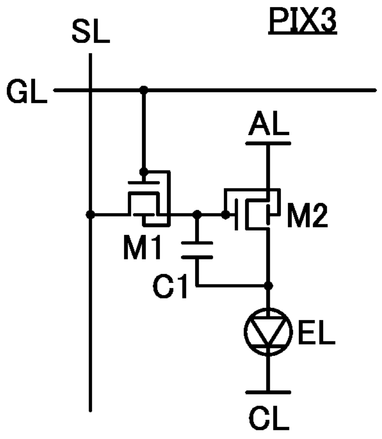
Figure 12D:
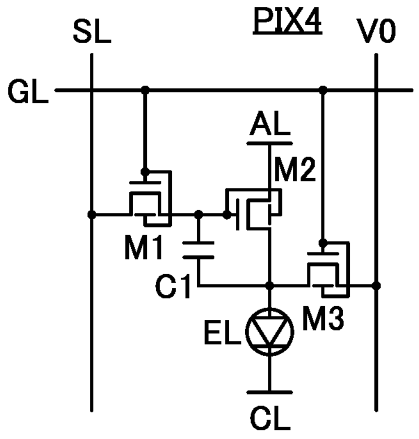

A pixel circuit PIX3 illustrated in FIG. 12C is an example of the case where a transistor in which a pair of gates are electrically connected to each other is used as each of the transistor M1 and the transistor M2 of the pixel circuit PIX1. A pixel circuit PIX4 illustrated in FIG. 12D is an example in the case where a transistor in which a pair of gates are electrically connected to each other is used in the pixel circuit PIX2. Thus, the current that can flow through the transistor can be increased. Note that although a transistor in which a pair of gates are electrically connected to each other is used in all the transistors here, one embodiment of the present invention is not limited thereto. A transistor that includes a pair of gates electrically connected to different wirings may be used. When, for example, a transistor in which one of the gates is electrically connected to the source is used, the reliability can be increased.

Figure 13A:
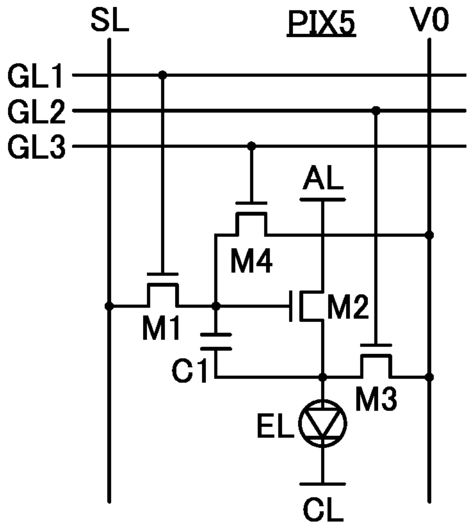
FIG. 13A to FIG. 13D are circuit diagrams illustrating pixel circuits of one embodiment of the present invention.

A pixel circuit PIX5 illustrated in FIG. 13A has a structure in which a transistor M4 is added to the pixel circuit PIX2. Three wirings (a wiring GL1, a wiring GL2, and a wiring GL3) functioning as gate lines are electrically connected to the pixel circuit PIX5.

A gate of the transistor M4 is electrically connected to the wiring GL3, one of a source and a drain of the transistor M4 is electrically connected to the gate of the transistor M2, and the other of the source and the drain of the transistor M4 is electrically connected to the wiring V0. The gate of the transistor M1 is electrically connected to the wiring GL1, and the gate of the transistor M3 is electrically connected to the wiring GL2. The wiring V0 is placed to intersect with the wiring AL in some cases.

When the transistor M3 and the transistor M4 are turned on at the same time, the source and the gate of the transistor M2 have the same potential, so that the transistor M2 can be turned off. Thus, current flowing to the light-emitting element EL can be blocked forcibly. Such a pixel circuit is suitable for the case of using a display method in which a display period and a non-lighting period are alternately provided.

Figure 13B:
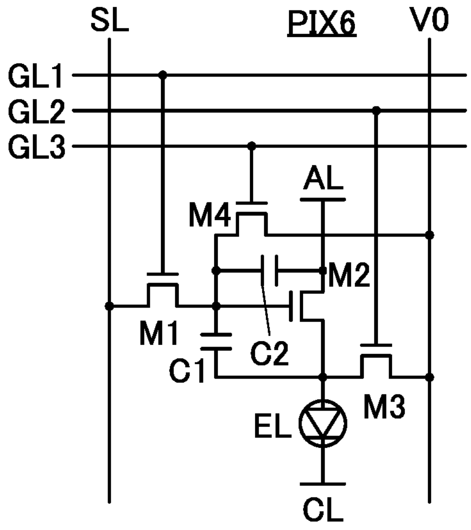

A pixel circuit PIX6 illustrated in FIG. 13B is an example in the case where a capacitor C2 is added to the pixel circuit PIX5. The capacitor C2 functions as a storage capacitor.

Figure 13C:
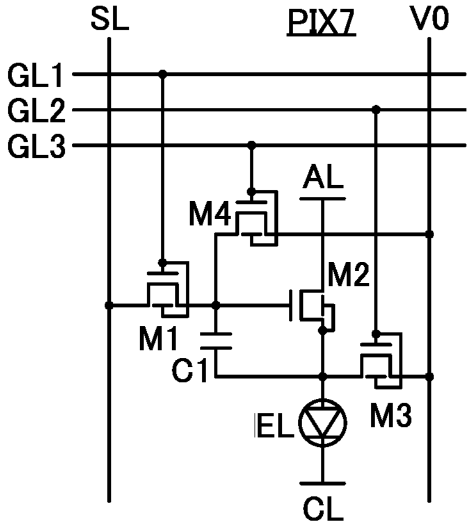
Figure 13D:
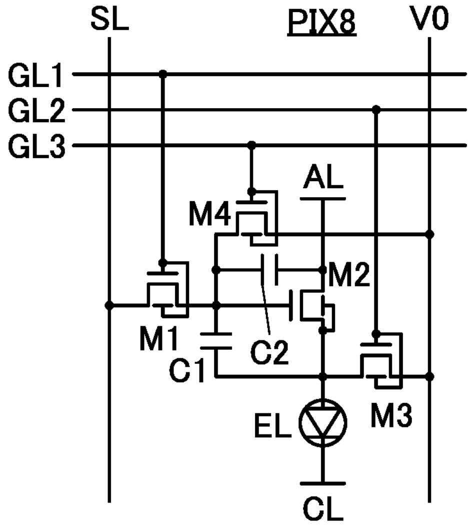

A pixel circuit PIX7 illustrated in FIG. 13C and a pixel circuit PIX8 illustrated in FIG. 13D are each an example in the case where a transistor including a pair of gates is used in the pixel circuit PIX5 or the pixel circuit PIX6. A transistor in which a pair of gates are electrically connected to each other is used as each of the transistor M1, the transistor M3, and the transistor M4, and a transistor in which one of gates is electrically connected to a source is used as the transistor M2.

Driving Method Example

An example of a method for driving a display device in which the pixel circuit PIX5 is used will be described below. Note that a similar driving method can be applied to the pixel circuits PIX6, PIX7, and PIX8.

Figure 14:
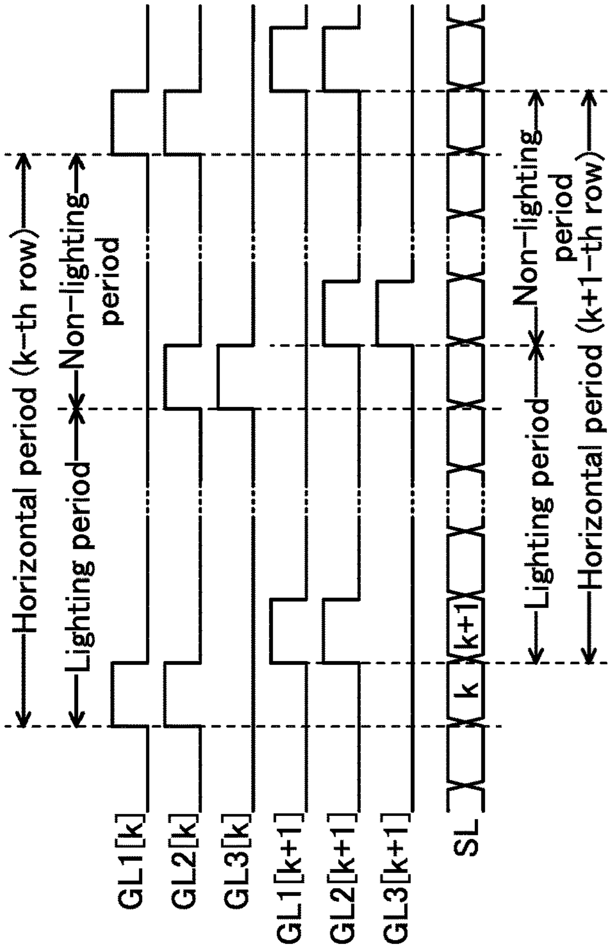
FIG. 14 is a diagram showing a method for driving a pixel circuit of one embodiment of the present invention.

FIG. 14 shows a timing chart of a method for driving the display device in which the pixel circuit PIX5 is used. Changes in the potentials of a wiring GL1[k], a wiring GL2[k], and a wiring GL3[k] that are gate lines of the k-th row and changes in the potentials of a wiring GL1[k+1], a wiring GL2[k+1], and a wiring GL3[k+1] that are gate lines of the k+1-th row are shown here. FIG. 14 also shows the timing of supplying a signal to the wiring SL functioning as a source line.

In the example of the driving method described here, one horizontal period is divided into a lighting period and a non-lighting period. A horizontal period of the k-th row is shifted from a horizontal period of the k+1-th row by a selection period of the gate line.

In the lighting period of the k-th row, first, the wiring GL1[k] and the wiring GL2[k] are supplied with a high-level potential and the wiring SL is supplied with a source signal. Thus, the transistor M1 and the transistor M3 are turned on, so that a potential corresponding to the source signal is written from the wiring SL to the gate of the transistor M2. After that, the wiring GL1[k] and the wiring GL2[k] are supplied with a low-level potential, so that the transistor M1 and the transistor M3 are turned off and the gate potential of the transistor M2 is retained.

Subsequently, in a lighting period of the k+1-th row, data is written by operation similar to that described above.

Next, the non-lighting period is described. In the non-lighting period of the k-th row, the wiring GL2[k] and the wiring GL3[k] are supplied with a high-level potential. Accordingly, the transistor M3 and the transistor M4 are turned on, and the source and the gate of the transistor M2 are supplied with the same potential, so that almost no current flows through the transistor M2. Therefore, the light-emitting element EL is turned off. As a result, all the pixels that are positioned in the k-th row are turned off. The pixels of the k-th row remain in the off state until the next lighting period.

Subsequently, in a non-lighting period of the k+1-th row, all the pixels of the k+1-th row are turned off in a manner similar to that described above.

Such a driving method described above, in which the pixels are not constantly on through one horizontal period and a non-lighting period is provided in one horizontal period, can be called duty driving. With duty driving, an afterimage phenomenon can be inhibited at the time of displaying moving images; therefore, a display device with high performance in displaying moving images can be achieved. Particularly in a VR device and the like, a reduction in an afterimage can reduce what is called VR sickness.

In the duty driving, the proportion of the lighting period in one horizontal period can be called a duty ratio. For example, a duty ratio of 50% means that the lighting period and the non-lighting period have the same lengths. Note that the duty ratio can be set freely and can be adjusted appropriately within a range higher than 0% and lower than or equal to 100%, for example.

The above is the description of the driving method example.

The description in this embodiment can be used in combination with the other embodiments.

Embodiment 4

In this embodiment, structure examples of display devices of one embodiment of the present invention will be described.

The display device in this embodiment can be a high-definition display device or a large-sized display device. Accordingly, the display device in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A]

Figure 15:
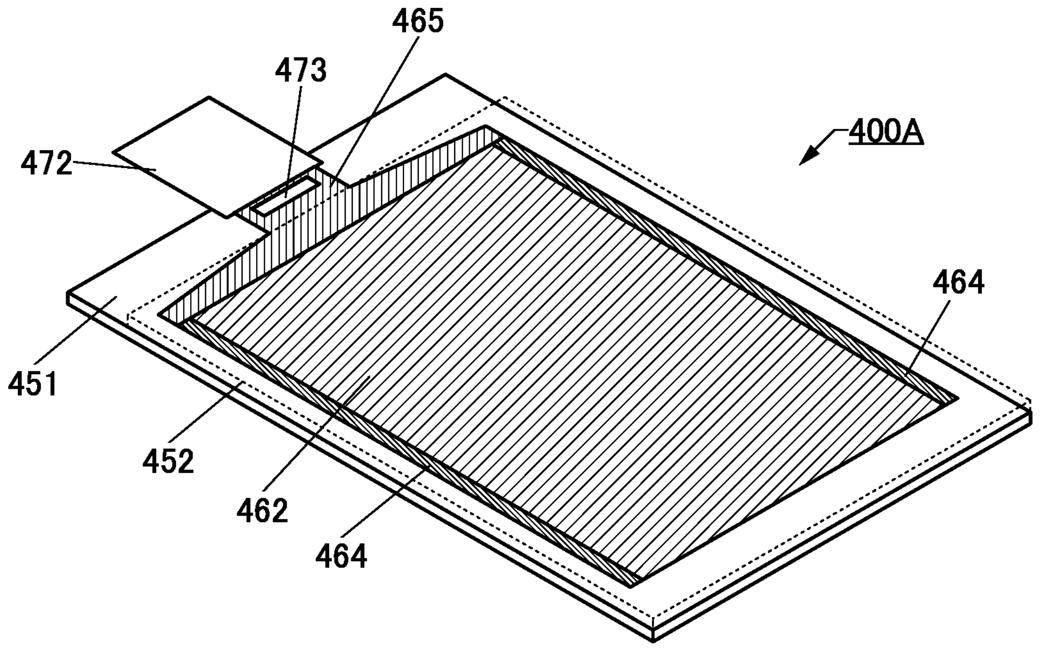
FIG. 15 is a perspective view illustrating an example of a display device.
Figures 16A, 16B:
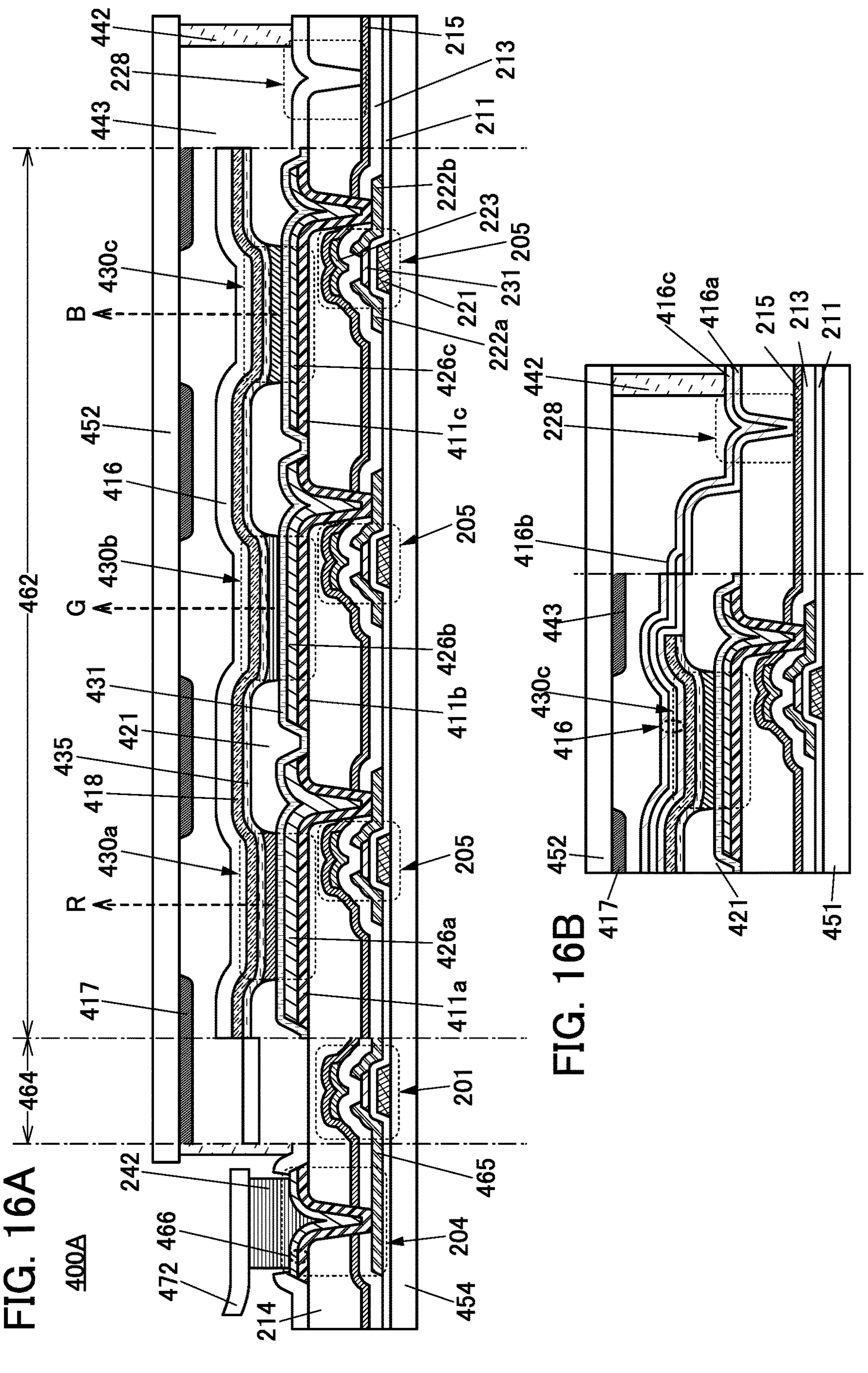
FIG. 16A and FIG. 16B are cross-sectional views illustrating an example of a display device.

FIG. 15 is a perspective view of a display device 400A, and FIG. 16A is a cross-sectional view of the display device 400A.

The display device 400A has a structure in which a substrate 452 and a substrate 451 are bonded to each other. In FIG. 15, the substrate 452 is denoted by a dashed line.

The display device 400A includes a display portion 462, a circuit 464, a wiring 465, and the like. FIG. 15 illustrates an example in which an IC 473 and an FPC 472 are mounted on the display device 400A. Thus, the structure illustrated in FIG. 15 can be regarded as a display module including the display device 400A, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or input to the wiring 465 from the IC 473.

FIG. 15 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 16A illustrates an example of cross sections of part of a region including the FPC 472, part of the circuit 464, part of the display portion 462, and part of a region including an end portion of the display device 400A.

The display device 400A illustrated in FIG. 16A includes a transistor 201, a transistor 205, a light-emitting element 430*a* that emits red light, a light-emitting element 430*b* that emits green light, a light-emitting element 430*c* that emits blue light, and the like between the substrate 451 and the substrate 452.

The light-emitting element described in Embodiments 1 to 3 can be used as the light-emitting element 430*a*, the light-emitting element 430*b*, and the light-emitting element 430*c*.

Here, in the case where a pixel of the display device includes three kinds of subpixels including light-emitting elements emitting different colors from each other, the three subpixels can be a combination of R, G, and B, a combination of yellow (Y), cyan (C), and magenta (M), or the like. When a pixel of the display device includes four subpixels, the four subpixels can be a combination of R, G, B, and white (W) or a combination of R, G, B, and Y, for example. A pixel can include three or more subpixels as a minimum unit for enabling full-color display.

A protective layer 416 and the substrate 452 are bonded to each other with an adhesive layer 442. A solid sealing structure, a hollow sealing structure, or the like can be employed to seal the light-emitting elements. In FIG. 16A, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting element. The space 443 surrounded by the substrate 452, the adhesive layer 442, and the substrate 451 may be filled with a resin different from that of the adhesive layer 442.

The light-emitting elements 430*a*, 430*b*, and 430*c* each include an optical adjustment layer between a pixel electrode and the hole-injection layer 431. The light-emitting element 430*a* includes an optical adjustment layer 426*a*, the light-emitting element 430*b* includes an optical adjustment layer 426*b*, and the light-emitting element 430*c* includes an optical adjustment layer 426*c*. Refer to Embodiments 1 to 3 for the details of the light-emitting elements.

Pixel electrodes 411*a*, 411*b*, and 411*c* are each connected to a conductive layer 222*b* included in the transistor 205 through an opening provided in an insulating layer 214.

End portions of the pixel electrode and the optical adjustment layer are covered with an insulating layer 421 with the hole-injection layer 431 therebetween. The hole-injection layer 431 may be provided over the whole display portion 462 and may be divided according to the subpixel region. A layer 435 including an electron-transport layer and an electron-injection layer is provided over a light-emitting layer provided in an opening portion of the insulating layer 421 and the insulating layer 421, and a counter electrode 418 is provided over the layer 435. The pixel electrode contains a material that reflects visible light, and the counter electrode 418 contains a material that transmits visible light.

Light from the light-emitting element is emitted toward the substrate 452 side. For the substrate 452, a material having a high visible-light-transmitting property is preferably used.

Note that the insulating layer 421 may have a stacked-layer structure of an inorganic insulating film and an organic insulating film. In the case where the insulating layer 421 has the stacked-layer structure of an inorganic insulating film and an organic insulating film, an inorganic insulating film is preferably a lower layer. In the display device of one embodiment of the present invention, since the insulating layer 421 is provided over the hole-injection layer 431, the inorganic insulating film is provided on the hole-injection layer 431 side; whereby adverse effects on the hole-injection layer 431, which might occur in the case of using an organic solvent for the formation of an organic insulating film, can be inhibited.

The transistor 201 and the transistor 205 are formed over the substrate 451. These transistors can be fabricated using the same material in the same step.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of the end portion of the display device 400A. This can inhibit entry of impurities from the end portion of the display device 400A through the organic insulating film. Alternatively, the organic insulating film may be formed such that its end portion is positioned inward from the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 16A, an opening is formed in the insulating layer 214. This can inhibit entry of impurities into the display portion 462 from the outside through the insulating layer 214 even when an organic insulating film is used as the insulating layer 214. Consequently, the reliability of the display device 400A can be increased.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device in this embodiment. For example, a planar transistor, a staggered transistor, or an inverted staggered transistor can be used. A top-gate or bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display device in this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

Providing the protective layer 416 covering the light-emitting elements inhibits entry of impurities such as water into the light-emitting elements; as a result, the reliability of the light-emitting elements can be increased.

In the region 228 in the vicinity of the end portion of the display device 400A, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. This can inhibit entry of impurities into the display portion 462 from the outside through the organic insulating film. Consequently, the reliability of the display device 400A can be increased.

FIG. 16B illustrates an example in which the protective layer 416 has a three-layer structure. In FIG. 16B, the protective layer 416 includes an inorganic insulating layer 416*a* over the light-emitting element 430*c*, an organic insulating layer 416*b* over the inorganic insulating layer 416*a*, and an inorganic insulating layer 416*c* over the organic insulating layer 416*b*.

An end portion of the inorganic insulating layer 416*a* and an end portion of the inorganic insulating layer 416*c* extend beyond an end portion of the organic insulating layer 416*b* and are in contact with each other. The inorganic insulating layer 416*a* is in contact with the insulating layer 215 (inorganic insulating layer) through the opening in the insulating layer 214 (organic insulating layer). Accordingly, the light-emitting element can be surrounded by the insulating layer 215 and the protective layer 416, whereby the reliability of the light-emitting element can be increased.

As described above, the protective layer 416 may have a stacked-layer structure of an organic insulating film and an inorganic insulating film. In that case, an end portion of the inorganic insulating film preferably extend beyond an end portion of the organic insulating film.

For each of the substrate 451 and the substrate 452, glass, quartz, ceramics, sapphire, a resin, a metal, an alloy, a semiconductor, or the like can be used. The substrate on the side from which light from the light-emitting element is extracted is formed using a material that transmits the light. When the substrate 451 and the substrate 452 are formed using a flexible material, the flexibility of the display device can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, an indium tin oxide, an indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of an indium tin oxide and an alloy of silver and magnesium is preferably used because conductivity can be increased. They can also be used for conductive layers such as a variety of wirings and electrodes included in the display device, and conductive layers (e.g., conductive layers functioning as the pixel electrode and the common electrode) included in the light-emitting element.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

[Display Device 400B]

Figure 17:
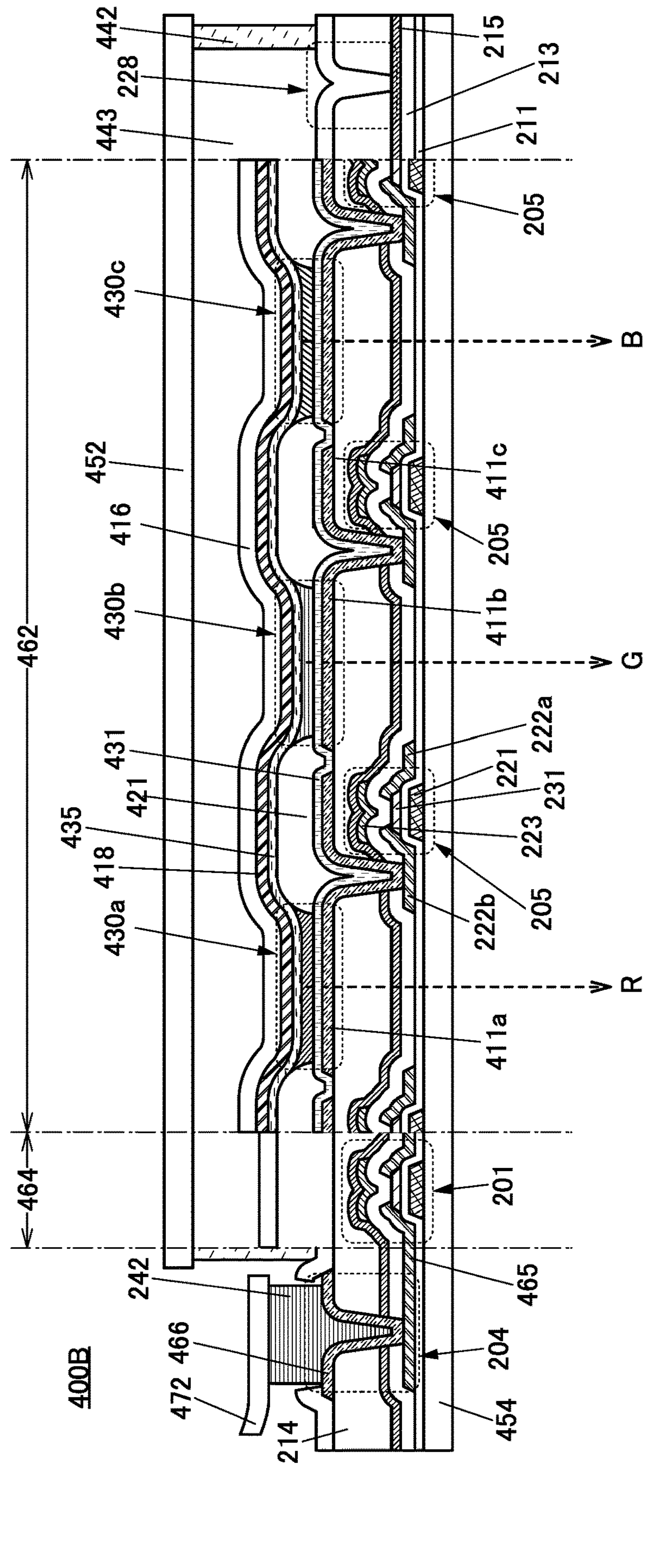
FIG. 17 is a cross-sectional view illustrating an example of a display device.

FIG. 17 is a cross-sectional view of a display device 400B. A perspective view of the display device 400B is similar to that of the display device 400A (FIG. 15). FIG. 17 illustrates an example of cross sections of part of a region including the FPC 472, part of the circuit 464, and part of the display portion 462 in the display device 400B. Note that portions similar to those in the display device 400A are not described in some cases.

The display device 400B has a structure where the substrate 452 and the substrate 451 are bonded to each other.

The display device 400B includes the display portion 462, the circuit 464, the wiring 465, and the like. Thus, the display device 400B illustrated in FIG. 17 can be regarded as a display module including the display device 400B, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or input to the wiring 465 from the IC 473.

In the illustrated example of the display module, the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400B and the display module are not necessarily provided with an IC. The IC may be mounted on the FPC by a COF method or the like.

FIG. 17 illustrates an example of cross sections of the part of a region including the FPC 472, the part of the circuit 464, the part of the display portion 462, and part of a region including an end portion of the display device 400B.

The display device 400B illustrated in FIG. 17 includes the transistor 201, the transistor 205, the light-emitting element 430*a* that emits red light, the light-emitting element 430*b* that emits green light, the light-emitting element 430*c* that emits blue light, and the like between the substrate 451 and the substrate 452.

The light-emitting element described in Embodiments 1 to 3 can be used as the light-emitting element 430*a*, the light-emitting element 430*b*, and the light-emitting element 430*c*.

In the case where a pixel of the display device includes three kinds of subpixels including light-emitting elements emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

A protective layer 416 and the substrate 452 are bonded to each other with an adhesive layer 442. A solid sealing structure, a hollow sealing structure, or the like can be employed to seal the light-emitting elements. In FIG. 17, a hollow sealing structure is employed in which the space 443 surrounded by the substrate 452, the adhesive layer 442, and the substrate 451 is filled with an inert gas (e.g., nitrogen or argon). The adhesive layer 442 may be provided to overlap with the light-emitting element. The space 443 surrounded by the substrate 452, the adhesive layer 442, and the substrate 451 may be filled with a resin different from that of the adhesive layer 442.

The light-emitting elements 430*a*, 430*b*, and 430*c* each include an optical adjustment layer between a pixel electrode and the hole-injection layer 431. The light-emitting element 430*a* includes the optical adjustment layer 426*a*, the light-emitting element 430*b* includes the optical adjustment layer 426*b*, and the light-emitting element 430*c* includes the optical adjustment layer 426*c*. Refer to Embodiments 1 to 3 for the details of the light-emitting elements.

The pixel electrodes 411*a*, 411*b*, and 411*c* are each connected to the conductive layer 222*b* included in the transistor 205 through an opening provided in the insulating layer 214.

End portions of the pixel electrode and the optical adjustment layer are covered with the insulating layer 421 with the hole-injection layer 431 therebetween. The hole-injection layer 431 may be provided over the whole display portion 462 and may be divided according to the subpixel region. The layer 435 including an electron-transport layer and an electron-injection layer is provided over a light-emitting layer provided in an opening portion of the insulating layer 421 and the insulating layer 421, and the counter electrode 418 is provided over the layer 435. The pixel electrode contains a material that reflects visible light, and the counter electrode 418 contains a material that transmits visible light.

Light emitted from the light-emitting element is emitted toward the substrate 454 side. For the substrate 454, a material having a high visible-light-transmitting property is preferably used.

Note that the insulating layer 421 may have a stacked-layer structure of an inorganic insulating film and an organic insulating film. In the case where the insulating layer 421 has the stacked-layer structure of an inorganic insulating film and an organic insulating film, an inorganic insulating film is preferably a lower layer. In the display device of one embodiment of the present invention, since the insulating layer 421 is provided over the hole-injection layer 431, the inorganic insulating film is provided on the hole-injection layer 431 side; whereby adverse effects on the hole-injection layer 431, which might occur in the case of using an organic solvent for the formation of an organic insulating film, can be inhibited.

The transistor 201 and the transistor 205 are formed over the substrate 451. These transistors can be fabricated using the same material in the same step.

The insulating layer 211, the insulating layer 213, the insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of the end portion of the display device 400B. This can inhibit entry of impurities from the end portion of the display device 400B through the organic insulating film. Alternatively, the organic insulating film may be formed such that its end portion is positioned inward from the end portion of the display device 400B, to prevent the organic insulating film from being exposed at the end portion of the display device 400B.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In the region 228 illustrated in FIG. 17, an opening is formed in the insulating layer 214. This can inhibit entry of impurities into the display portion 462 from the outside through the insulating layer 214 even when an organic insulating film is used as the insulating layer 214. Consequently, the reliability of the display device 400B can be increased.

Each of the transistor 201 and the transistor 205 includes the conductive layer 221 functioning as a gate, the insulating layer 211 functioning as a gate insulating layer, the conductive layer 222*a* and the conductive layer 222*b* functioning as a source and a drain, the semiconductor layer 231, the insulating layer 213 functioning as a gate insulating layer, and the conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device in this embodiment. For example, a planar transistor, a staggered transistor, or an inverted staggered transistor can be used. A top-gate or bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by supplying a potential for controlling the threshold voltage to one of the two gates and a potential for driving to the other. There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display device in this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn 15=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

The connection portion 204 is provided in a region of the substrate 451 that does not overlap with the substrate 452. In the connection portion 204, the wiring 465 is electrically connected to the FPC 472 through the conductive layer 466 and the connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

The light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

Providing the protective layer 416 covering the light-emitting elements inhibits entry of impurities such as water into the light-emitting elements; as a result, the reliability of the light-emitting elements can be increased.

In the region 228 in the vicinity of the end portion of the display device 400B, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. This can inhibit entry of impurities into the display portion 462 from the outside through the organic insulating film. Consequently, the reliability of the display device 400B can be increased.

In the display device 400B, the protective layer 416 may have a stacked-layer structure of an organic insulating film and an inorganic insulating film as in the display device 400A illustrated in FIG. 16B. In that case, the end portions of the inorganic insulating films preferably extend beyond the end portion of the organic insulating film.

For each of the substrate 451 and the substrate 452, glass, quartz, ceramics, sapphire, a resin, a metal, an alloy, a semiconductor, or the like can be used. The substrate on the side from which light from the light-emitting element is extracted is formed using a material that transmits the light. When the substrate 451 and the substrate 452 are formed using a flexible material, the flexibility of the display device can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, an indium tin oxide, an indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of an indium tin oxide and an alloy of silver and magnesium is preferably used because conductivity can be increased. They can also be used for conductive layers such as a variety of wirings and electrodes included in the display device, and conductive layers (e.g., conductive layers functioning as the pixel electrode and the common electrode) included in the light-emitting element.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

[Display Device 400C]

Figure 18A:
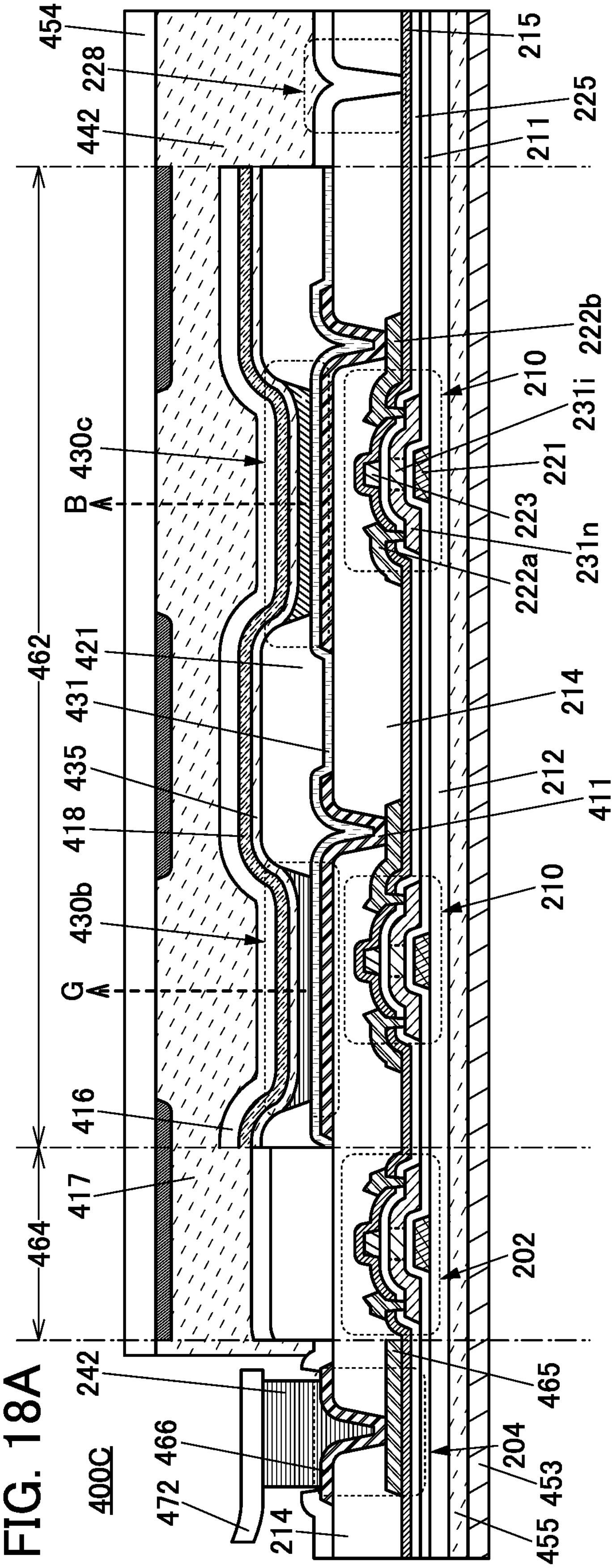
FIG. 18A is a cross-sectional view illustrating an example of a display device.

FIG. 18A is a cross-sectional view of a display device 400C. A perspective view of the display device 400C is similar to that of the display device 400A (FIG. 15). FIG. 18A illustrates an example of cross sections of part of a region including the FPC 472, part of the circuit 464, and part of the display portion 462 in the display device 400C. FIG. 18A specifically illustrates an example of a cross section of a region including the light-emitting element 430*b* emitting green light and the light-emitting element 430*c* emitting blue light in the display portion 462. Note that portions similar to those in the display device 400A are not described in some cases.

The display device 400C illustrated in FIG. 18A includes a transistor 202, transistors 210, the light-emitting element 430*b*, the light-emitting element 430*c*, and the like between a substrate 453 and the substrate 454.

The substrate 454 and the protective layer 416 are bonded to each other with the adhesive layer 442. The adhesive layer 442 is provided to overlap with the light-emitting element 430*b* and the light-emitting element 430*c*, and the display device 400C employs a solid sealing structure.

The substrate 453 and an insulating layer 212 are bonded to each other with an adhesive layer 455.

As a method for fabricating the display device 400C, first, a formation substrate provided with the insulating layer 212, the transistors, the light-emitting elements, and the like and the substrate 454 provided with the light-blocking layer 417 are bonded to each other with the adhesive layer 442. Then, the substrate 453 is attached to a surface exposed by separation of the formation substrate, whereby the components formed over the formation substrate are transferred to the substrate 453. The substrate 453 and the substrate 454 are preferably flexible. Accordingly, the display device 400C can be highly flexible.

The inorganic insulating film that can be used as the insulating layer 211, the insulating layer 213, and the insulating layer 215 can be used as the insulating layer 212.

The pixel electrode is connected to the conductive layer 222*b* included in the transistor 210 through the opening provided in the insulating layer 214. The conductive layer 222*b* is connected to a low-resistance region 231*n* through an opening provided in the insulating layer 215 and an insulating layer 225. The transistor 210 has a function of controlling the driving of the light-emitting element.

The pixel electrode 411 is connected to the conductive layer 222*b* included in the transistor 210 through the opening provided in the insulating layer 214.

End portions of the pixel electrode 411 are covered with the insulating layer 421 with the hole-injection layer 431 therebetween. The hole-injection layer 431 may be provided over the whole display portion 462 and may be divided according to the subpixel region. The layer 435 including an electron-transport layer and an electron-injection layer is provided over a light-emitting layer provided in an opening portion of the insulating layer 421 and the insulating layer 421, and the counter electrode 418 is provided over the layer 435. The pixel electrode 411 contains a material that reflects visible light, and the counter electrode 418 contains a material that transmits visible light.

Light from the light-emitting elements 430*b* and 430*c* is emitted toward the substrate 454 side. For the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through the openings provided in the insulating layer 215. One of the conductive layer 222*a* and the conductive layer 222*b* functions as a source, and the other functions as a drain.

FIG. 18A illustrates an example in which the insulating layer 225 covers the top and side surfaces of the semiconductor layer. The conductive layer 222*a* and the conductive layer 222*b* are connected to the corresponding low-resistance regions 231*n* through the openings provided in the insulating layer 225 and the insulating layer 215.

Figure 18B:
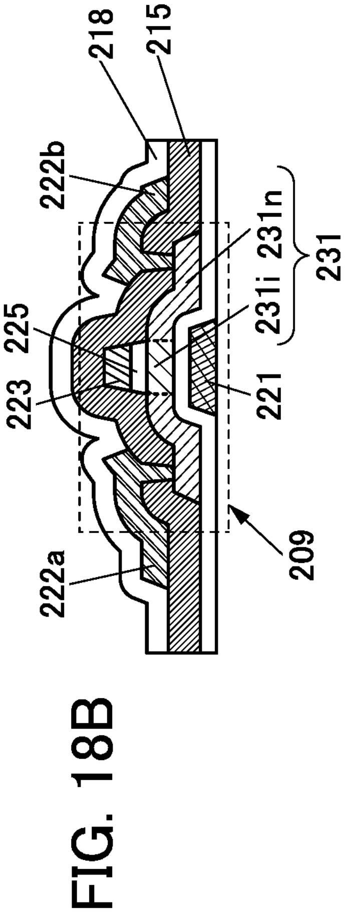
FIG. 18B is a cross-sectional view illustrating an example of a transistor.

In a transistor 209 illustrated in FIG. 18B, the insulating layer 225 overlaps with the channel formation region 231*i* of the semiconductor layer 231 and does not overlap with the low-resistance regions 231*n*. The structure illustrated in FIG. 18B can be obtained by processing the insulating layer 225 with the conductive layer 223 as a mask, for example. In FIG. 18B, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215. Furthermore, an insulating layer 218 covering the transistor may be provided.

[Display Device 400D]

Figure 19A:
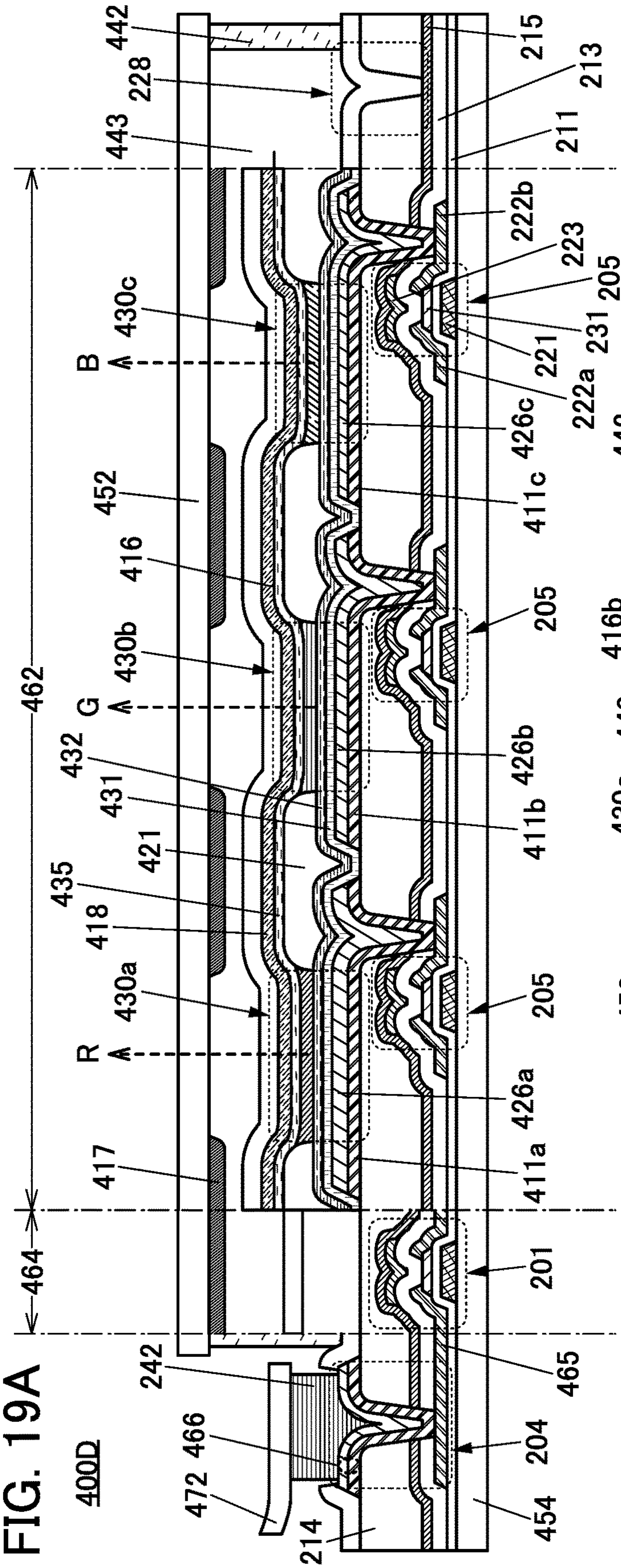
FIG. 19A and FIG. 19B are cross-sectional views illustrating examples of a display device.

FIG. 19A illustrates a cross-sectional view of a display device 400D. A perspective view of the display device 400D is similar to that of the display device 400A (FIG. 15), and portions similar to those in the display device 400A are not described. Specifically, the display device 400D is different from the display device 400A in including a hole-transport layer 432 over the hole-injection layer 431; and the other structure is similar to that of the display device 400A, and the description of the similar portions are omitted.

Since the display device 400D includes the hole-transport layer 432 over the hole-injection layer 431, end portions of the pixel electrode and the optical adjustment layer are covered with the insulating layer 421 with the hole-injection layer 431 and the hole-transport layer 432 therebetween. The hole-injection layer 431 and the hole-transport layer 432 may be provided over the whole display portion 462 and may be divided according to the subpixel region.

Note that the insulating layer 421 may have a stacked-layer structure of an inorganic insulating film and an organic insulating film. In the case where the insulating layer 421 has the stacked-layer structure of an inorganic insulating film and an organic insulating film, an inorganic insulating film is preferably a lower layer. In the display device of one embodiment of the present invention, since the insulating layer 421 is provided over the hole-transport layer 432, the inorganic insulating film is provided on the hole-transport layer 432 side; whereby adverse effects on the hole-transport layer 432, which might occur in the case of using an organic solvent for the formation of an organic insulating film, can be inhibited.

Figure 19B:
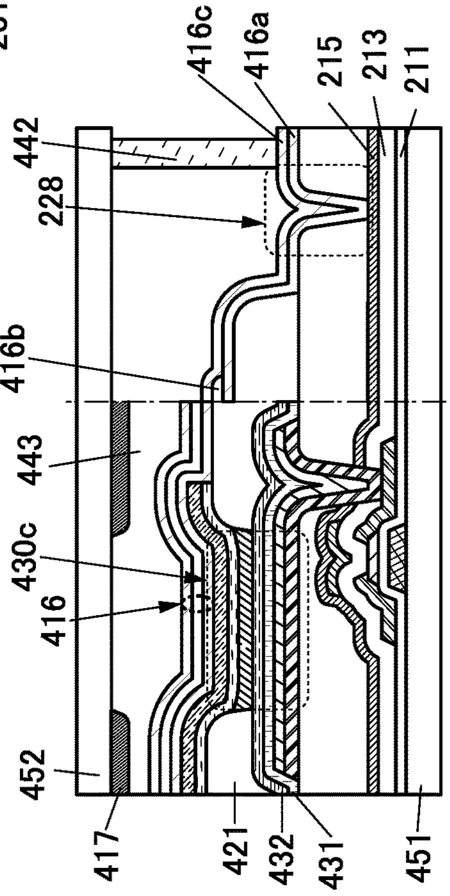

FIG. 19B illustrates an example in which the protective layer 416 has a three-layer structure. Although described again, the display device 400D is different from the display device 400A in including the hole-transport layer 432 over the hole-injection layer 431; and the other structure is similar to that of the display device 400A, and the description of the similar portions are omitted.

[Display Device 400E]

Figure 20:
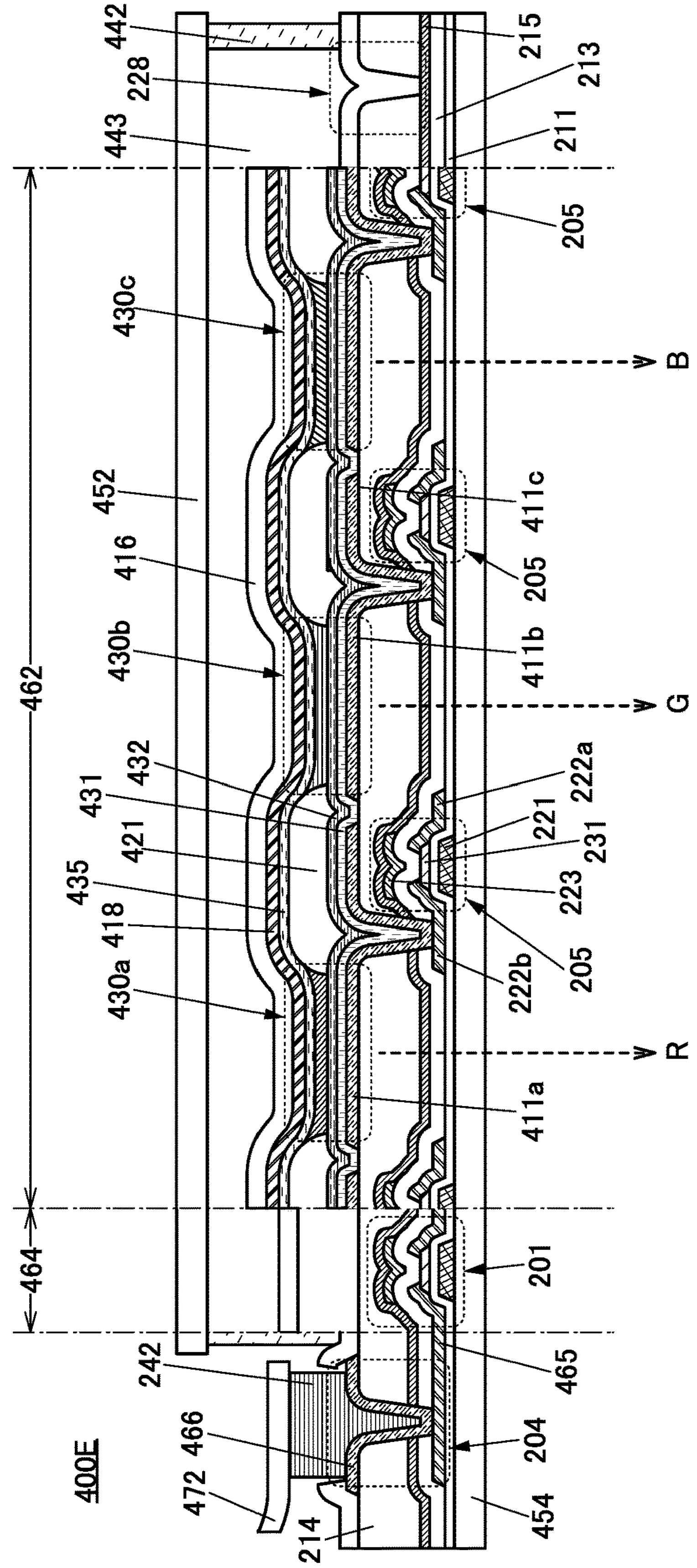
FIG. 20 is a cross-sectional view illustrating an example of a display device.

FIG. 20 illustrates a cross-sectional view of a display device 400E. A perspective view of the display device 400E is similar to that of the display device 400A (FIG. 15), and portions similar to those in the display device 400A are not described. Specifically, the display device 400D is different from the display device 400A in including the hole-transport layer 432 over the hole-injection layer 431; and the other structure is similar to that of the display device 400A, and the description of the similar portions are omitted.

Furthermore, the display device 400E is different from the display device 400B in including the hole-transport layer 432 over the hole-injection layer 431; and the other structure is similar to that of the display device 400B, and the description of the similar portions are omitted.

Since the display device 400E includes the hole-transport layer 432 over the hole-injection layer 431, end portions of the pixel electrode are covered with the insulating layer 421 with the hole-injection layer 431 and the hole-transport layer 432 therebetween. The hole-injection layer 431 and the hole-transport layer 432 may be provided over the whole display portion 462 and may be divided according to the subpixel region.

Note that the insulating layer 421 may have a stacked-layer structure of an inorganic insulating film and an organic insulating film. In the case where the insulating layer 421 has the stacked-layer structure of an inorganic insulating film and an organic insulating film, an inorganic insulating film is preferably a lower layer. In the display device of one embodiment of the present invention, since the insulating layer 421 is provided over the hole-transport layer 432, the inorganic insulating film is provided on the hole-transport layer 432 side; whereby adverse effects on the hole-transport layer 432, which might occur in the case of using an organic solvent for the formation of an organic insulating film, can be inhibited.

[Display Device 400F]

Figure 21A:
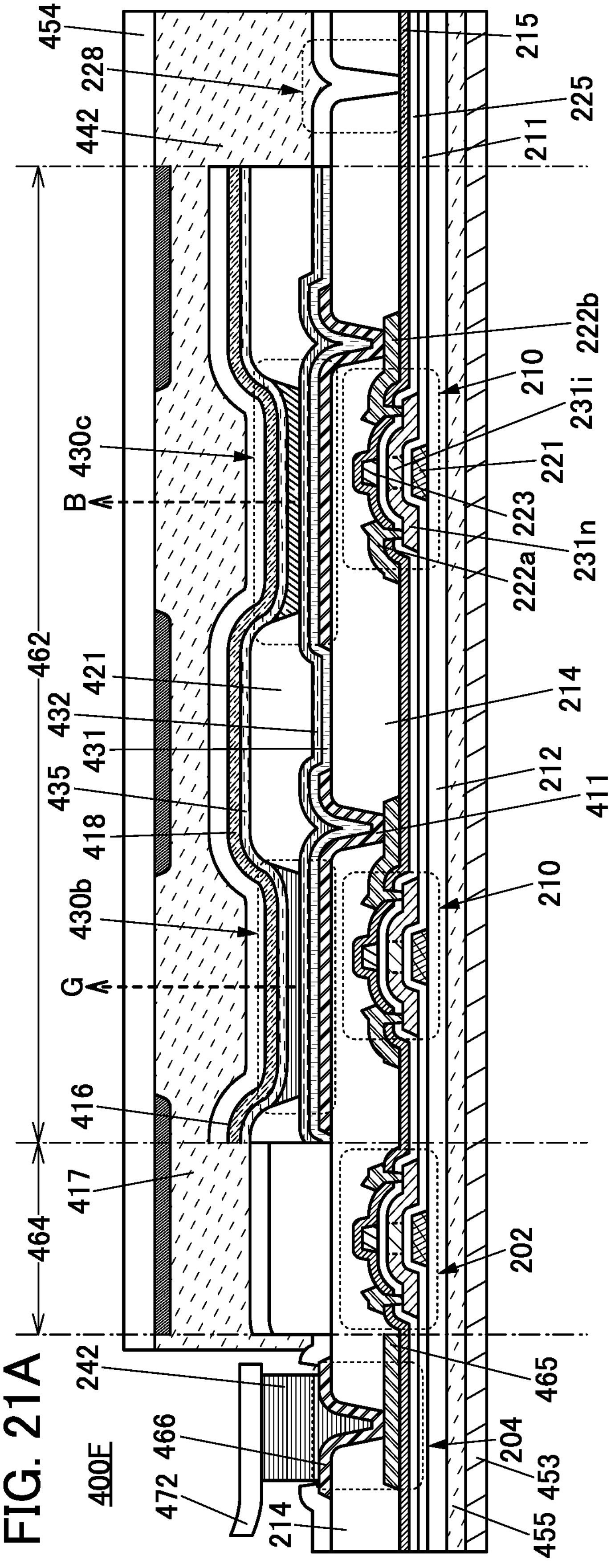
FIG. 21A is a cross-sectional view illustrating an example of a display device.
Figure 21B:
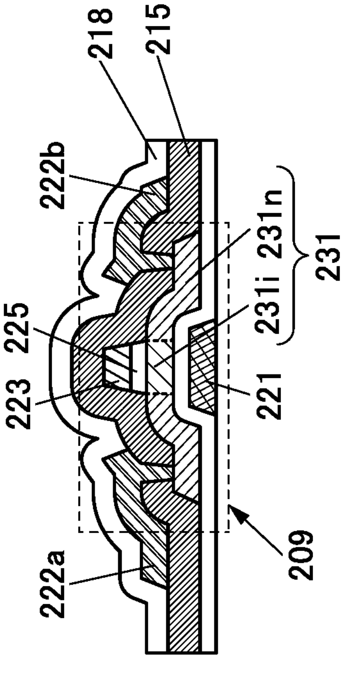
FIG. 21B is a cross-sectional view illustrating an example of a transistor.

FIG. 21A illustrates a cross-sectional view of a display device 400F. A perspective view of the display device 400F is similar to that of the display device 400A (FIG. 15), and portions similar to those in the display device 400A are not described. Specifically, the display device 400D is different from the display device 400A in including the hole-transport layer 432 over the hole-injection layer 431; and the other structure is similar to that of the display device 400A, and the description of the similar portions are omitted.

Furthermore, the display device 400F is different from the display device 400C in including the hole-transport layer 432 over the hole-injection layer 431; and the other structure is similar to that of the display device 400C, and the description of the similar portions are omitted.

Since the display device 400F includes the hole-transport layer 432 over the hole-injection layer 431, end portions of the pixel electrode 411 are covered with the insulating layer 421 with the hole-injection layer 431 and the hole-transport layer 432 therebetween. The hole-injection layer 431 and the hole-transport layer 432 may be provided over the whole display portion 462 and may be divided according to the subpixel region.

At least part of this embodiment can be implemented in combination with the other embodiments described in this specification and the like as appropriate.

Embodiment 5

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction. Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by Out-of-plane XRD measurement with an XRD apparatus using 0120 scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region. Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification and the like as appropriate.

Embodiment 6

In this embodiment, electronic devices of embodiments of the present invention is described with reference to FIG. 22 to FIG. 25.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, a display device of one embodiment of the present invention can have a high resolution, and thus can be favorably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices include a device for SR and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display device with high definition or high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 22A:
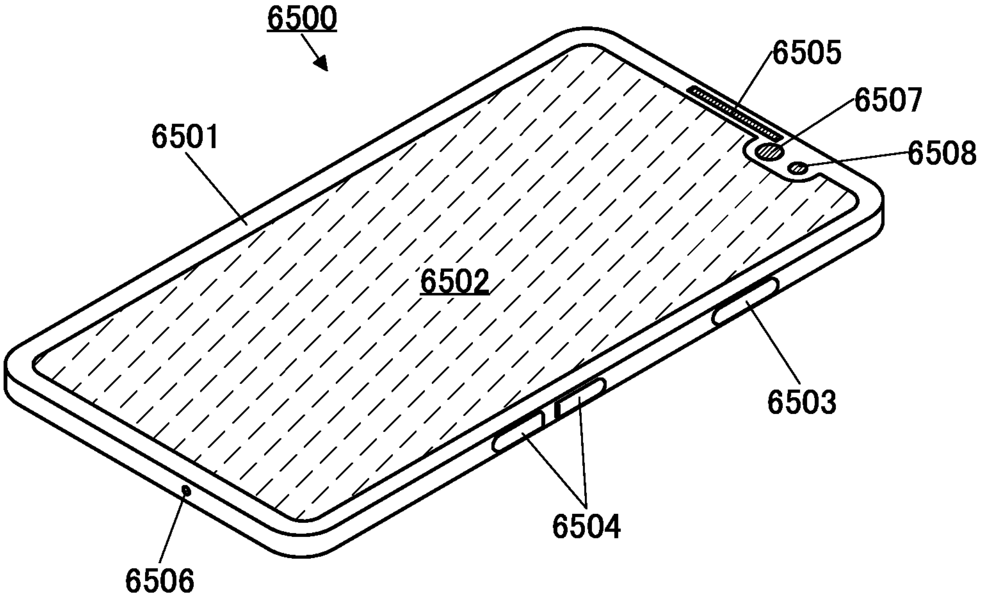
FIG. 22A and FIG. 22B are diagrams illustrating an example of an electronic device.

An electronic device 6500 in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 22B:
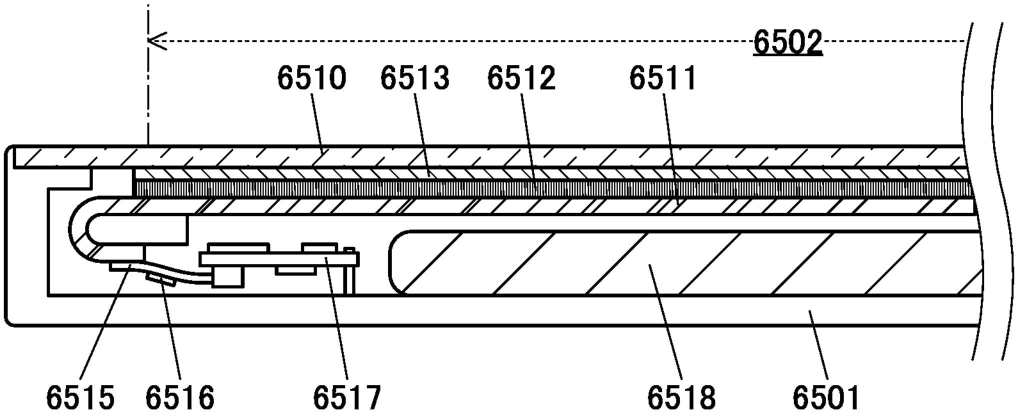

FIG. 22B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 23A:
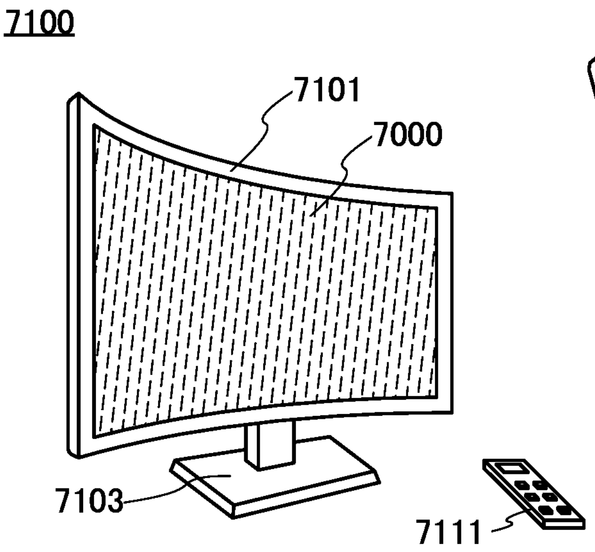
FIG. 23A to FIG. 23D are diagrams illustrating examples of electronic devices.

FIG. 23A illustrates an example of a television device. In a television device 7100, a display portion 7000 is incorporated in a housing 7101. Here, the housing 7101 is supported by a stand 7103.

The display device of one embodiment of the present invention can be used in the display portion 7000.

Operation of the television device 7100 illustrated in FIG. 23A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 23B:
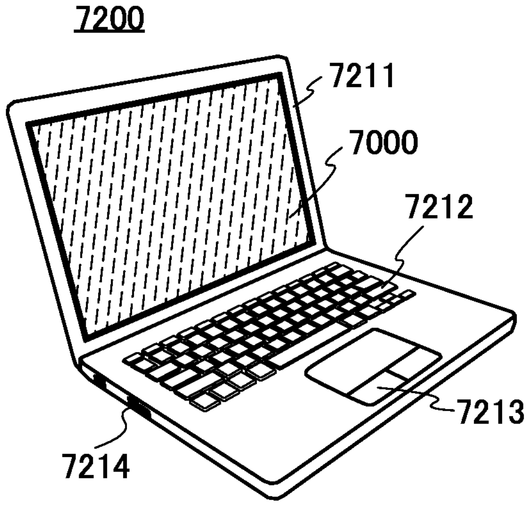

FIG. 23B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 23C:
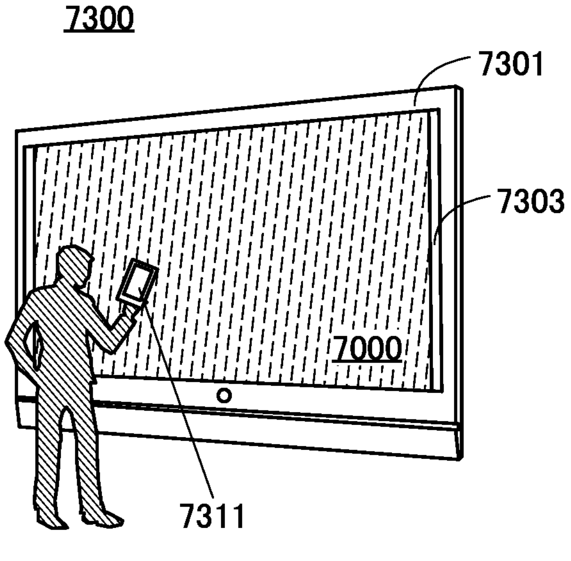
Figure 23D:
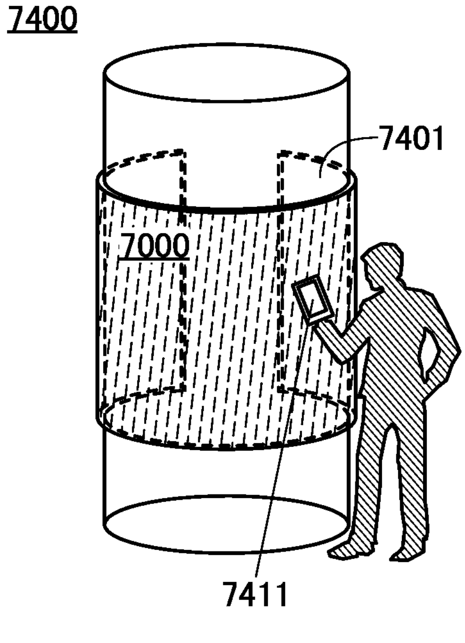

FIG. 23C and FIG. 23D illustrate examples of digital signage.

Digital signage 7300 illustrated in FIG. 23C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 23D is digital signage 7400 attached to a cylindrical pillar 7401. The digital signage 7400 includes the display portion 7000 provided along a curved surface of the pillar 7401.

The display device of one embodiment of the present invention can be used in the display portion 7000 illustrated in each of FIG. 23C and FIG. 23D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 23C and FIG. 23D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 24A:
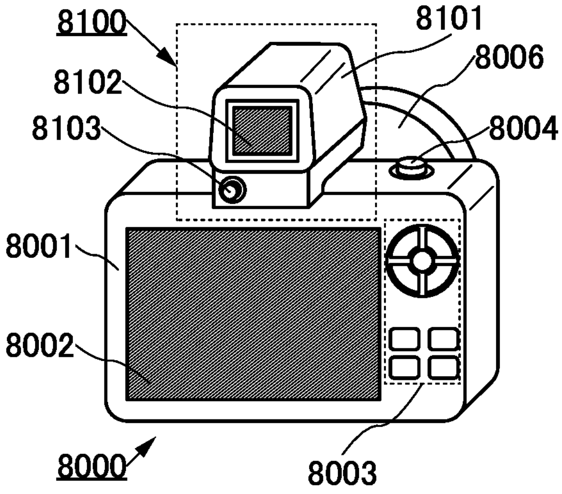
FIG. 24A to FIG. 24F are diagrams illustrating examples of electronic devices.

FIG. 24A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video and the like received from the camera 8000 on the display portion 8102.

The button 8103 functions as a power supply button or the like.

A display device of one embodiment of the present invention can be used in the display portion 8002 of the camera 8000 and the display portion 8102 of the finder 8100. Note that a finder may be incorporated in the camera 8000.

Figure 24B:
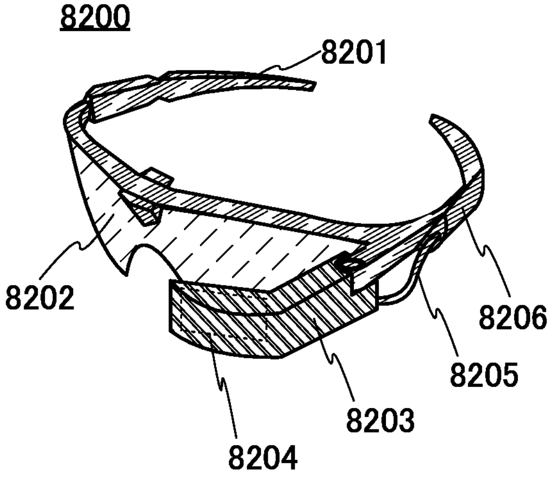

FIG. 24B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

A display device of one embodiment of the present invention can be used in the display portion 8204.

Figure 24C:
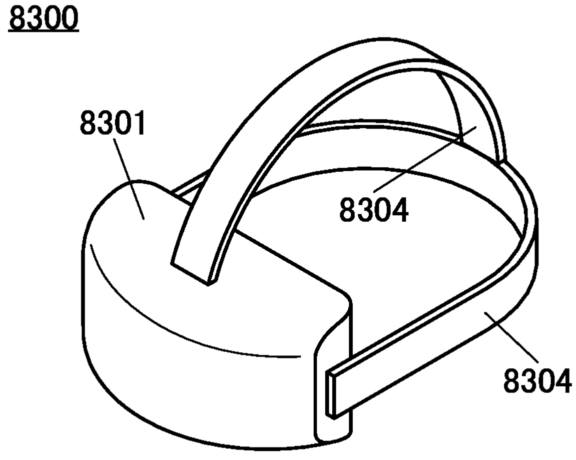
Figure 24D:
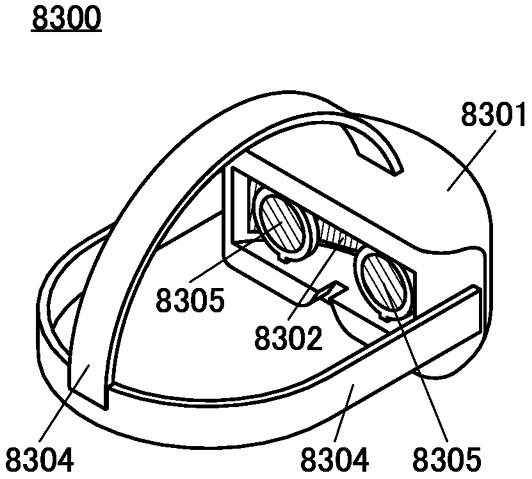
Figure 24E:
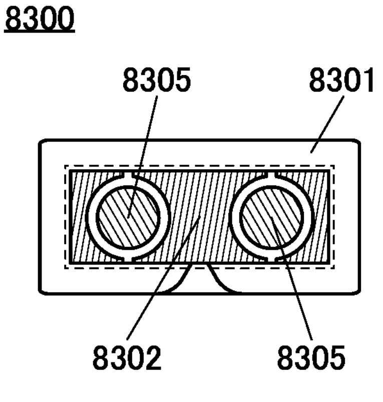

FIG. 24C to FIG. 24E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax or the like can be performed. Note that the number of display portions 8302 provided is not limited to one; two display portions 8302 may be provided so that one display portion is provided for one eye of the user.

The display device of one embodiment of the present invention can be used for the display portion 8302. The display device of one embodiment of the present invention achieves extremely high resolution. For example, a pixel is not easily seen by the user even when the user sees display that is magnified by the use of the lenses 8305 as illustrated in FIG. 24E. In other words, a video with a strong sense of reality can be seen by the user with use of the display portion 8302.

Figure 24F:
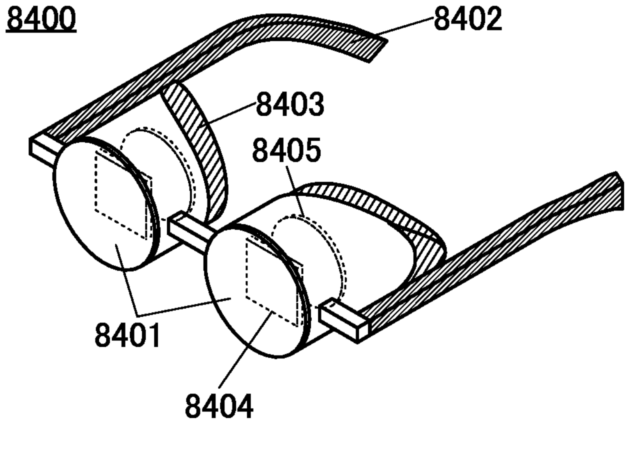

FIG. 24F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. When the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism to function as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 25A to FIG. 25F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 25A to FIG. 25F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The electronic devices illustrated in FIG. 25A to FIG. 25F are described in detail below.

Figure 25A:
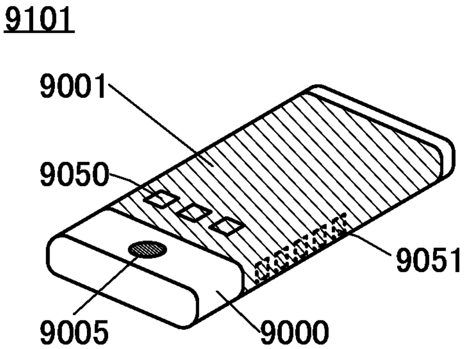
FIG. 25A to FIG. 25F are diagrams illustrating examples of electronic devices.

FIG. 25A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 25A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 25B:
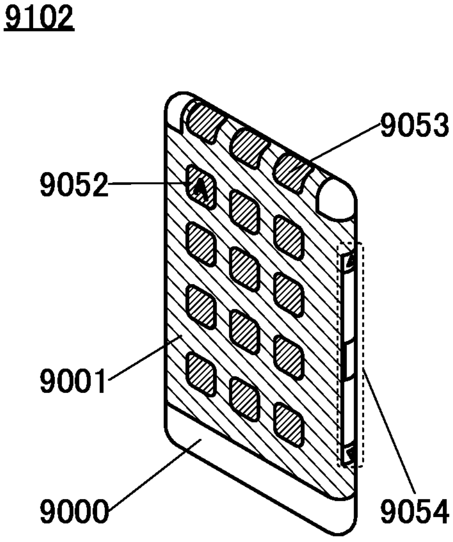

FIG. 25B is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 25C:
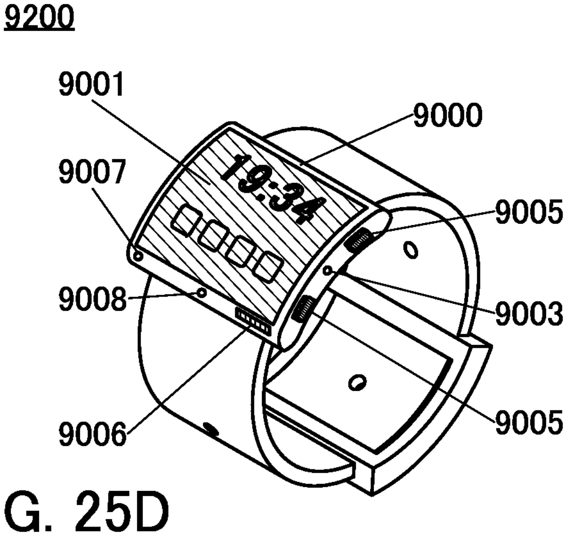

FIG. 25C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 25D:
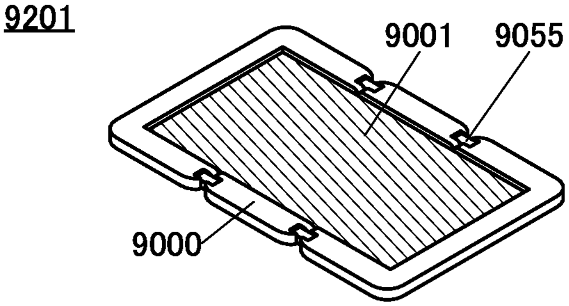
Figure 25E:
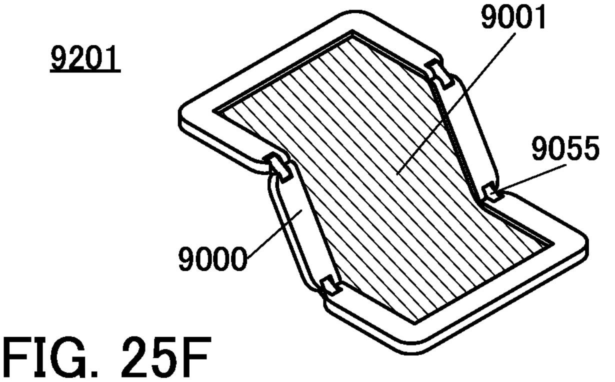
Figure 25F:
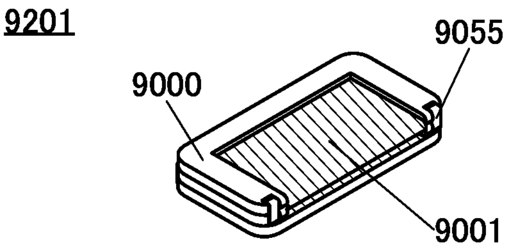

FIG. 25D to FIG. 25F are perspective views illustrating a foldable portable information terminal 9201. FIG. 25D is a perspective view of an opened state of the portable information terminal 9201, FIG. 25F is a perspective view of a folded state thereof, and FIG. 25E is a perspective view of a state in the middle of change from one of FIG. 25D and FIG. 25F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of this embodiment can be implemented in combination with any of the other embodiments described in this specification, as appropriate.

REFERENCE NUMERALS

AB: line, AL: wiring, CD: line, CL: wiring, GL: wiring, IC: display device, SL: wiring, 20: light-emitting element, 100: pixel region, 101: insulating film, 102: anode, 104: hole-injection layer, 105: hole-transport layer, 110*x*: first region, 110*y*: second region, 110: partition, 115*b*: light-emitting layer, 115*g*: light-emitting layer, 115*r*: light-emitting layer, 118*b*: third paddle, 118*g*: second paddle, 118*r*: first paddle, 119: nozzle, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231*i*: channel formation region, 231*n*: low-resistance region, 231: semiconductor layer, 242: connection layer, 400A: display device, 400B: display device, 400C: display device, 400D: display device, 400E: display device, 400F: display device, 411*a*: pixel electrode, 411*b*: pixel electrode, 411*c*: pixel electrode, 411: pixel electrode, 416*a*: inorganic insulating layer, 416*b*: organic insulating layer, 416*c*: inorganic insulating layer, 416: protective layer, 417: light-blocking layer, 418: counter electrode, 421: insulating layer, 426*a*: optical adjustment layer, 426*b*: optical adjustment layer, 426*c*: optical adjustment layer, 430*a*: light-emitting element, 430*b*: light-emitting element, 430*c*: light-emitting element, 431: hole-injection layer, 432: hole-transport layer, 435: layer, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 672: lower electrode, **686*a*: first light-emitting unit, 686*b*: second light-emitting unit, 686: light-emitting unit, 688: upper electrode, 690*a*: intermediate layer, 690*b*: intermediate layer, 690: intermediate layer, 4411: first light-emitting layer, 4412: second light-emitting layer, 4413: third light-emitting layer, 4420: layer, 4430: layer, 6500: electronic device, 6501: housing, 6502: display portion, 6503: power source button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201**: portable information terminal

The invention claimed is:

1. A display device comprising:
a first anode;
a second anode adjacent to the first anode in an X direction;
a third anode adjacent to the first anode in a Y direction;
a hole-injection layer over the first anode, the second anode, and the third anode;
a partition over the hole-injection layer;
a first light-emitting layer in a first opening portion of the partition and overlapping with the first anode;
a second light-emitting layer in a second opening portion of the partition and overlapping with the second anode;
a third light-emitting layer in a third opening portion of the partition and overlapping with the third anode; and
a cathode over the first light-emitting layer, the second light-emitting layer, and the third light-emitting layer,
wherein the partition comprises, in a top view, a first region between the first anode and the third anode and extending in the X direction, a second region between the first anode and the second anode and extending in the Y direction, and an intersection of the first region and the second region,
wherein height of the first region is larger than height of the second region in a cross-sectional view of the partition, and
wherein height of the intersection is larger than the height of the first region.

2. The display device according to claim 1,
wherein the partition has a stacked-layer structure in the first region.

3. The display device according to claim 2,
wherein the partition having the stacked-layer structure comprises a first partition comprising an inorganic material and a second partition over the first partition and comprising an organic material.

4. The display device according to claim 1, further comprising a hole-transport layer between the hole-injection layer and the partition.

5. The display device according to claim 1,
wherein the hole-injection layer comprises molybdenum oxide.

6. The display device according to claim 1,
wherein an end portion of the first anode, an end portion of the second anode, and an end portion of the third anode each have a tapered shape.

7. A display device comprising:
a first anode;
a second anode adjacent to the first anode in an X direction;
a third anode adjacent to the first anode in a Y direction;
a hole-injection layer over the first anode, the second anode, and the third anode;
a partition over the hole-injection layer;
a first light-emitting layer in a first opening portion of the partition and overlapping with the first anode;
a second light-emitting layer in a second opening portion of the partition and overlapping with the second anode;
a third light-emitting layer in a third opening portion of the partition and overlapping with the third anode; and
a cathode over the first light-emitting layer, the second light-emitting layer, and the third light-emitting layer,
wherein the partition comprises, in a top view, a first region between the first anode and the third anode and extending in the X direction, and a second region between the first anode and the second anode and extending in the Y direction,
wherein height of the first region is larger than height of the second region in a cross-sectional view of the partition, and
wherein the partition has a stacked-layer structure in the second region.

8. The display device according to claim 7,
wherein the partition having the stacked-layer structure comprises a first partition comprising an inorganic material and a second partition over the first partition and comprising an organic material.

9. The display device according to claim 7, further comprising a hole-transport layer between the hole-injection layer and the partition.

10. The display device according to claim 7,
wherein the hole-injection layer comprises molybdenum oxide.

11. The display device according to claim 7,
wherein an end portion of the first anode, an end portion of the second anode, and an end portion of the third anode each have a tapered shape.

12. A method for fabricating a display device comprising:
forming a first anode, a second anode adjacent to the first anode in an X direction, and a third anode adjacent to the first anode in a Y direction;
forming a hole-injection layer over the first anode, the second anode, and the third anode;
forming a partition comprising a first opening portion overlapping with the first anode, a second opening portion overlapping with the second anode, and a third opening portion overlapping with the third anode over the hole-injection layer;

forming at least one of a first light-emitting layer in the first opening portion, a second light-emitting layer in the second opening portion, and a third light-emitting layer in the third opening portion by an inkjet method; and forming a cathode over the first light-emitting layer, the second light-emitting layer, and the third light-emitting layer, wherein the partition comprises, in a top view, a first region between the first anode and the third anode and extending in the X direction, and a second region between the first anode and the second anode and extending in the Y direction, wherein height of the first region is larger than height of the second region in a cross-sectional view of the partition, and wherein the inkjet method is performed with movement along the first region.

13. The method for fabricating a display device according to claim 12, further comprising:

forming a hole-transport layer over the hole-injection layer; and forming the partition over the hole-transport layer.

* * * * *